United States Patent
Kuroki et al.

(10) Patent No.: US 6,360,600 B1
(45) Date of Patent: Mar. 26, 2002

(54) ANGULAR VELOCITY SENSOR, RELATED METHOD FOR MANUFACTURING THE SENSOR, AND PIEZOELECTRIC VIBRATOR ELEMENT USED IN THIS SENSOR

(75) Inventors: Hisao Kuroki, Kuwana; Rikiya Kamimura, Toyoake, both of (JP)

(73) Assignee: Denso Corporation, Kamiya (JP)

(*) Notice: Subject to any disclaimer, the term of this patent is extended or adjusted under 35 U.S.C. 154(b) by 0 days.

(21) Appl. No.: 09/392,635

(22) Filed: Sep. 9, 1999

Related U.S. Application Data

(62) Division of application No. 09/058,787, filed on Apr. 13, 1998, now Pat. No. 5,987,987.

(30) Foreign Application Priority Data

| Apr. 14, 1997 | (JP) | 9-096086 |
| May 12, 1997 | (JP) | 9-121098 |
| Jun. 13, 1997 | (JP) | 9-156932 |
| Jul. 9, 1997 | (JP) | 9-184154 |
| Jul. 9, 1997 | (JP) | 9-184155 |
| Jul. 25, 1997 | (JP) | 9-200427 |
| Aug. 21, 1997 | (JP) | 9-225185 |

(51) Int. Cl.$^7$ ............... G01P 9/00; H01L 41/08
(52) U.S. Cl. ............... 73/504.12; 310/363
(58) Field of Search ............... 73/504.16, 504.12, 73/504.13, 504.14, 504.15, 514.34; 310/361, 366, 370, 364, 363, 358

(56) References Cited

U.S. PATENT DOCUMENTS

| 3,636,810 A | | 1/1972 | Reefman ............... 310/25 |
| 4,080,696 A | * | 3/1978 | Shimatsu ............... 29/25.35 |
| 4,099,078 A | | 7/1978 | Shibata et al. ............... 310/370 |
| 4,173,726 A | | 11/1979 | Hanji ............... 310/366 |
| 4,253,036 A | * | 2/1981 | Kizaki ............... 310/361 |
| 4,356,425 A | | 10/1982 | Kogure et al. |
| 4,546,283 A | * | 10/1985 | Adamo et al. ............... 310/345 |
| 4,712,037 A | * | 12/1987 | Verbeek et al. ............... 310/323 |
| 5,014,554 A | * | 5/1991 | Terada et al. ............... 310/370 |
| 5,388,458 A | | 2/1995 | Weinberg et al. ............... 73/504.16 |
| 5,396,144 A | | 3/1995 | Gupta et al. ............... 73/504.16 |
| 5,402,031 A | * | 3/1995 | Tagami et al. ............... 310/359 |
| 5,408,876 A | | 4/1995 | Macy ............... 73/505 |
| 5,719,460 A | | 2/1998 | Watari et al. ............... 310/366 |
| 5,721,464 A | * | 2/1998 | Dibbern et al. ............... 310/358 |
| 6,044,708 A | * | 4/2000 | Hirosawa ............... 73/504.15 |

FOREIGN PATENT DOCUMENTS

| EP | 563 762 | 10/1993 |
| JP | 62-229024 | 10/1987 |
| JP | 5-71715 | 9/1993 |
| JP | 5-280990 | 10/1993 |
| JP | 8-170917 | 7/1996 |
| JP | 8-178673 | 7/1996 |
| JP | 8-210860 | 8/1996 |

* cited by examiner

Primary Examiner—Helen Kwok
(74) Attorney, Agent, or Firm—Pillsbury Winthrop LLP

(57) ABSTRACT

Drive electrodes and sensing electrodes are formed on a front face of a piezoelectric body of a vibrator. A first reference electrode is formed on a rear face. Second reference electrodes are formed on side faces of arm bars of the vibrator at a position corresponding to the sensing electrodes. The second reference electrodes are connected to the first reference electrode formed on said rear face.

8 Claims, 48 Drawing Sheets

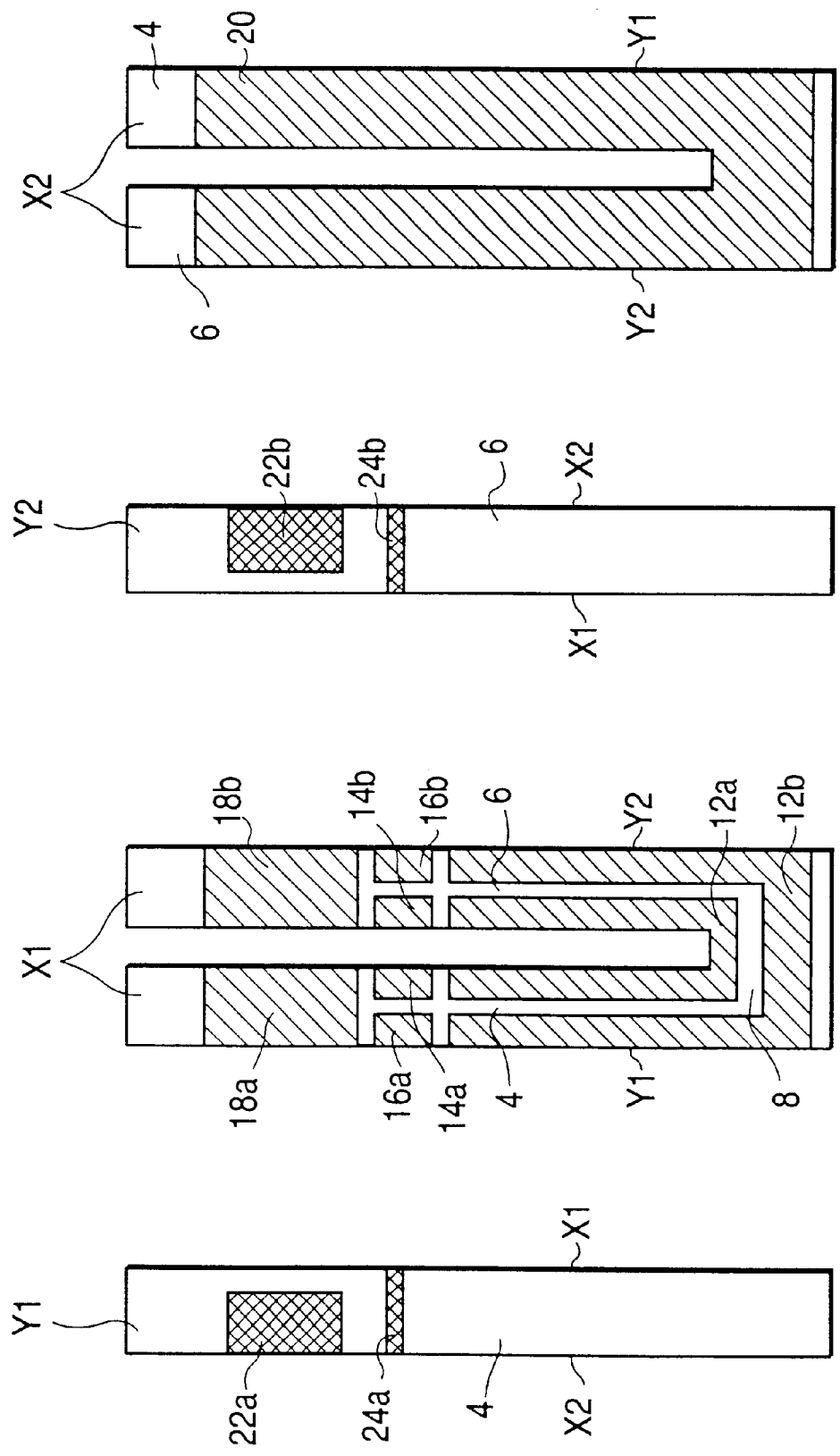

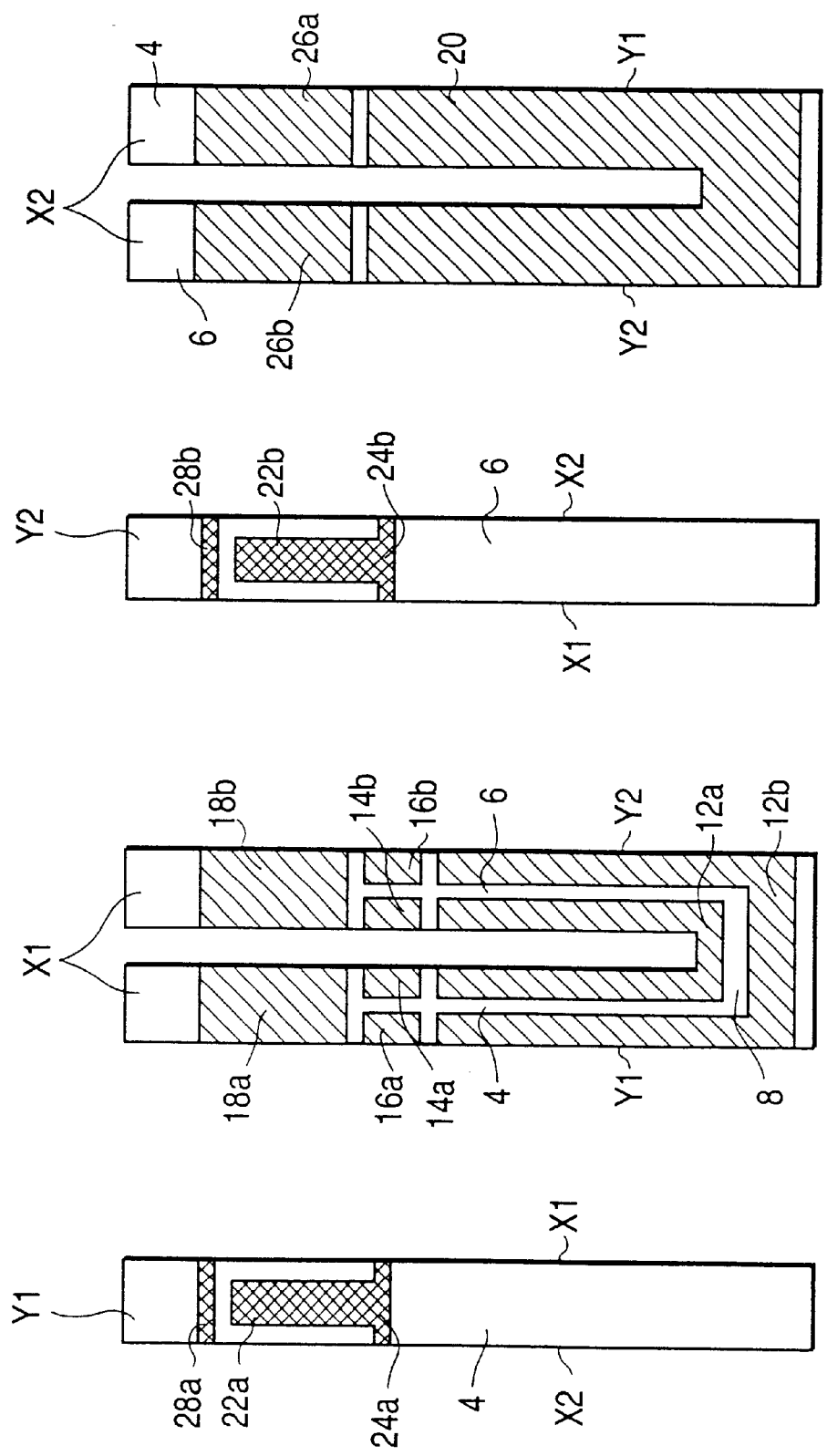

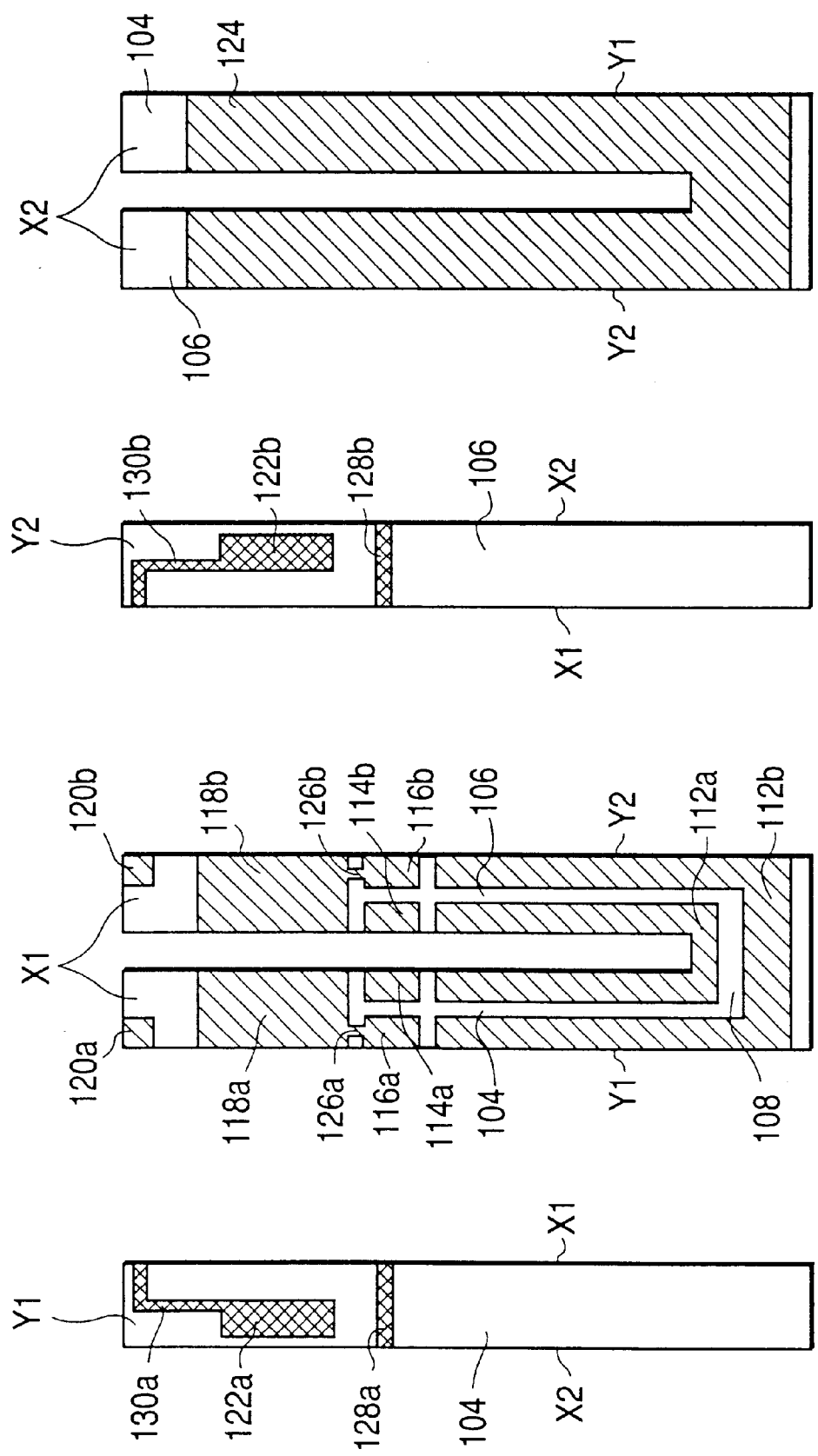

1ST PROCESS

X1 - AND X2 - FACE ELECTRODE FORMATION

2ND PROCESS

POLARIZING PROCESS

3RD PROCESS

Y1- AND Y2 - FACE ELECTRODE FORMATION

FIG. 22

| BONDING ANGLE θ | WIRE CONFIGURATION | | BREAKDOWN LIFE (HOUR) | | | | | |
|---|---|---|---|---|---|---|---|---|
| | H (mm) | L (mm) | AMPLITUDE 16 μm ① | AMPLITUDE 16 μm ② | AMPLITUDE 14.5 μm ① | AMPLITUDE 14.5 μm ② | AMPLITUDE 12 μm ① | AMPLITUDE 12 μm ② |
| 0 | 0.3~0.4 | 3 | 0.5× | 0.5× | 1× | 0.5× | 1× | >3000 |
| 0 | 0.3~0.4 | 4.5 | 0.5× | 308× | 0.5× | 1× | 0.5× | 118× |
| 0 | 0.3~0.4 | 6.0 | 54× | 0.5× | 0.5× | 2× | 0.5× | >3000 |
| 30 | 0.3~0.4 | 3 | >3000 | >3000 | >3000 | >3000 | >3000 | >3000 |
| 30 | 0.3~0.4 | 4.5 | 572× | 212× | >3000 | >3000 | >3000 | >3000 |
| 30 | 0.3~0.4 | 6.0 | >3000 | >3000 | >3000 | >3000 | >3000 | >3000 |
| 0 | 0.5~0.7 | 3 | >3000 | >3000 | >3000 | >3000 | >3000 | >3000 |
| 0 | 0.5~0.7 | 4.5 | >3000 | >3000 | >3000 | >3000 | >3000 | >3000 |
| 0 | 0.5~0.7 | 6.0 | >3000 | >3000 | >3000 | >3000 | >3000 | >3000 |
| 30 | 0.5~0.7 | 3 | >3000 | >3000 | >3000 | >3000 | >3000 | >3000 |
| 30 | 0.5~0.7 | 4.5 | >3000 | >3000 | >3000 | >3000 | >3000 | >3000 |
| 30 | 0.5~0.7 | 6.0 | >3000 | >3000 | >3000 | >3000 | >3000 | >3000 |
| 0 | 0.8~1.2 | 3 | >3000 | >3000 | >3000 | >3000 | >3000 | >3000 |
| 0 | 0.8~1.2 | 4.5 | >3000 | >3000 | >3000 | >3000 | >3000 | >3000 |
| 0 | 0.8~1.2 | 6.0 | >3000 | >3000 | >3000 | >3000 | >3000 | >3000 |
| 30 | 0.8~1.2 | 3 | >3000 | >3000 | >3000 | >3000 | >3000 | >3000 |
| 30 | 0.8~1.2 | 4.5 | >3000 | >3000 | >3000 | >3000 | >3000 | >3000 |
| 30 | 0.8~1.2 | 6.0 | >3000 | >3000 | >3000 | >3000 | >3000 | >3000 |

FIG. 23

| BONDING ANGLE θ | WIRE CONFIGURATION | | BREAKDOWN LIFE (HOUR) | | | |
|---|---|---|---|---|---|---|
| | | | AMPLITUDE 10 μm | | AMPLITUDE 8 μm | |
| | H (mm) | L (mm) | ① | ② | ① | ② |
| 0 | 0.3~0.4 | 3 | >3000 | >3000 | >3000 | >3000 |
| 0 | 0.3~0.4 | 4.5 | 1450× | 623× | >3000 | 2048× |
| 0 | 0.3~0.4 | 6.0 | >3000 | >3000 | >3000 | >3000 |
| 30 | 0.3~0.4 | 3 | >3000 | >3000 | >3000 | >3000 |
| 30 | 0.3~0.4 | 4.5 | >3000 | >3000 | >3000 | >3000 |
| 30 | 0.3~0.4 | 6.0 | >3000 | >3000 | >3000 | >3000 |
| 0 | 0.5~0.7 | 3 | >3000 | >3000 | >3000 | >3000 |
| 0 | 0.5~0.7 | 4.5 | >3000 | >3000 | >3000 | >3000 |
| 0 | 0.5~0.7 | 6.0 | >3000 | >3000 | >3000 | >3000 |
| 30 | 0.5~0.7 | 3 | >3000 | >3000 | >3000 | >3000 |
| 30 | 0.5~0.7 | 4.5 | >3000 | >3000 | >3000 | >3000 |
| 30 | 0.5~0.7 | 6.0 | >3000 | >3000 | >3000 | >3000 |
| 0 | 0.8~1.2 | 3 | >3000 | >3000 | >3000 | >3000 |
| 0 | 0.8~1.2 | 4.5 | >3000 | >3000 | >3000 | >3000 |
| 0 | 0.8~1.2 | 6.0 | >3000 | >3000 | >3000 | >3000 |
| 30 | 0.8~1.2 | 3 | >3000 | >3000 | >3000 | >3000 |
| 30 | 0.8~1.2 | 4.5 | >3000 | >3000 | >3000 | >3000 |
| 30 | 0.8~1.2 | 6.0 | >3000 | >3000 | >3000 | >3000 |

FIG. 38
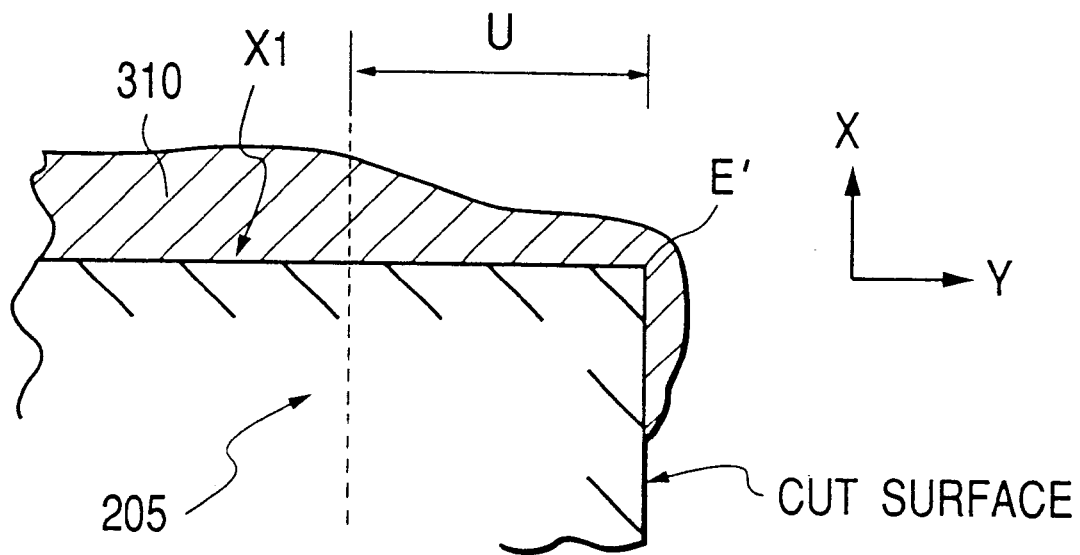
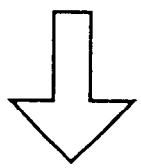
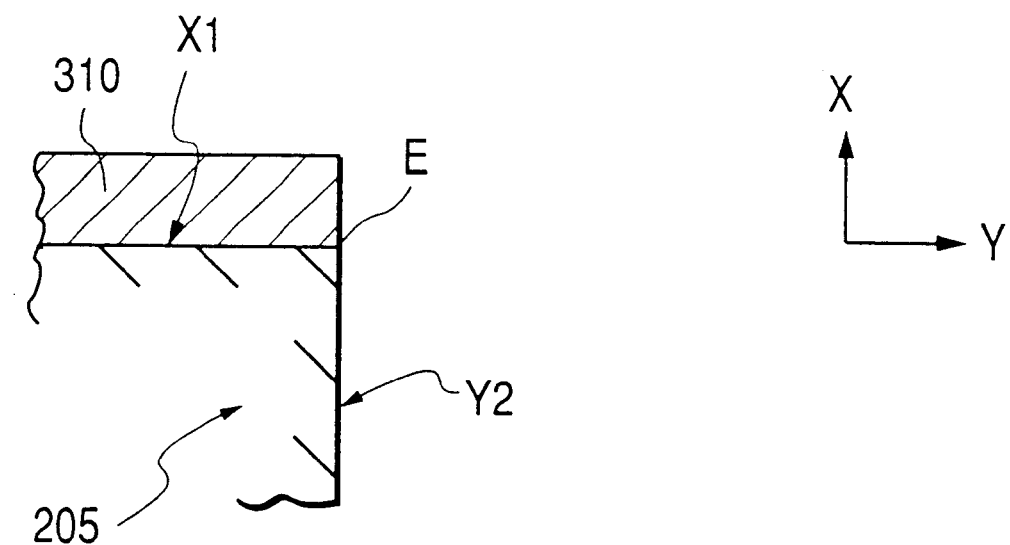

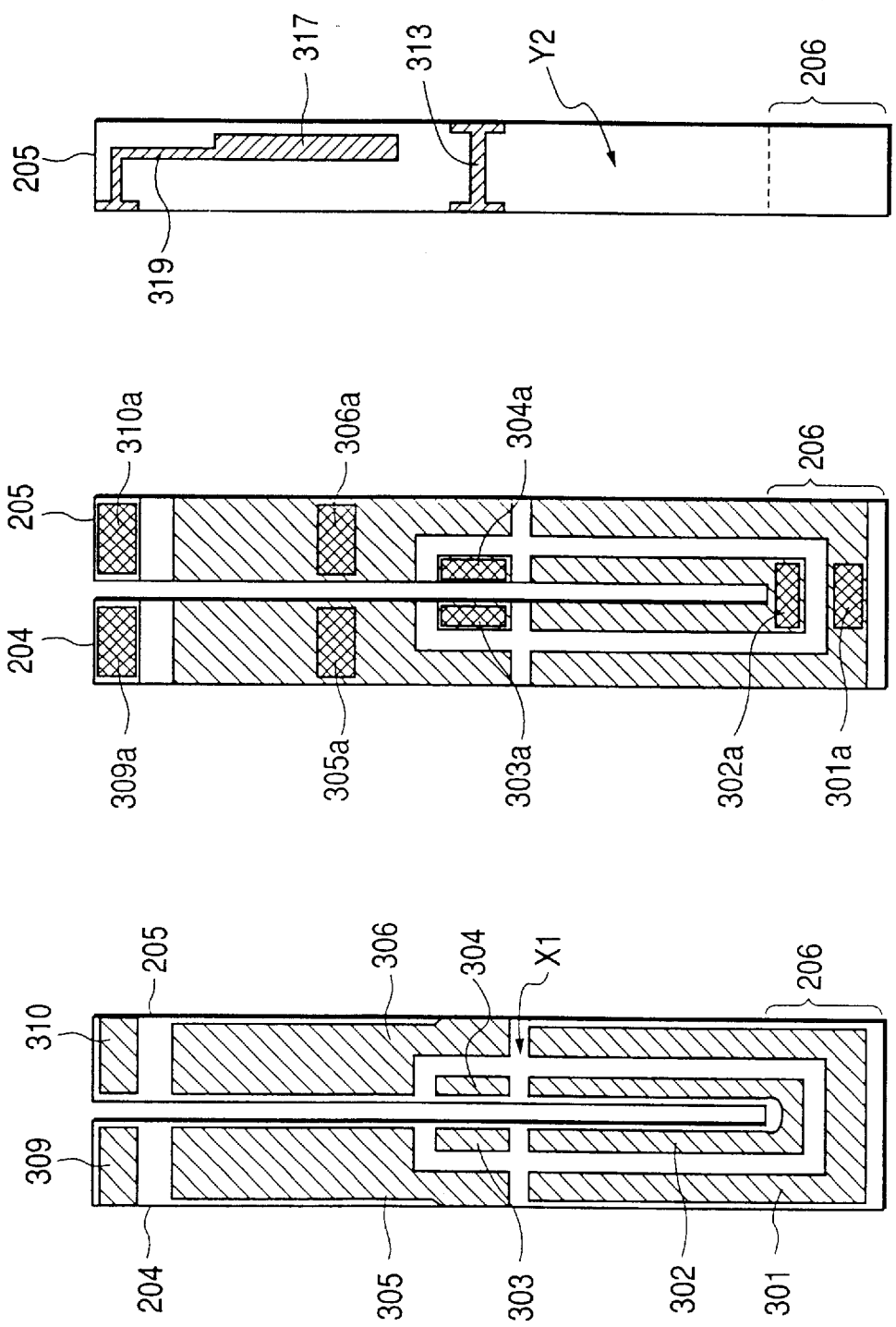

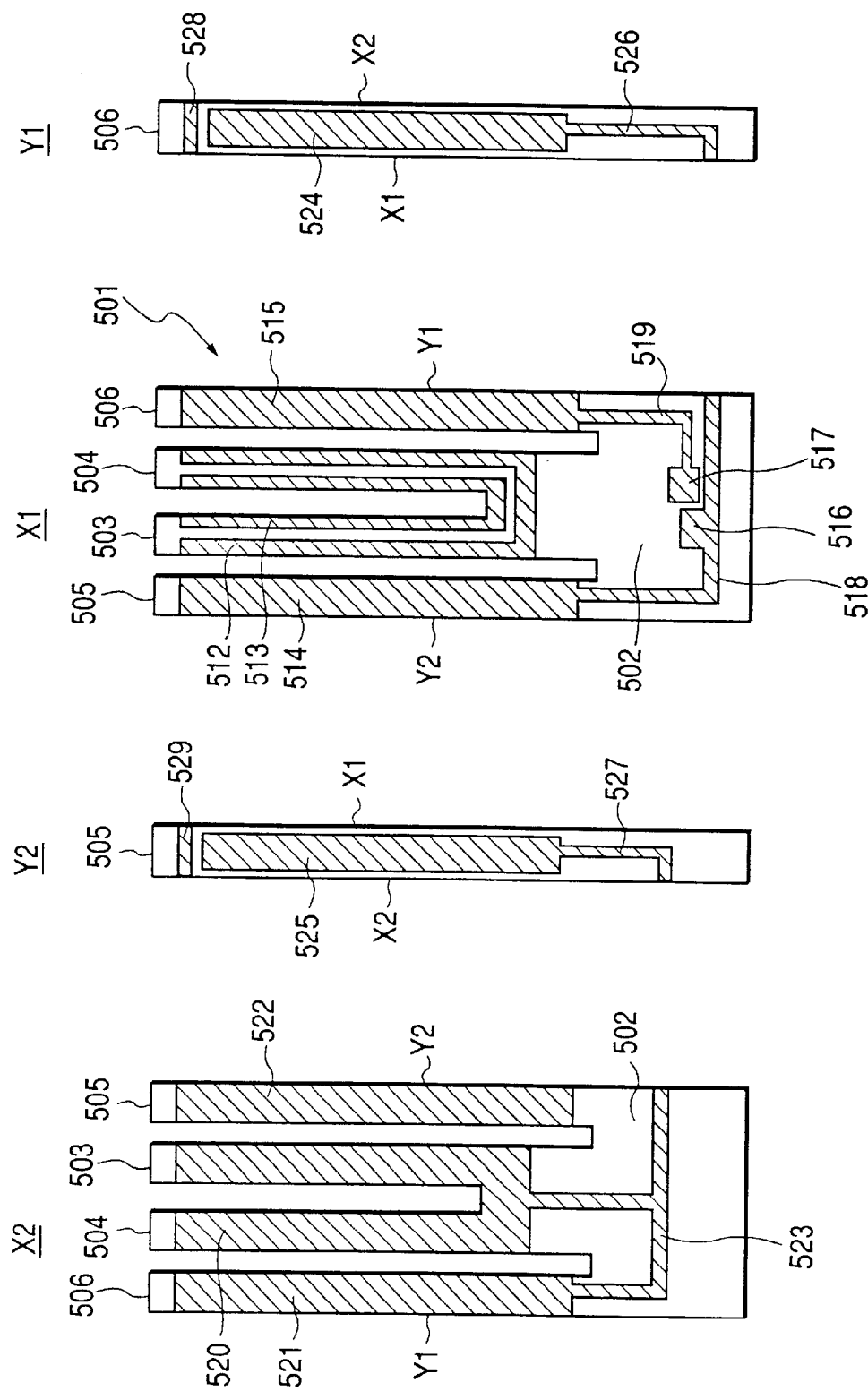

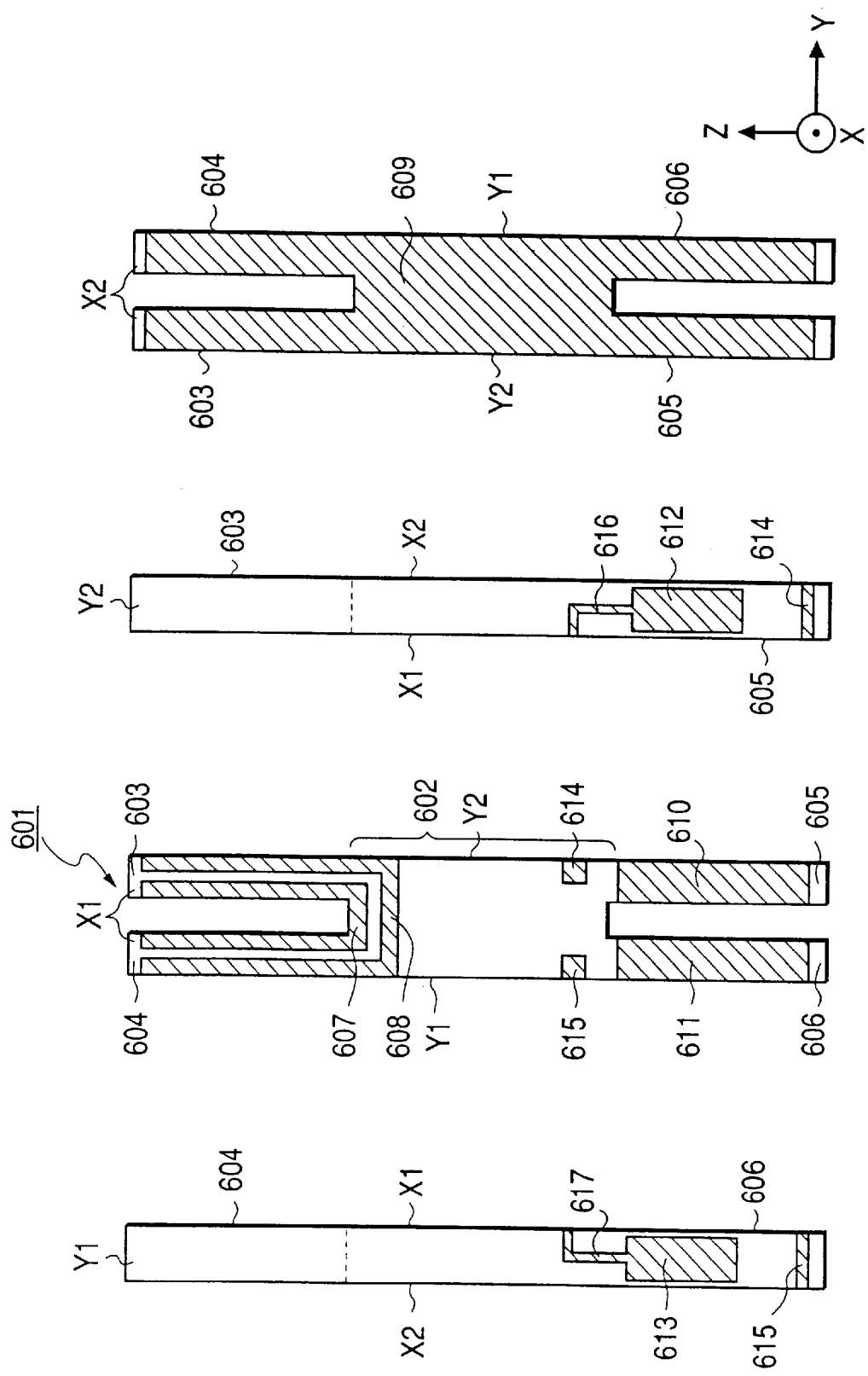

ANGULAR VELOCITY SENSOR, RELATED METHOD FOR MANUFACTURING THE SENSOR, AND PIEZOELECTRIC VIBRATOR ELEMENT USED IN THIS SENSOR

This is a division of application Ser. No. 09/058,787, filed Apr. 13, 1998, U.S. Pat. No. 5,987,987.

BACKGROUND OF THE INVENTION

The present invention relates to an angular velocity sensor which can be employed in various control systems, such as a vehicle motion/behavior control system as well as a navigation system, or in a video camera for compensating the operator's hand movement, and more particularly to an angular velocity sensor which detects an angular velocity using a piezoelectric vibrator.

Japanese Unexamined Patent Application No. 8-210860, published in 1996, discloses a conventional angular velocity sensor which comprises a piezoelectric vibrator configured into a tuning fork with a pair of arm bars and a connecting bar. According to this angular velocity sensor, the vibrator causes a predetermined vibration in a driving direction along which the arm bars are arrayed. When the sensor is subjected to an angular velocity, a Coriolis force derived from the angular velocity is detected as a vibration change of the vibrator caused in a sensing direction normal to the driving direction.

Japanese Unexamined Utility Application No. 5-71715, published in 1993, discloses another angular velocity sensor employing a lead wire arrangement according to which terminals of lead wires are located adjacent to a vibrator to shorten the length of each lead wire in the air.

SUMMARY OF THE INVENTION

An object of the present invention is to provide a novel, accurate and reliable angular velocity sensor.

Another object of the present invention is to provide a manufacturing method for fabricating this angular sensor.

Another object of the present invention is to provide a piezoelectric vibrator element used in this angular sensor.

In order to accomplish the above-described and other related objects, one aspect of the present invention provides an angular velocity sensor with a vibrator. The vibrator comprises a piezoelectric body configured into a predetermined shape having at least one pair of arm bars and a connecting bar. Electrodes are formed on an outer surface of the piezoelectric body. At least one drive electrode receives an alternating voltage to vibrate the arm bars in a drive axis direction along which the arm bars are arrayed. At least one sensing electrode detects a vibration caused in a sensing axis direction normal to the drive axis direction. The outer surface of the piezoelectric body comprises a front face and a rear face both being U-shaped. The drive electrode and the sensing electrode are formed on the front face, while a first reference electrode having a predetermined reference potential is formed on the rear face. At least one second reference electrode is formed on at least one side face of the aim bars of the piezoelectric body at a position corresponding to the sensing electrode. The second reference electrode is connected to the first reference electrode formed on the rear face.

Preferably, at least one additional sensing electrode is formed on the rear face at a predetermined arm portion corresponding to the sensing electrode, and at least one short-circuit electrode is formed on the side face of the arm bars to connect the additional sensing electrode to the sensing electrode.

Preferably, at least one ground electrode is formed on the front face at a predetermined position of the arm bars, and at least one short-circuit electrode is formed on the side face to connect the ground electrode to the first reference electrode.

Preferably, at least one monitor electrode is formed on the front face at a predetermined position of the arm bars, and the monitor electrode detects a vibration caused in the drive axis direction.

Preferably, the piezoelectric body is polarized from the front face to the rear face or vice versa by applying a predetermined voltage between the electrodes formed on the front and rear faces, and the electrodes formed on the side faces of the arm bars are fabricated after finishing the polarization of the piezoelectric body.

Preferably, the electrodes formed on the side faces of the arm bars are made of a low-temperature hardening type conductive resin.

Preferably, metallic wires are wire bonded to the electrodes formed on the front face of the piezoelectric body.

Preferably, a bonding position of a metallic wire connected to the sensing electrode formed on the front face is offset toward the connecting bar.

Preferably, the vibrator is secured to a base member, and the metallic wires are connected to terminals provided on the base member for inputting and outputting signals.

Another aspect of the present invention provides a manufacturing method for an angular velocity sensor. According to this manufacturing method, a first step is performed for forming the drive electrode and at least one polarizing electrode on a U-shaped front face of the piezoelectric body, and for forming a common electrode on a U-shaped rear face at a region corresponding to the drive electrode and the polarizing electrode. The polarizing electrode is positioned closer to a distal end of a corresponding arm bar than the drive electrode. Succeeding to the first step, a second step is performed for polarizing the piezoelectric body by applying a predetermined polarization voltage between the common electrode formed on the rear face and the electrode formed on the front face. Then, succeeding to the second step, a third step is performed for forming the sensing electrode on at least one side face of the piezoelectric body at a predetermined arm portion corresponding to the polarizing electrode.

Preferably, the first step includes a formation of at least one monitor electrode on the front face for monitoring a vibrating condition of a corresponding arm bar in the drive axis direction, so that the monitor electrode is interposed between the polarizing electrode and the drive electrode. The second step includes an application of the polarization voltage between the monitor electrode and the common electrode for polarizing the piezoelectric body.

Preferably, the first step includes a formation of at least one pad electrode on the front face for outputting a detection signal. The third step includes a formation of at least one lead electrode on at least one side face for connecting the sensing electrode and the pad electrode.

Preferably, the pad electrode is formed at a predetermined arm portion closer to a distal end of a corresponding arm bar than the polarizing electrode or at a predetermined arm portion closer to the connecting bar than the polarizing electrode.

Preferably, the first step includes a formation of at least one ground electrode on the front face for connecting the common electrode to a reference potential. The third step includes a formation of at least one short-circuit electrode on at least one side face for connecting the common electrode to the ground electrode.

Preferably, a processing temperature for the electrode formed on the side face in the third step is lower than a Curie temperature of the piezoelectric body.

Preferably, a conductive resin, hardening at a temperature lower than the Curie temperature of the piezoelectric body, is used for the formation of the electrode formed on the side face in the third step.

Preferably, a metallic deposition is used for forming the electrode on the side face in the third step.

Another aspect of the present invention provides an angular velocity sensor with a vibrator, a base plate and a supporter interposed between the vibrator and the base plate. The vibrator comprising a piezoelectric body having at least one polygonal arm bar and electrodes formed on the piezoelectric body. The electrodes include at least one drive electrode, at least one outlet electrode and at least one sensing electrode formed on a first face of the piezoelectric body, and a common electrode formed on an opposing second face of the piezoelectric body. The common electrode is integrally connected to the outlet electrode on the first face. The base plate confronts with the second face. The supporter supports the vibrator to the base plate. The piezoelectric body is polarized in an X-axis direction from the first face to the second face. The arm bar vibrates in a Y-axis direction parallel to the first and second faces and normal to a longitudinal direction of the arm bar, when an alternating voltage is applied between the drive electrode and the common electrode. The sensing electrode produces a signal representing a vibration of the arm bar caused in the X-axis direction due to an angular velocity of the vibrator appearing about a predetermined axis. The base plate has a reference face opposing to the second face of the vibrator. The reference face is provided with terminals electrically connected to the electrodes formed on the piezoelectric body. At least one of the drive electrode, the sensing electrode and the outlet electrode is connected to a corresponding one of the terminals via a lead wire chiefly made of aluminum by ultrasonic wire bonding.

In this case, the reference face may be provided with at least one hybrid IC substrate and at least one terminal electrically connected to the hybrid IC substrates. And, at least one of the drive electrode, the sensing electrode and the outlet electrode is connected to the hybrid IC substrate via a lead wire chiefly made of aluminum by ultrasonic wire bonding.

Preferably, the lead wire contains aluminum by a percentage equal to or larger than 90%.

Preferably, the vibrator is configured into a tuning fork with bifurcated arm bars causing a vibration and a connecting bar connecting base ends of the bifurcated arm bars. The first and second faces are opposing U-shaped flush surfaces extending along the arm bars and the connecting bar. The supporter supports a center of the connecting bar.

Preferably, the supporter has a neck portion extending in parallel to a longitudinal direction of the arm bars.

Preferably, the lead wire has a diameter equal to or smaller than 50 μm, or in a range of 30 μm to 50 μm, or a value capable of suppressing a temperature drift of the vibrator equal to or less than 10°/sec.

Preferably, the lead wire has a staring point and an ending point for the ultrasonic wire binding. The starting point is positioned farther than the ending point in the X-axis direction with respect to the reference face of the base plate.

Preferably, the lead wire is configured into a loop shape protruding from the first face of the vibrator and the reference face of the base plate between the starting point and the ending point, with a wire height equal to or larger than 0.4 mm as a clearance between the first point and a top of the lead wire in the X-axis direction. The wire heigh is equal to or smaller than 1.2 mm.

Preferably, the lead wire is arranged at a bonding angle θ in a range of 0–60°, when the bonding angle θ is an angle between the lead wire and the Y-axis direction when seen from the X-axis direction.

Another aspect of the present invention provides a manufacturing method for an angular velocity sensor with a vibrator comprising a piezoelectric body having at least one polygonal arm bar extending is a Z-axis direction. The piezoelectric body has a first face on which at least one drive electrode and at least one pad sensing electrode are formed. The drive electrode causes the arm bar to vibrate in a Y-axis direction normal to the Z-axis direction. The pad sensing electrode outputs a detection signal. The piezoelectric body has at least one second face neighboring to the first face. The second face is provided with at least one angular velocity sensing electrode and at least one lead electrode. The angular velocity sensing electrode detects a vibration of the arm bar caused in an X-axis direction normal to both of the Y-axis and Z-axis directions. The lead electrode connects the angular velocity sensing electrode to the pad sensing electrode. For manufacturing this angular velocity sensor, the manufacturing method comprises a first step for forming a predetermined pattern of electrode film on one face of a piezoelectric plate by printing and sintering. Next, a second step is performed for cutting the piezoelectric plate together with the electrode film so as to leave at least one cut surface serving as the second face, thereby forming the first and second faces with the drive electrode and the pad sensing electrode. Then, a third step is performed for forming the angular velocity sensing electrode and the lead electrode on the second face, wherein a printing operation of the lead electrode is performed prior to a hardening operation of the lead electrode so that a print sagging of the lead electrode extends over a comer ridgeline of the arm bar and overlaps with the pad sensing electrode formed on the first face.

Alternatively, for manufacturing the angular velocity sensor, the manufacturing method may perform a first step for cutting a piezoelectric body into a shape of the vibrator while leaving at least one cut surface at a side thereof. Then, a second step is performed for forming the drive electrode and the pad sensing electrode on the first face by printing and sintering. Furthermore, a third step is performed for polishing the cut surface of the piezoelectric body by a predetermined thickness so as to form the second face. Then, a fourth step is performed for forming the angular velocity sensing electrode and the lead electrode on the second face, wherein a printing operation of the lead electrode is performed prior to a hardening operation of the lead electrode so that a print sagging of the lead electrode extends over a comer ridgeline of the arm bar and overlaps with the pad sensing electrode formed on the first face.

Preferably, a polarizing step is performed, prior to the step for forming the angular velocity sensing electrode and the lead electrode, by applying a DC voltage to the piezoelectric body constituting the vibrator so that the piezoelectric body is polarized in a predetermined direction. A resinated conductor contaning metallic particles in a resin is used in the step for forming the angular velocity sensing electrode and the lead electrode, wherein the resinated conductor is printed on the second face in a pattern corresponding to the angular velocity sensing electrode and the lead electrode and then hardened at a temperature lower than a Curie temperature of the piezoelectric body.

Preferably, the resinated conductor comprises metallic particles configured into balls and flakes.

Preferably, the lead electrode is formed so as to have a widened portion at the comer ridgeline.

Another aspect of the present invention provides an angular velocity sensor with a vibrator comprising a piezoelectric body having at least one polygonal arm bar extending is a Z-axis direction. The piezoelectric body has a first face and a second face neighboring to the first face. At least one first electrode and at least one pad electrode are formed on the first face. At least one second electrode and at least one lead electrode are formed on the second face, so as to cause the arm bar to vibrate in a Y-axis direction normal to the Z-axis direction and output a detection signal representing a vibration of the arm bar caused in an X-axis direction normal to both of the Y-axis and Z-axis directions. The pad electrode and the lead electrode extend over a comer ridgeline to a neighboring face each other so as to form an overlapped connecting portion.

Preferably, the first electrode is at least one drive electrode and the second electrode is at least one angular velocity sensing electrode.

Preferably, the angular velocity sensing electrode and the connecting electrode formed on the second face are made of a resinated conductor comprising metallic particles mixed in a resin, and the resinated conductor is hardened at a temperature lower than a Curie temperature of the piezoelectric body. The resinated conductor may comprise metallic particles configured into balls and flakes. The connecting electrode may have a widened portion at the comer ridgeline. The overlapped connecting portion has a first overlap length extending in the X-axis direction from the comer ridgeline and a second overlap length extending in the Y-axis direction from the comer ridgeline. The first overlap length and the second overlap length are equal to or larger than 20 $\mu$m. The arm bar is chamferred along the comer ridgeline.

Preferably, the vibrator is configured into a tuning fork with bifurcated arm bars and a connecting bar connecting base ends of the bifurcated arm bars. The first face and the third face are opposing flush faces extending the arm bars and the connecting bar. The X-axis direction in normal to the first face and the third face, while the arm bars are arrayed along the Y-axis direction.

In the above-described angular velocity sensor, the piezoelectric body may have a third face in addition to the first and the second faces. The third face opposes to the first face. A common electrode is formed on the third face, so as to cause the arm bar to vibrate in a Y-axis direction normal to the Z-axis direction by applying an alternating voltage between the first electrode and the common electrode and output a detection signal through the angular velocity sensing electrode as a signal representing a vibration of the arm bar caused in an X-axis direction normal to both of the Y-axis and Z-axis directions. The connecting electrode may be formed on the second face for providing an electrical connection to the electrodes formed on the third face. And, the connecting electrode and the electrodes formed on the third face extend over a corner ridgeline to a neighboring face each other so as to form an overlapped connecting portion.

To manufacture the above-described angular velocity sensor, a manufacturing method is provided, according to which a first step is performed for cutting a piezoelectric plate into a shape of the vibrator so as to leave at least one cut surface serving as the second face. A second step is performed for forming the first electrode and the pad electrode on the first face, so that a first print sagging of the pad electrode extends over a corner ridge of the arm bar to the second face. Then, a third step is performed for forming the second electrode and the lead electrode on the second face, so that a second print sagging of the lead electrode extends over the corner ridge of the arm bar to the first face, thereby forming an overlapped connecting portion of the first print sagging and the second print sagging in a vicinity of the corner ridgeline.

The manufacturing method may comprise the second step for forming the drive electrode and the pad electrode on the first face and forming the common electrode on the third face, so that a first print sagging of at least one of the pad electrode and the common electrode extending over a corner ridge of the arm bar to the second face. A polarizing step may be performed after the second step to polarize the piezoelectric body in a predetermined direction by applying a DC voltage. The third step may be performed for forming the angular velocity sensing electrode and the connecting electrode on the second face, so that a second print sagging of the connecting electrode extending over the comer ridge of the arm bar to at least one of the first face and the third face, thereby forming an overlapped connecting portion of the first print sagging and the second print sagging in a vicinity of the comer ridgeline.

Preferably, the angular velocity sensing electrode, the connecting electrode and the second sagging are formed by printing a resinated conductor on the second face, and the resinated conductor comprises metallic particles mixed in a resin and is hardened at a temperature lower than a Curie temperature of the piezoelectric body.

Another aspect of the present invention provides a piezoelectric vibrator element comprising a piezoelectric vibrator member, at least one electrode formed on the vibrator member, and at least one lead wire bonded to the electrode. The lead wire contains aluminum as a chief component and is bonded to the electrode by ultrasonic wire bonding. The electrode is a silver thick film containing palladium.

Preferably, the lead wire has a diameter equal to or smaller than 50 $\mu$m. The electrode has a film thickness in a range of 10 $\mu$m to 40 $\mu$m. At least one first-layer electrode is formed on a face of the vibrator member and at least one second-layer electrode is formed on the first-layer electrode so as to constitute a double-layer construction. The lead wire is bonded on the second-layer electrode. The second-layer electrode contains palladium by an amount in a range of 5% to 50% as a weight percentage relative to a total amount of the silver and the palladium. The first-layer electrode contains glass or inorganic oxide by an amount in a range of 1% to 15% as a weight percentage relative to a total amount of the first-layer electrode. The second-layer electrode contains glass or inorganic oxide by an amount smaller than 1% as a weight percentage relative to a total amount of the second-layer electrode.

Preferably, the electrode and the piezoelectric vibrator member are exposed to a nitrogen atmosphere.

BRIEF DESCRIPTION OF THE DRAWINGS

The above and other objects, features and advantages of the present invention will become more apparent from the following detailed description which is to be read in conjunction with the accompanying drawings, in which:

FIGS. 2A through 2D are views showing electrodes formed on respective faces of a vibrator shown in FIG. 1;

FIGS. 3A through 3D are views similar to FIGS. 2A–2D but cooperatively showing a modified electrode arrangement in accordance with the first embodiment of the present invention;

FIGS. 6A through 6D are views showing electrodes formed on respective faces of a vibrator shown in FIG. 5;

FIGS. 22 and 23 are tables showing data obtained in an operational durability test in accordance with the third embodiment of the present invention;

FIG. 38 is an enlarged cross-sectional view illustrating a side face polishing process in accordance with the manufacturing method of FIG. 37;

FIGS. 42A through 42C are views cooperatively showing an electrode arrangement in accordance with the eighth embodiment of the present invention;

FIGS. 51A through 51D are views showing electrodes formed on respective faces of a vibrator shown in FIG. 50; and FIGS. 52A through 52D are views cooperatively showing an electrode arrangement in accordance with a twelfth embodiment of the present invention.

DESCRIPTION OF THE PREFERRED EMBODIMENTS

Preferred embodiments of the present invention will be explained with reference to the accompanying drawings.

First Embodiment

Figure 1:
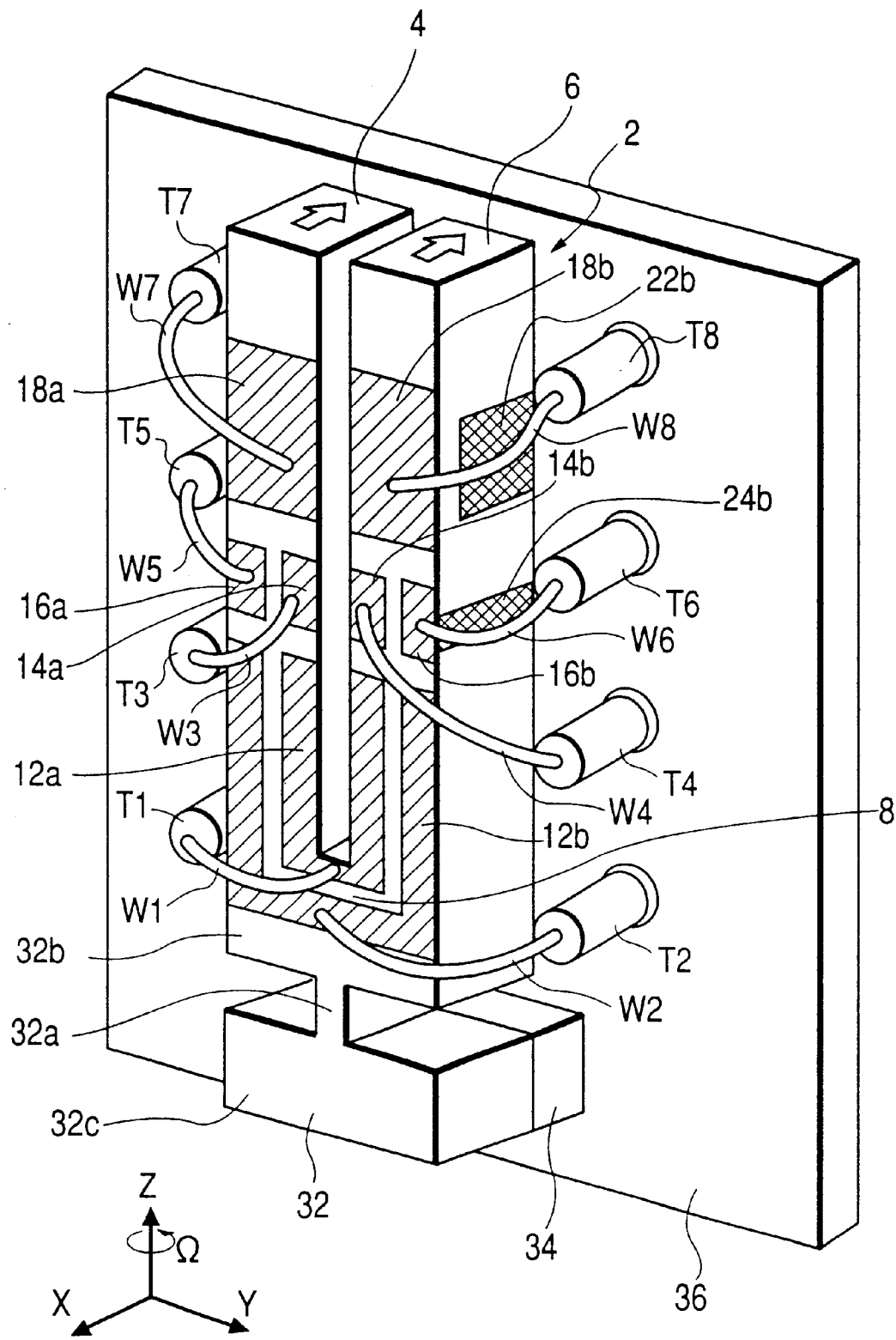
FIG. 1 is a perspective view showing an overall arrangement of an angular velocity sensor in accordance with a first embodiment of the present invention.

FIG. 1 is a perspective view showing an arrangement of an angular velocity sensor in accordance with a first embodiment of the present invention. FIGS. 2A, 2B, 2C and 2D are views showing each face of a vibrator 2.

As shown in FIG. 1, an angular sensor of the first embodiment comprises a vibrator 2 configured into a tuning fork having an U-shaped bar with one closed base end (i.e., a connecting bar 8) and bifurcated distal ends (i.e., a left arm bar 4 and a right arm bar 6). As apparent from the drawing, the U-shaped configuration corresponds to an elongated ⊔ shape. Each of the left and right arm bars 4, 6 and connecting bar 8 is formed into a right rectangular prism. These bar portions 4, 6 and 8 are integral and made of a piezoelectric body, such as a ceramic piezoelectric body or a crystal. This embodiment uses PZT, which is one of ceramic piezoelectric members, because of preferable polarization being flexibly adjustable as well as easiness in manufacturing.

As shown in FIG. 2A, the vibrator 2 has a U-shaped flush front face X1 on which parallel drive electrodes 12a and 12b are provided symmetrically with respect to a vertical or longitudinal center axis (i.e., Z-axis) of the vibrator 2. The parallel drive electrodes 12a and 12b extend along the longitudinal (i.e., lateral) direction of the connecting bar 8 and then turn perpendicularly (i.e., upward in FIG. 1) to extend further in parallel with each other along the front face X1 of respective arm bars 4 and 6. Thus, the parallel drive electrodes 12a and 12b, each being formed into a U-shaped configuration, bridge the connecting bar 8 and respective arm bars 4 and 6. The upper ends of the drive electrodes 12a and 12b are positioned at the same height of respective arm bars 4 and 6.

The drive electrode 12a, referred to as inside drive electrode 12a, extends along an inside periphery of the U-shaped front face X1. The other drive electrode 12b, referred to as outside drive electrode 12b, extends along an outside periphery of the U-shaped front face X1.

Monitor electrodes 14a, 14b and ground electrodes 16a, 16b are provided next to the drive electrodes 12a and 12b at portions far from the connecting bar 8 (i.e., closer to the remote ends of respective arm bars 4 and 6 than the drive electrodes 12a and 12b). One monitor electrode 14a, provided on the left arm bar 4, is continuous from a left upper end of the inside drive electrode 12a but spaced with a predetermined clearance. The other monitor electrode 14b, provided on the right arm bar 6, is continuous from a right upper end of the inside drive electrode 12a but spaced with a predetermined clearance. One ground electrode 16a, provided on the left arm bar 4, is continuous from a left upper end of the outside drive electrode 12b but spaced with a predetermined clearance. The other ground electrode 16b, provided on the right arm bar 6, is continuous from a right upper end of the outside drive electrode 12b but spaced with a predetermined clearance. The monitor electrodes 14a, 14b and the ground electrodes 16a, 16b are located at the same height with a same vertical (longitudinal) length.

Sensing electrodes 18a and 18b are provided next to the monitor and ground electrodes 14a, 14b, 16a, 16b at portions more far from the connecting bar 8 (i.e., closer to the remote ends of respective arm bars 4 and 6 than the monitor and ground electrodes 14a, 14b, 16a, 16b). The sensing electrodes 18a and 18b are located at a same height with a same vertical (longitudinal) length. The sensing electrode 18a and 18b extend laterally across the front faces X1 of the arm bars 4 and 6. Thus, the lateral width of each sensing electrode 18a, 18b is identical with the lateral width of the corresponding arm bar portion of the front face X1. The sensing electrodes 18a and 18b serve as electrodes for generating an angular velocity signal as well as electrodes for polarizing the piezoelectric body of the vibrator 2.

The vibrator 2 has a U-shaped flush rear face X2 which is completely the same in configuration as the front face X1. The front and rear faces X1 and X2 are parallel. On the rear face X2, a first reference electrode 20 is entirely provided as a U-shaped common electrode at a region corresponding or facing to all of the above-described drive electrodes 12a, 12b, monitor electrodes 14a, 14b, ground electrodes 16a, 16b and sensing electrodes 18a, 18b, as shown in FIG. 2D.

The left arm bar 4 has an outer side face Y1 provided with a second reference electrode 22a at an altitudinal position corresponding to the sensing electrode 18a and a short-circuit electrode 24a at an altitudinal position corresponding to the ground electrode 16a, as shown in FIG. 2B. The right arm bar 6 has an outer side face Y2 provided with another second reference electrode 22b at an altitudinal position corresponding to the other sensing electrode 18b and another short-circuit electrode 24b at an altitudinal position corresponding to the other ground electrode 16b, as shown in FIG. 2C. The short-circuit electrodes 24a and 24b electrically connect the first reference electrode 20 to the ground electrodes 16a and 16b, respectively.

The second reference electrode 22a is integral with the first reference electrode 20 (i.e., continuously connected along a corner ridgeline separating the faces X2 and Y1). The other second reference electrode 22b is integral with the first reference electrode 20 (i.e., continuously connected along a corner ridgeline separating the faces X2 and Y2). The reference electrodes 22a and 22b are laterally offset toward the rear face X2.

All of the electrodes thus formed on respective faces of the vibrator 2 are symmetrically arranged with respect to the vertical or longitudinal center axis (i.e., Z-axis) of the vibrator 2.

According to the first embodiment, the drive electrodes 12a, 12b, monitor electrodes 14a, 14b, ground electrodes 16a, 16b, sensing electrodes 18a, 18b and first reference electrode 20 are formed by print and sintering an appropriate electrode material, such as silver, on the front and rear faces X1 and X2 of the piezoelectric body of the vibrator 2. Thereafter, a predetermined voltage is applied between the electrodes on these faces X1 and X2, providing a polarization which directs from the front face X1 to the rear face X2 (as shown by arrows in FIG. 1).

After the above-described polarization processing is finished, the second reference electrodes 22a, 22b and the short-circuit electrodes 24a, 24b are formed by applying a low-temperature hardening type conductive resin on the side faces Y1 and Y2 of the piezoelectric body of the vibrator 2. This conductive resin is hardened at a temperature lower than a Curie temperature of the piezoelectric body. Namely, the low-temperature hardening type conductive resin used in this embodiment is preferably a so-called polymer conductive paste which includes, as a binder, a thermosetting resin (e.g., phenol resin) hardened at a temperature (e.g., 150° C.) sufficiently lower than the Curie temperature of the piezoelectric body. The polymer conductive paste further comprises an appropriate amount of metal, such as gold, silver and copper, in a powder state mixed with the binder. For example, a silver conductive paste "LS-504" is commercially available from Asahi Chemical.

Next, the fabricated vibrator 2 is bonded on a base 32b of a supporter 32 by an appropriate adhesive, such as epoxy adhesive, as shown in FIG. 1. The supporter 32 is configured into a laid H-shaped body with an upper platform serving as the base 32b horizontally extending for supporting the bottom face of the connecting bar 8 of the vibrator 2. The supporter 32 has a lower elongated foot 32c whose rear face is bonded via a spacer 34 to a front face of a base plate 36 by bonding or welding. Thus, the vibrator 2 stands on the supporter 32 and is held in a cantilever fashion. The rear face X2 of the vibrator 2 confronts in parallel with the front face of the base plate 36.

The supporter 32 further comprises a neck 32a, serving as a vibration absorber like a torsion beam, which vertically extends for integrally connecting the base 32b and the foot 32c. The supporter 32 is made of an appropriate metal material, such as 42N, which is processible into the H-shaped configuration.

The base plate 36 is directly secured to a casing of an angular velocity sensor or a vehicle body, or indirectly via a vibrationproof rubber. A total of eight terminals T1–T8 are provided on the base plate 36 for the drive electrodes 12a, 12b, monitor electrodes 14a, 14b, ground electrodes 16, 16b, and sensing electrodes 18a, 18b. These terminals T1–T8 are separated into two, right and left, vertical rows arranged symmetrically about the vertical center axis (i.e., Z-axis) of the vibrator 2.

These terminals T1–T8, serving as relays, are interposed between the above-described electrodes and a drive/sensing circuit (not shown). Metallic wires W1–W8 straddle, by wire bonding, for electric connection between terminals T1–T8 and their corresponding electrodes. The base plate 36 is electrically insulated from these terminals T1–T8.

The wires W1 and W2 are connected to the lateral centers (i.e., symmetrical centers) of the inside and outside drive electrodes 12a and 12b, respectively. The wires W7 and W8 are connected to the sensing electrodes 18a and 18b, with their connecting points being vertically offset toward the connecting bar 8 from the centers of the sensing electrodes 18a and 18b. The wires W3, W4, W5 and W6 are connected to substantial centers of their corresponding electrodes (i.e., monitor electrodes 14a, 14b and ground electrodes 16a, 16b).

The above-described angular velocity sensor of the first embodiment operates to detect an angular velocity. For this operation, the first reference electrode 20 and the second reference electrodes 22a, 22b have a reference potential via the terminals T5 and T6 connected to the ground electrodes 16a, 16b. The drive electrodes 12a and 12b receive AC drive signals from the terminals T1 and T2, respectively. The entered drive signals are mutually phase shifted by 180°, and each causes a cyclic change centered at the reference potential and varying in both positive and negative directions. The frequency of each drive signal is equal to a resonant frequency of the vibrator 2 in a drive axis direction (i.e., Y-axis shown in FIG. 1). The drive axis coincides with a direction along which the left arm bar 4 and the right arm bar 6 are arrayed.

As a result, AC voltages having mutually reversed phases are applied between the drive electrodes 12a, 12b on the front face X1 and the first reference electrode 20 on the rear face X2. The arm bars 4 and 6 resonate in the Y-axis direction. During the drive operation, current flows between the monitor electrode 14a and the first reference electrode 20. This current is monitored as an output obtained through the terminal T3. In the same manner, current flows between the other monitor electrode 14b and the first reference electrode 20. This current is monitored as an output obtained through the terminal T4. Each drive signal is feedback controlled based on the monitored value so as to stabilize the amplitude of each arm bar 4, 6 in the Y-axis direction irrespective of any temperature change. This is referred to as a controlled self-excited oscillation.

Next, under such a controlled self-excited oscillating condition, the vibrator 2 may be subjected to an angular velocity $\Omega$ entered about the vertical center axis (i.e., Z axis) of each arm bar 4, 6. This angular velocity $\Omega$ induces a Coriolis force which vibrates the arm bars 4 and 6 in the X-axis direction (i.e., sensing axis direction) which is normal to the front face X1 and the rear face X2.

An X-axis component of the caused vibration in each arm bar 4, 6 is proportional to current flowing across the sensing electrode 18a or 18b and the second reference electrode 22a or 22b (i.e., the first reference electrode 20). The current value is detectable as an output signal via the terminal T7 or T8 connected to the sensing electrode 18a or 18b.

Each output current value is converted into a voltage signal by an appropriate current-voltage conversion circuit. Each converted voltage signal is amplified through a differential amplifier, and produced as a voltage signal corresponding to an amplitude component of the sensed resonance mode of each arm bar 4, 6. The produced signal is taken out as a sensing signal representing the angular velocity with respect to the Z axis.

As explained in the foregoing description, the vibrator 2 of the first embodiment has the front face X1 on which the various electrodes are formed for inputting the drive signals and outputting the monitor and sensing signals. Furthermore, the arrangement of these electrodes are symmetrically with respect to the vertical center of the front face X1. This arrangement is effective because all of necessary input/output signal lines can be connected to the front face X1 of the vibrator 2. Not only a connecting operation of the signal lines can be simplified, but also dispersion in the vibration characteristics can be suppressed effectively between the left and right arm bars 4 and 6.

Especially, according to the first embodimnent, the signal line connection to the vibrator 2 is performed by a wire bonding using wires W1–W8. The connection of the wires W1–W8 to the terminals T1–T8 is symrnmetrical. In other words, the first embodiment provides a complete symmetrical arrangement for connection of all the signals lines (i.e., wires W1–W8).

Moreover, the vibrator 2 causes a large displacement at the distal end sides of respective arm bars 4 and 6. According to the first embodiment, the sensing electrodes 18a and 18b are formed at these distal end sides of respective arm bars 4 and 6. The bonding points of the wires W7 and W8 to these sensing electrodes 18a and 18b are offset toward the connecting bar 8. Such an offset arrangement makes it possible to effectively suppress the displacement of wires W7 and W8 during the vibration of the vibrator 2. The wires W7 and W8 can be a thin metallic wire. As a result, it becomes possible to reduce a force transmitted from the wires W7 and W8 to the vibrator 2. The vibrator 2 is usually subjected to an undesirable variation in the vibration characteristics. However, the present invention reduces such a change.

As described above, the first embodiment suppresses noises derived from a difference in the vibration characteristics between the left arm bar 4 and the right arm bar 6 of the vibrator 2. An S/N ratio of the sensing signal is improved. An undesirable temperature drift is reduced. An accuracy in the angular velocity detection can be improved. The connection of the signal lines (i.e., wires W1–W8) to the vibrator 2 can be automated by the use of an appropriate wire bonding operation. This significantly reduces the production cost of each angular sensor.

The above-described first embodiment can be variously modified. FIGS. 3A through 3D cooperatively show a modified example of the vibrator 2 in accordance with the first embodiment of the present invention. According to this modified embodiment, the vibrator 2 comprises sensing electrodes 26a and 26b provided on the rear face X2 of the vibrator 2 in addition to the sensing electrodes 18a and 18b formed on the front face X1. The altitudinal position of the newly provided sensing electrodes 26a and 26b is identical with that of the sensing electrodes 18a and 18b. A short-circuit electrode 28a, provided on the side face Y1, connects the front sensing electrode 18a with the rear sending electrode 26a which confront in parallel to each other. A short-circuit electrode 28b, provided on the other side face Y2, connects the front sensing electrode 18b with the rear sending electrode 26b which confront in parallel to each other.

According to the arrangement of the above-described modified embodiment, the X-axis component of the caused vibration in each arm bar 4, 6 is detectable as current flowing between the newly provided sensing electrode 26a or 26b and the second reference electrode 22a or 22b, in addition to the current flowing between the front sensing electrode 18a or 18b and the second reference electrode 22a or 22b. This increases the sensitivity in the angular velocity detection (substantially doubled). The S/N ratio of the sensing signal can be further increased. The temperature drift can be further reduced.

In this modified embodiment, the second reference electrodes 22a and 22b formed on the side faces Y1 and Y2 must be isolated from both of the front sensing electrodes 18a, 18b and the rear sensing electrodes 26a, 26b. Thus, as shown in FIGS. 3B and 3C, each of the second reference electrodes 22a and 22b is relatively thin and extends in the vertical direction at the central region of each side face Y1, Y2 for providing vertically extending clearances to the neighboring sensing electrodes 18a, 18b and 26a 26b. The lower ends of the second reference electrodes 22a and 22b are connected to the short-circuit electrodes 24a and 24b, respectively. As described above, the short-circuit electrodes 24a and 24b extend from the first reference electrode 20 formed on the rear face X2 to the ground electrodes 16a and 16b formed on the front face X1, respectively, for electrical connections therebetween.

Next, a fabricating method for the modified vibrator 2 shown in FIGS. 3A through 3D will be explained.

For the polarization processing, a predetermined DC voltage is applied between the front electrodes (i.e., drive electrodes 12a, 12b, monitor electrodes 14a, 14b, and ground electrodes 16a, 16b formed on the front face X1) and the common electrode (i.e., first reference electrode 20 formed on the rear face X2). The piezoelectric body interposed between these electrodes is polarized in the direction from the front face X1 to the rear face X2 (or in the opposite direction). In the same manner, a predetermined voltage is applied between the sensing electrodes 18, 18b formed on the front face X1 and the sensing electrodes 26a, 26b formed on the rear face X2. Thus, the piezoelectric body interposed between these electrodes is polarized in the direction from the front face X1 to the rear face X2 (or in the opposite direction). The second reference electrodes 22a, 22b and the short-circuit electrodes 24a, 24b, 28a, 28b are formed after finishing the above-described polarization processing of the piezoelectric body. An appropriate low-temperature hardening type conductive -resin can be used for forming the second reference electrodes 22a, 22b and the short-circuit electrodes 24a, 24b, 28a, 28b.

Figure 4A:
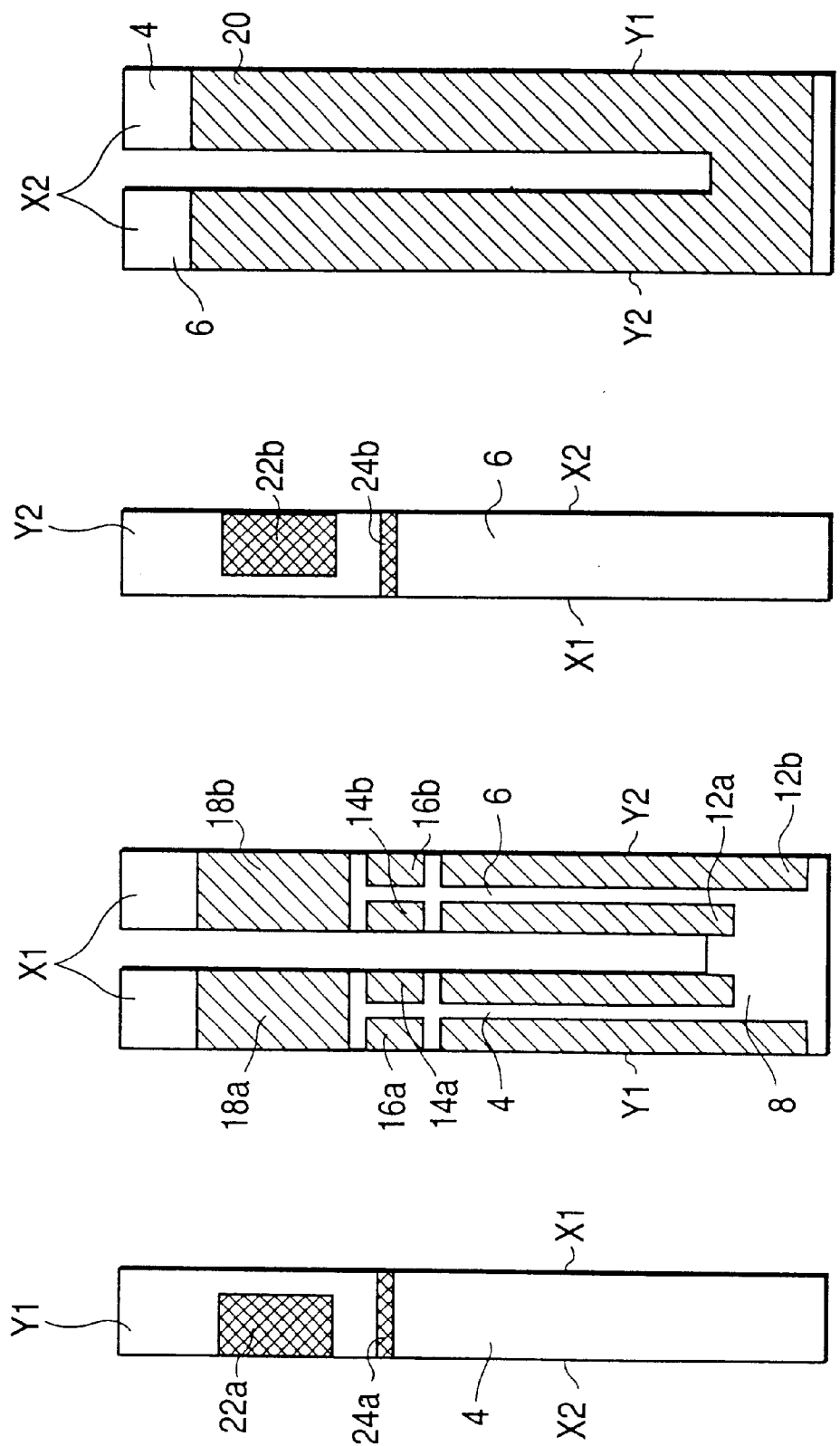
FIGS. 4A and 4B are views each corresponding to FIGS. 2A–2D and showing a modified electrode arrangement in accordance with the first embodiment of the present invention.

FIG. 4A shows another modified vibrator 2 in accordance with the first embodiment of the present invention. This modified embodiment differs from the above-described embodiments in that the inside and outside drive electrodes 12a and 12b are not provided in the region of the connecting bar 8. In other words, the inside and outside drive electrodes 12a and 12b extend straight in the Z-axis direction in the regions of the arm bars 4 and 6.

Figure 4B:
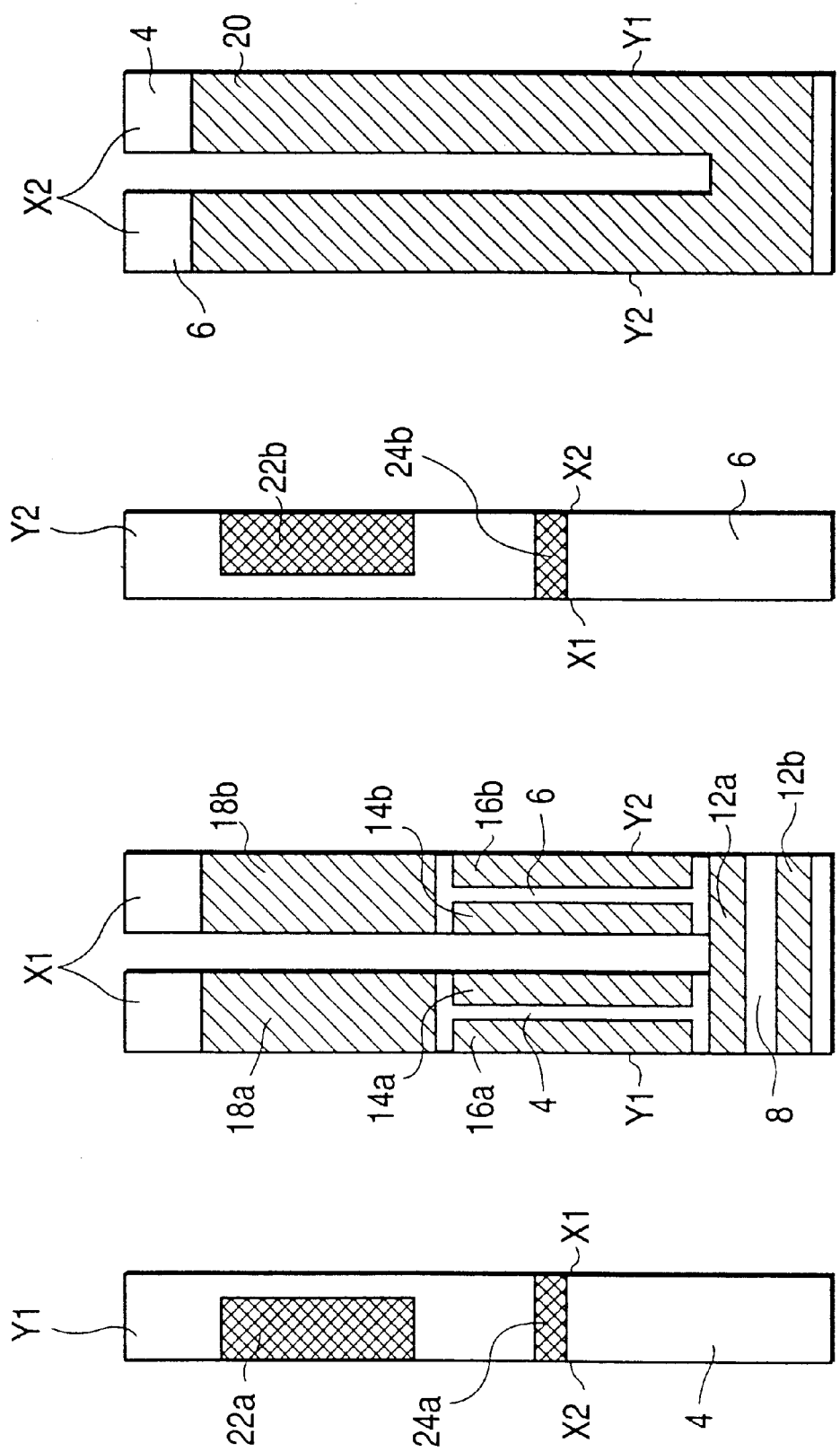

FIG. 4B shows yet another modified vibrator 2 in accordance with the first embodiment of the present invention. This modified embodiment differs from the above-described embodiments in that the inside and outside drive electrodes 12a and 12b are chiefly provided in the region of the connecting bar 8 so as to extend straight in the Y-axis direction. In this modified embodiment, the monitor electrodes 14a, 14b and the ground electrodes 16a, 16b extend in the vertical direction between the drive electrodes 12a, 12b and the sensing electrodes 18a, 18b.

Needless to say, the modified drive electrodes 12a and 12b shown in FIGS. 4A and 4B can be applied to the vibrator 2 shown in FIGS. 3A through 3D.

The piezoelectric vibrator 2 and the metallic supporter 32 can be replaced by a single piezoelectric body, consisting of an vibrator portion and a supporter portion which are integral, which can be directly bonded to the base plate 36.

Furthermore, the reference potential may be set to an earth (ground) potential, or may be biased so as to maintain it to a constant potential such as 2.5 V.

Second Embodiment

Figure 5:
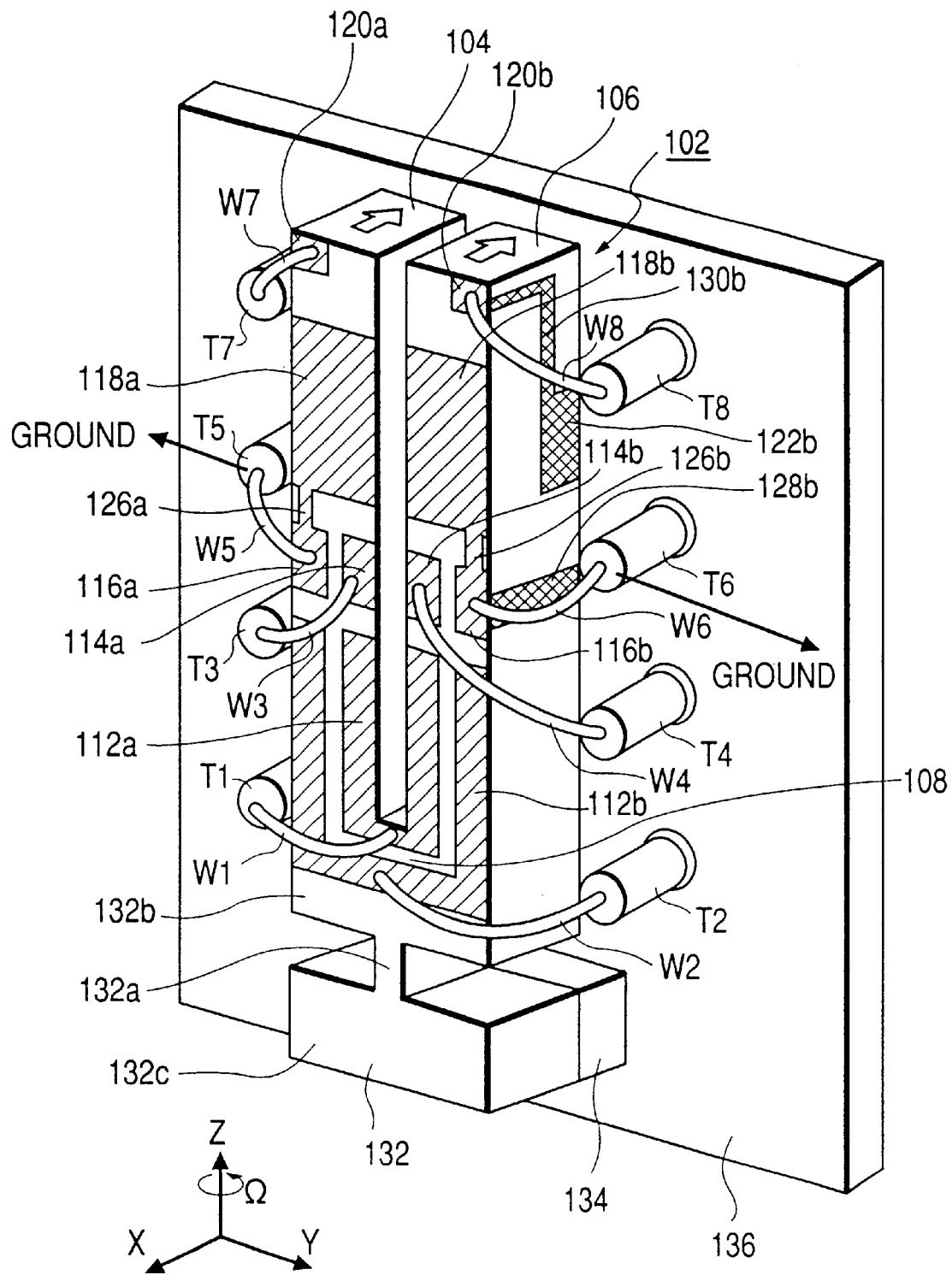
FIG. 5 is a perspective view showing an overall arrangement of an angular velocity sensor in accordance with a second embodiment of the present invention.

FIG. 5 is a perspective view showing an arrangement of an angular velocity sensor in accordance with a second embodiment of the present invention. FIGS. 6A, 6B, 6C and 6D are views showing each face of a vibrator 102.

As shown in FIG. 5, an angular sensor of the second embodiment comprises a vibrator 102 configured into a tuning fork having an U-shaped bar with one closed base end (i.e., a connecting bar 108) and bifurcated distal ends (i.e., a left arm bar 104 and a right arm bar 106). Each of the left and right arm bars 104, 106 and connecting bar 108 is formed into a right rectangular prism. These bar portions 104, 106 and 108 are integral and made of a piezoelectric body, such as a ceramic piezoelectric body or a crystal. This embodiment uses PZT, which is one of ceramic piezoelectric members, because of preferable polarization being flexibly adjustable as well as easiness in manufacturing.

As shown in FIG. 6A, the vibrator 102 has a U-shaped flush front face X1 on which parallel drive electrodes 112a and 112b are provided symmetrically with respect to a vertical or longitudinal center axis (i.e., Z-axis) of the vibrator 102. The parallel drive electrodes 112a and 112b extend along the longitudinal (i.e., lateral) direction of the connecting bar 108 and then turn perpendicularly (i.e., upward in FIG. 5) to extend further in parallel with each other along the front face X1 of respective arm bars 104 and 106. Thus, the parallel drive electrodes 112a and 112b, each being formed into a U-shaped configuration, bridge the connecting bar 108 and respective arm bars 104 and 106. The upper ends of the drive electrodes 112a and 112b are positioned at the same height of respective arm bars 104 and 106.

The drive electrode 112a, referred to as inside drive electrode 112a, extends along an inside periphery of the U-shaped front face X1. The other drive electrode 112b, referred to as outside drive electrode 112b, extends along an outside periphery of the U-shaped front face X1.

Monitor electrodes 114a, 114b and provisional ground electrodes 116a, 116b are provided next to the drive electrodes 112a and 112b at portions far from the connecting bar 108 (i.e., closer to the remote ends of respective arm bars 104 and 106 than the drive electrodes 112a and 112b). One monitor electrode 114a, provided on the left arm bar 104, is continuous from a left upper end of the inside drive electrode 112a but spaced with a predetermined clearance. The other monitor electrode 114b, provided on the right arm bar 106, is continuous from a right upper end of the inside drive electrode 112a but spaced with a predetermined clearance. One provisional ground electrode 116a, provided on the left arm bar 104, is continuous from a left upper end of the outside drive electrode 112b but spaced with a predetermined clearance. The other provisional ground electrode 116b, provided on the right arm bar 106, is continuous from a right upper end of the outside drive electrode 112b but spaced with a predetermined clearance. The monitor electrodes 114a, 114b and the provisional ground electrodes 116a, 116b are located at the same height with a same vertical (longitudinal) length.

Polarizing electrodes 118a and 118b are provided next to the monitor and provisional ground electrodes 114a, 114b, 116a, 116b at portions more far from the connecting bar 108 (i.e., more closer to the remote ends of respective arm bars 104 and 106 than the monitor and provisional ground electrodes 114a, 114b, 116a, 116b). The polarizing electrodes 118a and 118b are located at the same height with a same vertical (longitudinal) length. The polarizing electrodes 118a and 118b extend laterally across the front face X1 of respective arm bars 104 and 106. Thus, the lateral width of each polarizing electrode 118a, 118b is identical with the lateral width of the corresponding arm bar portion of the front face X1. Pad electrodes 120a and 120b are provided at the remotest ends on the front face X1 of the arm bars 104 and 106, respectively. Detection signals are taken out from the pad electrodes 120a and 120b thus provided.

On the front face X1, the polarizing electrodes 118a and 118b are integrally formed with the provisional ground electrodes 116a and 116b via short-circuit electrodes 126a and 126b, respectively. Hereinafter, the provisional ground electrodes 116a and 116b are referred to as front provisional ground electrodes.

The vibrator 102 has a U-shaped flush rear face X2 which is completely the same in configuration as the front face X1. The front and rear faces X1 and X2 are parallel. On the rear face X2, a rear provisional ground electrode 124 is entirely provided as a U-shaped common electrode at a region corresponding or facing to all of the above-described drive electrodes 112a, 112b, monitor electrodes 114a, 114b, front provisional ground electrodes 116a, 116b and polarizing electrodes 118a, 118b, as shown in FIG. 6D.

The left arm bar 104 has an outer side face Y1 provided with a sensing electrode 122a at an altitudinal position corresponding to the polarizing electrode 118a and a short-circuit electrode 128a at an altitudinal position corresponding to the front provisional ground electrode 116a, as shown in FIG. 6B. The right arm bar 106 has an outer side face Y2 provided with another sensing electrode 122b at an altitudinal position corresponding to the polarizing electrode 118b and another short-circuit electrode 128b at an altitudinal position corresponding to the other front provisional ground electrode 116b, as shown in FIG. 6C. The short-circuit electrodes 128a and 128b electrically connect the rear provisional ground electrode 124 to the front provisional ground electrodes 116a and 116b, respectively.

The sensing electrodes 122a and 122b, formed on the side faces Y1 and Y2, are laterally offset adjacent to the rear face X2 but completely isolated from all of polarizing electrodes 118a, 118b, front provisional ground electrodes 116a, 116b, and rear provisional ground electrode 124.

The sensing electrodes 122a and 122b are integral with the pad electrodes 120a and 120b via lead electrodes 130a and 130b, respectively. The lead electrodes 130a and 130b extend upward from the sensing electrodes 122a and 122b, and turn perpendicular toward the pad electrodes 120a and 120b.

All of the electrodes thus formed on respective faces of the vibrator 102 are symmetrically arranged with respect to the vertical or longitudinal center axis (i.e., Z-axis) of the vibrator 102.

A fabricating method for the above-described vibrator 102 according to the second embodiment will be explained with reference to FIGS. 3A through 3C.

Figure 7A:
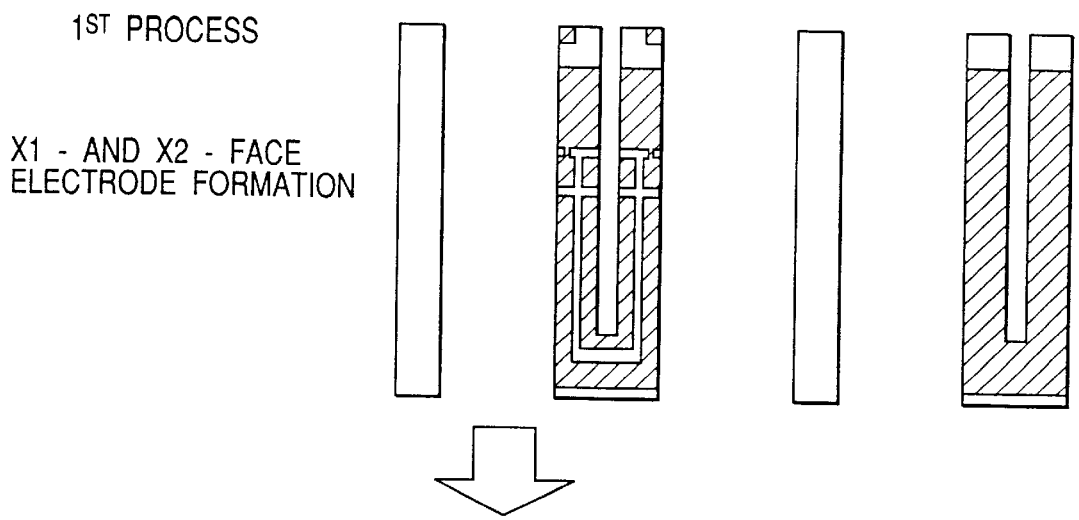
FIGS. 7A through 7C are illustrating a manufacturing method for the vibrator shown in FIG. 5.

First, as shown in FIG. 7a, the above-described drive electrodes 112a, 112b, the monitor electrodes 114a, 114b, the front provisional ground electrodes 116, 116b, the polarizing electrodes 118a, 118b, and the pad electrodes 120a, 120b are formed on the designated portions of the front face X1 of the tuning fork piezoelectric body. The rear provisional ground electrode 124 is formed on the rear face X2. This is referred to as first process. In this first process, an appropriate metallic paste chiefly containing a conductive metal, such as silver, is applied or printed in the designated pattern of the above-described electrodes on the surfaces of the piezoelectric body. Then, the applied or printed metallic paste is sintered to form the above-described electrodes.

Figure 7B:
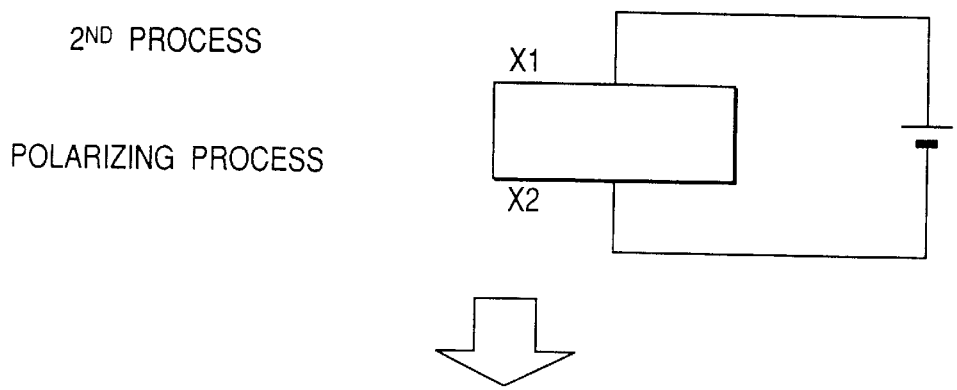

After finishing the first process for forming the electrodes on the front and rear faces of the piezoelectric body, a second process for polarizing the piezoelectric body is performed as shown in FIG. 7B. More specifically, a predetermined polarization DC voltage is applied between the front electrodes (i.e., drive electrodes 112a, 112b, monitor electrodes 114a, 114b, front provisional ground electrodes 116a, 116b, and polarizing electrodes 118a, 118b formed on the front face X1) and the rear common electrode (i.e., rear provisional ground electrode 124 formed on the rear face X2). The piezoelectric body interposed between these front and rear electrodes is polarized in a predetermined direction (e.g., from the front face X1 to the rear face X2 in this embodiment). During the second process for polarizing the piezoelectric body, the sensing electrodes are not formed on the side faces Y1 and Y2 of the piezoelectric body. Thus, the polarization processing can be carried out without being influenced by such electrodes formed on the side faces Y1 and Y2.

Figure 7C:
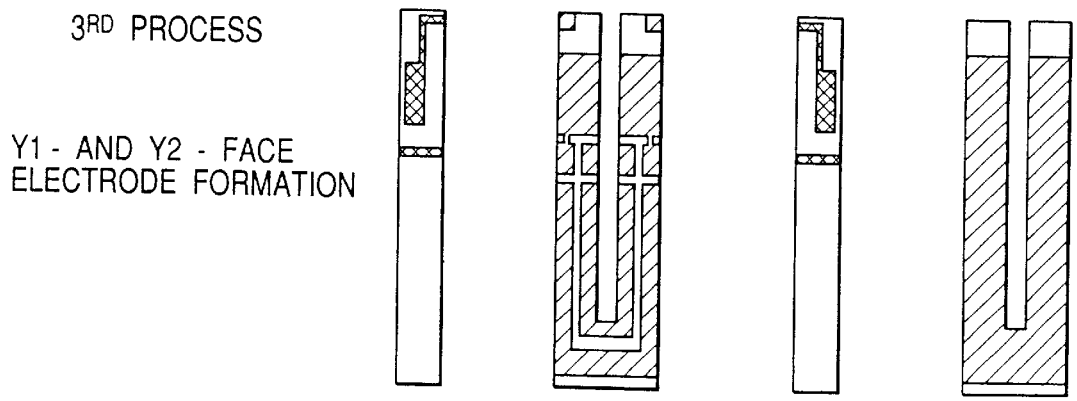

After finishing the second process for polarizing the piezoelectric body, a third process for forming the electrodes on the side facs Y1 and Y2 of the piezoelectric body is performed as shown in FIG. 7C. More specifically, the sensing electrodes 122a, 122b, short-circuit electrodes 128a, 128b and lead electrodes 130a, 130b are formed on the side faces Y1 and Y2. An appropriate low-temperature hardening type conductive resin, such as a polymer conductive paste, can be applied or printed on the side faces Y1 and Y2 for forming a pattern of the sensing electrodes 122a, 122b, short-circuit electrodes 128a, 128b and lead electrodes 130a, 130b. The polymer conductive paste is sintered at a predetermined temperature (e.g., 150° C.) sufficiently lower than the Curie temperature of the piezoelectric body.

Next, the fabricated vibrator 102 is bonded on a base 132b of a supporter 132 by an appropriate adhesive, such as epoxy adhesive, as shown in FIG. 5. The supporter 132 is configured into a laid H-shaped body with an upper platform serving as the base 132b horizontally extending for supporting the bottom face of the connecting bar 108 of the vibrator 102. The supporter 132 has a lower elongated foot 132c whose rear face is bonded via a spacer 134 to a front face of a base plate 136 by bonding or welding. Thus, the vibrator 102 stands on the supporter 132 and is held in a cantilever fashion in such a manner that the rear face X2 of the vibrator 102 confronts in parallel with the front face of the base plate 136.

The supporter 132 further comprises a neck 132a, serving as a vibration absorber like a torsion beam, which vertically extends for integrally connecting the base 132b and the foot 132c. The supporter 132 is made of an appropriate metal material, such as 42N, which is processible into the H-shaped configuration.

The base plate 136 is directly secured to a casing of an angular velocity sensor or a vehicle body, or indirectly via a vibrationproof rubber. A total of eight terminals T1–T8 are provided on the base plate 136 for the drive electrodes 112a, 112b, monitor electrodes 114a, 114b, front provisional ground electrodes 116, 116b, and pad electrodes 120a, 120b. These terminals T1–T8 are separated into two, right and left, vertical rows arranged symmetrically about the vertical center axis (i.e., Z-axis) of the vibrator 102.

These terminals T1–T8, serving as relays, are interposed between the above-described electrodes and a drive/sensing circuit (not shown). Metallic wires W1–W8 straddle, by wire bonding, for electric connection between terminals T1–T8 and their corresponding electrodes. The base plate 136 is electrically insulated from these terminals T1–T8.

The above-described angular velocity sensor of the second embodiment operates to detect an angular velocity. For this operation, the front provisional ground electrode 116a, 116b, polarizing electrodes 118a, 118b and rear provisional ground electrode 124 have a reference potential via the terminals T5 and T6. The drive electrodes 112a and 112b receive AC drive signals from the terminals T1 and T2, respectively. The entered drive signals are mutually phase shifted by 180°, and each causes a cyclic change centered at the reference potential and varying in both positive and negative directions. The frequency of each drive signal is equal to a resonant frequency of the vibrator 102 in the drive axis direction (i.e., Y-axis shown in FIG. 5). The drive axis coincides with a direction along which the left arm bar 104 and the right arm bar 106 are arrayed. The reference potential may be set to an earth (ground) potential, or may be biased so as to maintain it to a constant potential such as 2.5 V.

As a result, AC voltages having mutually reversed phases are applied between the drive electrodes 112a, 112b on the front face X1 and the rear provisional ground electrode 124 on the rear face X2. The arm bars 104 and 106 resonate in the drive axis (i.e., Y-axis) direction. During the drive operation, current flows between the monitor electrode 114a and the rear provisional ground electrode 124. This current is monitored as an output obtained through the terminal T3. In the same manner, current flows between the other monitor electrode 114b and the rear provisional ground electrode 124. This current is monitored as an output obtained through the terminal T4. Each drive signal is feedback controlled based on the monitored value so as to stabilize the amplitude of each arm bar 104, 106 in the Y-axis direction irrespective of any temperature change.

Next, under such a controlled self-excited oscillating condition, the vibrator 102 may be subjected to an angular velocity Ω entered about the vertical center axis (i.e., Z axis) of each arm bar 104, 106. This angular velocity Ω induces a Coriolis force which vibrates the arm bars 104 and 106 in the X-axis direction (i.e., sensing axis direction) which is normal to the front face X1 and the rear face X2.

An X-axis component of the caused vibration in each arm bar 104, 106 is proportional to current flowing across the sensing electrode 122a or 122b and the rear provisional ground electrode 124. The current value is detectable as an output signal via the terminal T7 or T8 connected to the sensing electrode 122a or 122b.

Each output current value is converted into a voltage signal by an appropriate current-voltage conversion circuit. Each converted voltage signal is amplified through a differential amplifier, and produced as a voltage signal corresponding to an amplitude component of the sensed resonance mode of each arm bar 104, 106. The produced signal is taken out as a sensing signal representing the angular velocity with respect to the Z axis.

As explained in the foregoing description, the second embodiment of the present invention provides a manufacturing method for a tuning fork vibrator. Electrodes are formed on the front and rear faces (X1, X2) of the piezoelectric body serving as a main body of the vibrator 102. A polarizing voltage is applied between the front and rear electrodes thus formed, to uniformly polarize the piezoelectric body in a predetermined direction (e.g., from the front face X1 to the rear face X2 in this embodiment). Hence, according to the second embodiment, no residual stress is caused in the piezoelectric body. The undesirable dispersion in the vibration characteristics is suppressed. An appropriate accuracy is maintained for the angular velocity detection. The piezoelectric characteristics can be properly maintained against the aging of the piezoelectric body. An appropriate reliability can be maintained.

Furthermore, a metallic deposition is used for forming the electrodes on the side faces (Y1, Y2) in the above-described third process.

The second embodiment is not limited to the above-described one and can be modified in the following manner.

Figure 8A:
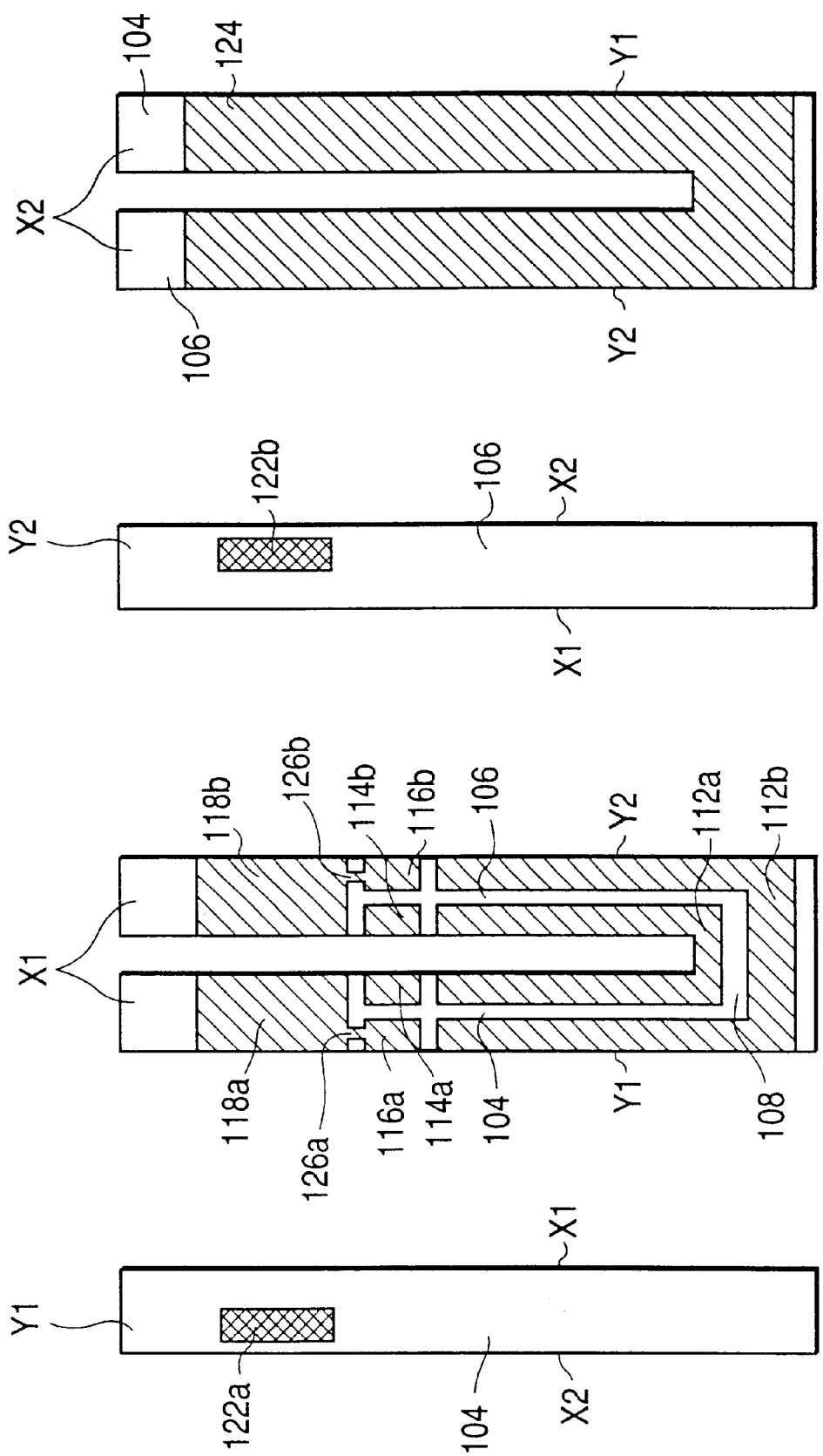
FIGS. 8A and 8B are views each corresponding to FIGS. 6A–6D and showing a modified electrode arrangement in accordance with the second embodiment of the present invention.

FIG. 8A shows a modified second embodiment which differs from the above-described second embodiment of FIGS. 6A–6D in that pad electrodes 120a, 120b, the lead electrodes 130a, 130b and the short-circuit electrodes 128a and 128b are omitted.

Figure 8B:
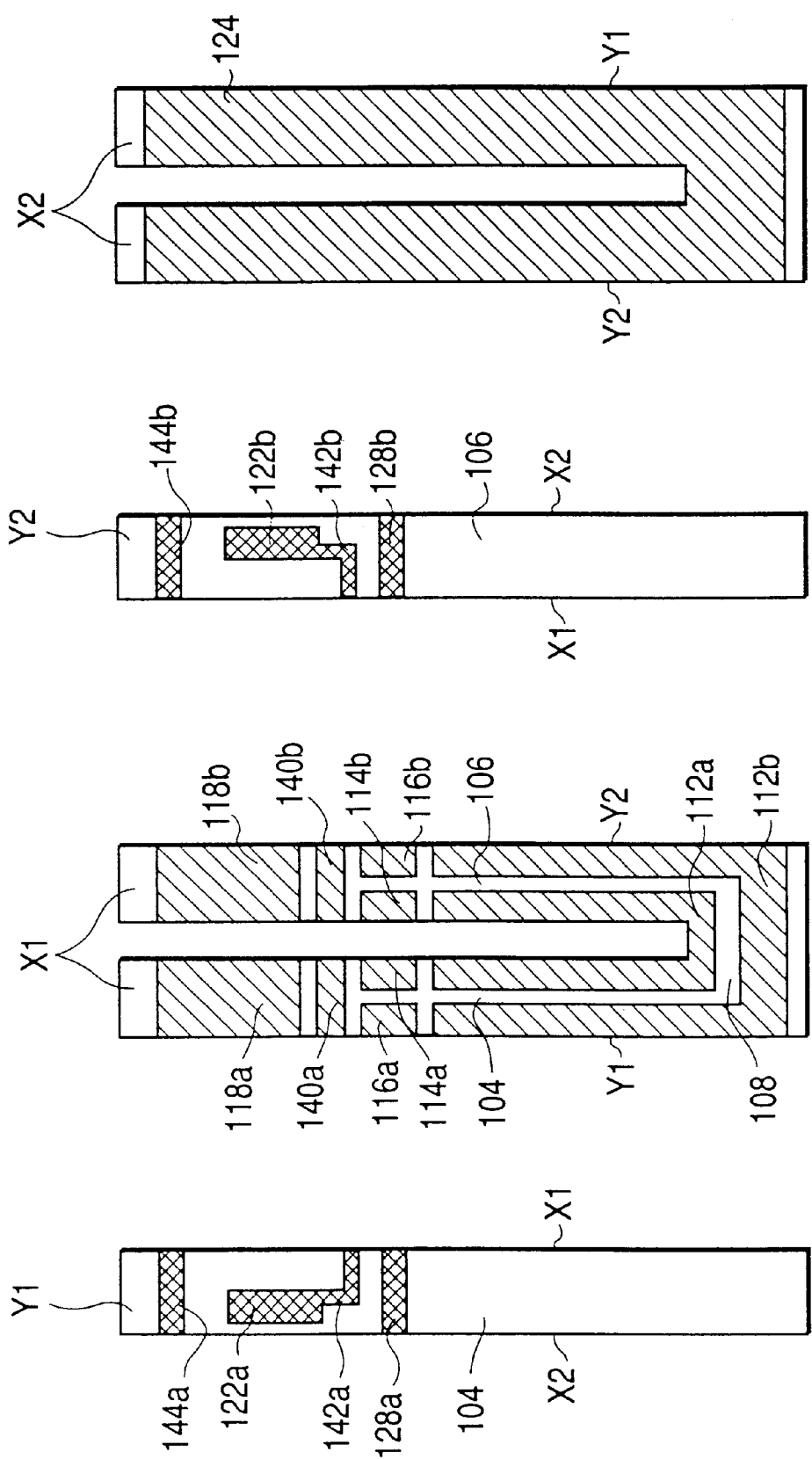

FIG. 8B shows another modified second embodiment which differs from the above-described second embodiment of FIGS. 6A–6D in that pad electrodes 140a and 140b are provided closer to the connecting bar 108 than the polarizing electrodes 118a, 118b. Namely, the pad electrodes 140a and 140b are interposed between the polarizing electrodes 118a, 118b and the monitor and provisional ground electrodes 114a, 114b, 116a, 116b. The pad electrodes 140a and 140b are integral with the sensing electrodes 122a and 122b via lead electrodes 142a and 142b, respectively.

The polarizing electrodes 118a, 118b on the front face X1 and the rear provisional ground electrode 124 on the rear face X2 have a reference potential via the wires W5 and W6 connected to the front provisional ground electrodes 116a and 116b. For realizing this arrangement, short-circuit electrodes 144a and 144b are formed on the side faces Y1 and Y2. According to this modified embodiment, it is preferable that the short-circuit electrodes 144a and 144b are fabricated together with the sensing electrodes 122a, 122b and the short-circuit electrodes 128a, 128b on the side faces Y1, Y2 of the piezoelectric body in the same fabricating process (i.e., above-described third process).

Figure 9A:
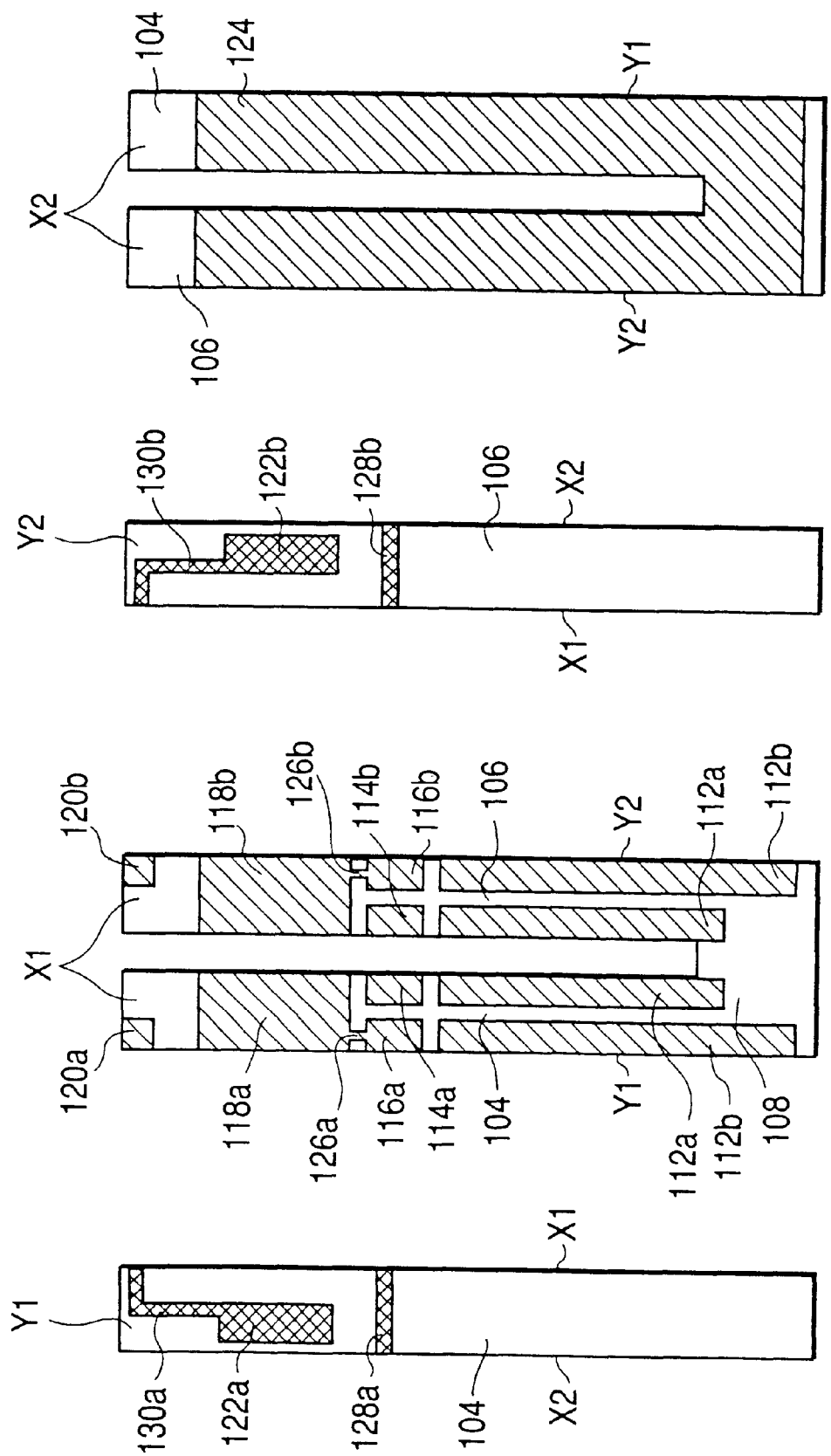
FIGS. 9A and 9B are views each corresponding to FIGS. 6A–6D and showing another modified electrode arrangement in accordance with the second embodiment of the present invention.

FIG. 9A shows still another modified second embodiment. This modified embodiment is characterized in that the inside and outside drive electrodes 112a and 112b are not provided in the region of the connecting bar 108. In other words, the inside and outside drive electrodes 112a and 112b extend straight in the Z-axis direction in the regions of the arm bars 104 and 106.

Figure 9B:
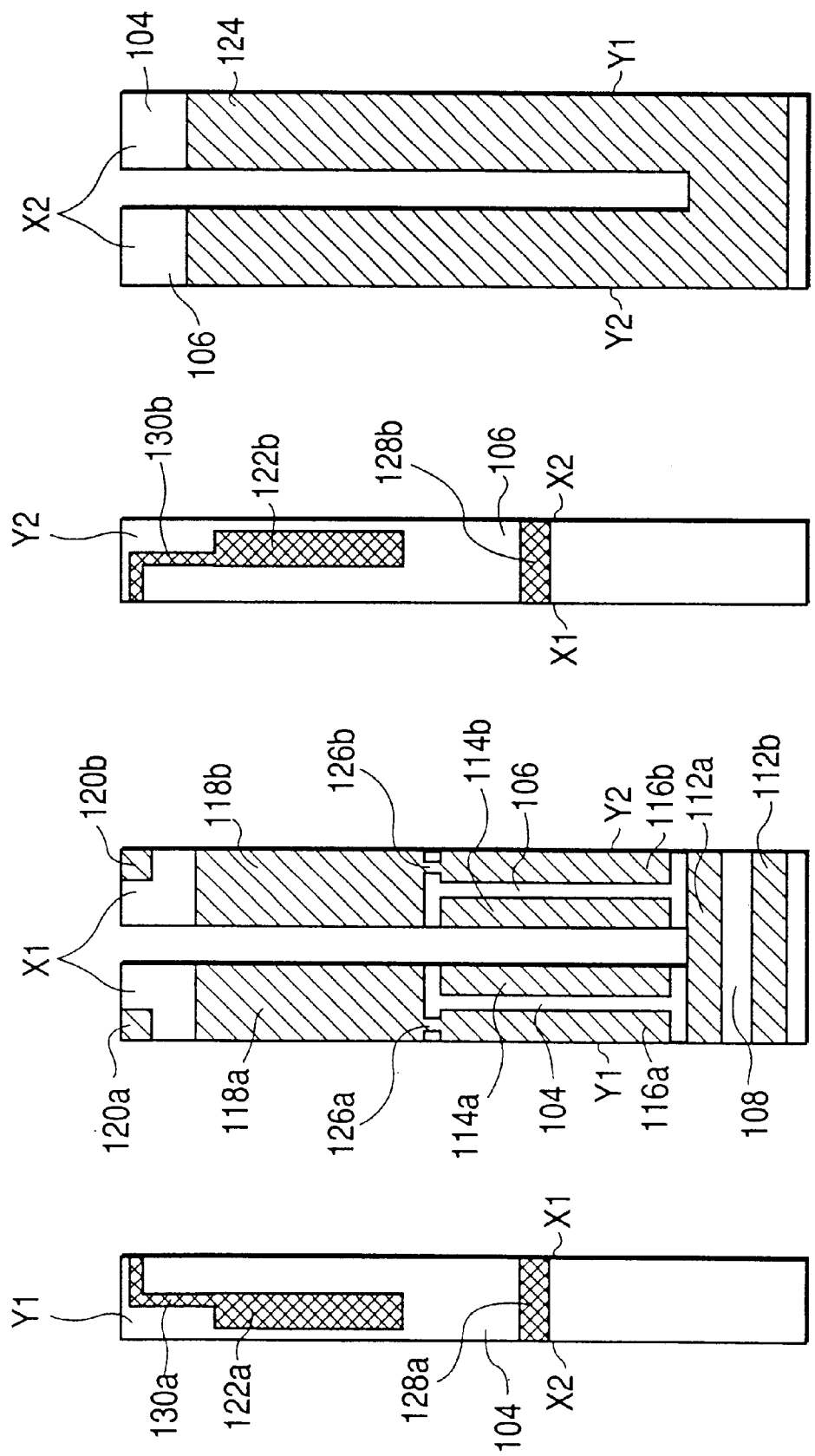

FIG. 9B shows yet another modified second embodiment. This modified embodiment is characterized in that the inside and outside drive electrodes 112a and 112b are chiefly provided in the region of the connecting bar 108 so as to extend straight in the Y-axis direction. In this modified embodiment, the monitor electrodes 114a, 114b and the front provisional ground electrodes 116a, 116b extend in the vertical direction between the drive electrodes 112a, 112b and the sensing electrodes 118a, 118b.

Needless to say, the modified drive electrodes 112a and 112b shown in FIGS. 9A and 9B can be applied to the vibrator 102 shown in FIGS. 4A and 4B.

The piezoelectric vibrator 102 and the metallic supporter 132 can be replaced by a single piezoelectric body, consisting of a vibrator portion and a supporter portion which are integral each other, which can be directly bonded to the base plate 136.

Third Embodiment

An overall arrangement of an angular velocity sensor in accordance with a third embodiment of the present invention will be explained with reference to FIGS. 10 through 12. The angular velocity sensor of this embodiment will be, for example, incorporated into a vehicle motion/behavior control system installed in an automotive vehicle for preventing a vehicle body from causing side slips and spinning motions.

The angular velocity sensor of the third embodiment comprises a vibrator 201 configured into a tuning fork having an U-shaped bar with one closed base end (i.e., a connecting bar 206) and bifurcated distal ends (i.e., a left arm bar 204 and a right arm bar 205). Various electrodes are provided on an outer surface of the vibrator 201. A base plate 202 is disposed in a confronting relationship with the vibrator 201. The vibrator 201 is secured at its base end to the base plate 202 via the supporter 203. The angular velocity sensor is associated with an appropriate drive/sensing circuit (not shown) which causes the vibrator 201 to vibrate and detects an angular velocity $\Omega$ appearing with respect to the vertical axis of the vibrator (i.e., a Z axis shown in FIG. 10).

As shown in FIGS. 10 and 11A–11D, the vibrator 201 comprises a pair of left and right arm bars 204 and 205 and the connecting bar 206 integrally connecting the base ends of these left and right arm bars 204 and 205. Each of the left and right arm bars 204, 205 and connecting bar 206 is formed into a right rectangular prism. The vibrator 201 is made of a piezoelectric body, such as a ceranmic piezoelectric body or a crystal. This embodiment uses PZT, which is one of ceramic piezoelectric members, because of preferable polarization being flexibly adjustable as well as easiness in manufacturing.

The vibrator 201 has a U-shaped flush front face X1 as shown in FIG. 11A, a U-shaped flush rear face X2 as shown in FIG. 1D, and outer side faces Y1 and Y2 as shown in FIGS. 11B and 11C. The vibrator 201 has a thickness of 2.17 mm which is a distance between the front and rear faces X1 and X2. Each of left and right arm bars 204 and 205 has a width of 2 mm. A distance (i.e., a width of a slit groove) between these arm bars 204 and 205 is 0.6 mm. An overall width of the tuning fork is 4.6 mm which is a distance between the outer side faces Y1 and Y2 of respective arm bars 204 and 205.

The vibrator 201 has a height of 20 mm which is a distance from the distal (top) end of each arm bar 204, 205 to a bottom face of the connecting bar 206. The bottom face of the connecting bar 206 is bonded to the supporter 203. The slit groove has a vertical (longitudinal) length of 17 mm.

The base plate 202 is parallel to the rear face X2 of the vibrator 201. The vibrator 201 is secured to the base plate 202 via the supporter 203. This base plate 202 is installed on a predetermined installation portion via an appropriate fixing member.

Figure 10:
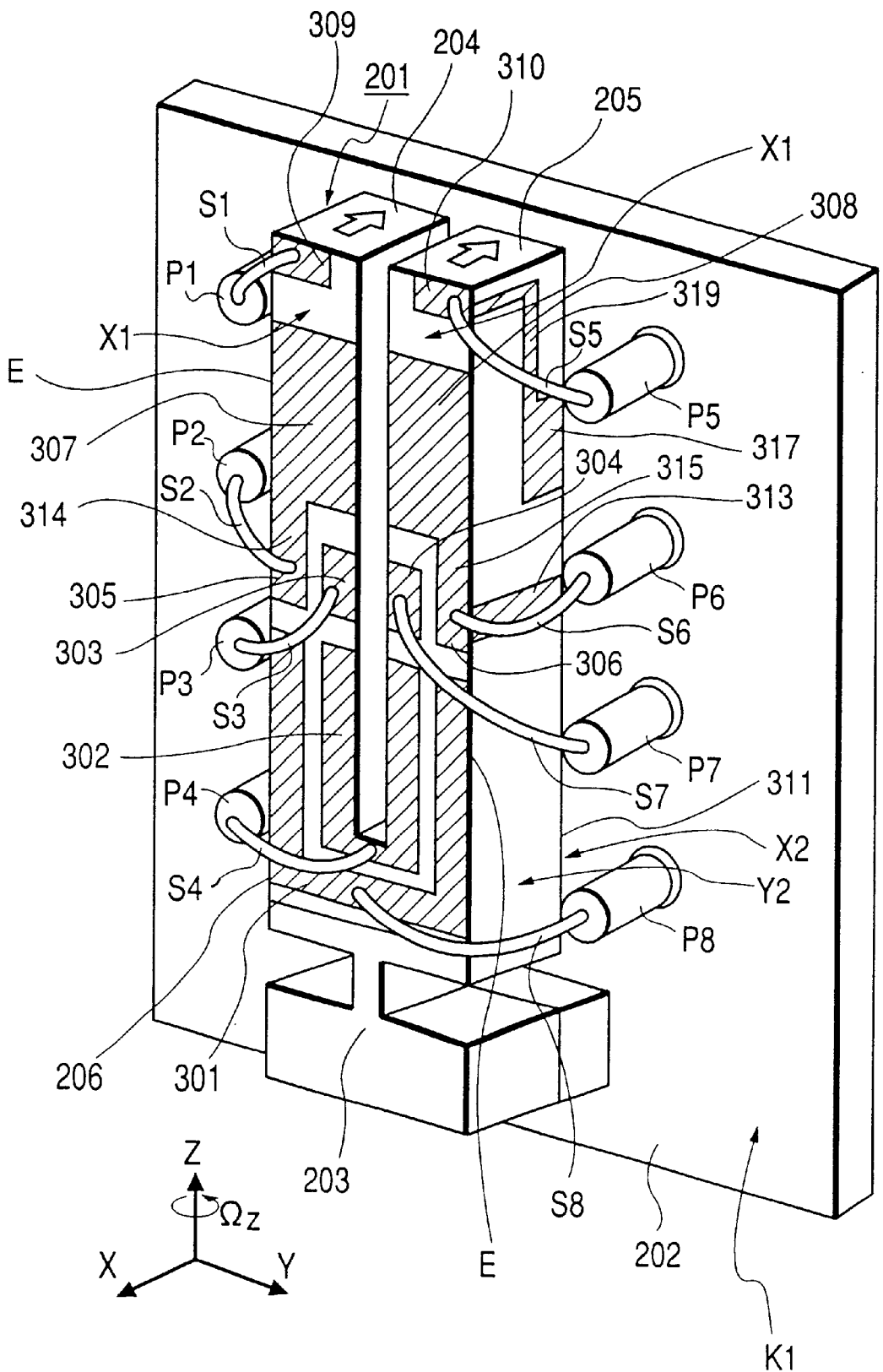
FIG. 10 is a perspective view showing an overall arrangement of an angular velocity sensor in accordance with a third embodiment of the present invention.
Figure 11:
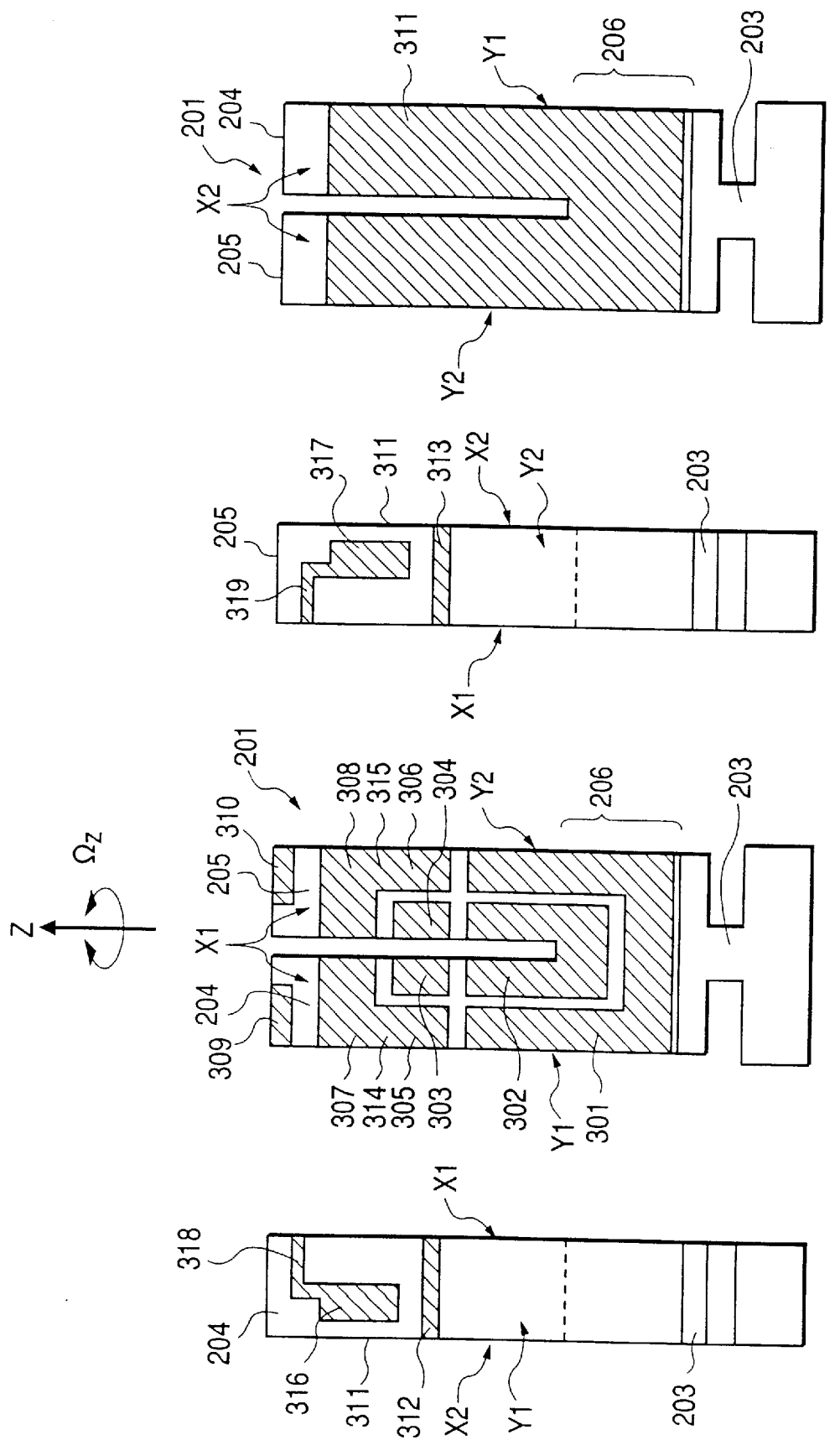
FIGS. 11A to 11D are views showing electrodes formed on respective faces of a vibrator shown in FIG. 10.
Figure 12:
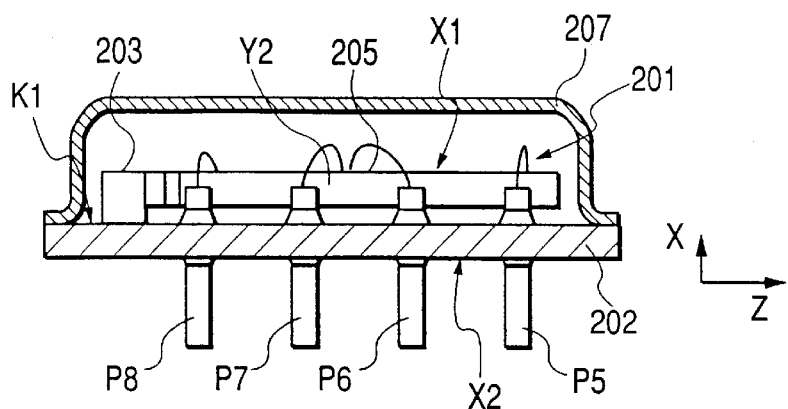
FIG. 12 is a cross-sectional side view showing a casing structure of the angular velocity sensor in accordance with the third embodiment of the present invention.

As shown in FIGS. 10 and 12, the base plate 202 has a face K1 confronting with the rear face X2 of the vibrator 201. A total of pin-like eight terminals P1–P8 are securely fixed in through holes of the base plate 202. Each terminal is insulated from the base plate 202 by a hermetic seal applied to the through hole.

The terminals P1–P8 are electrically connected to the above-described drive/sensing circuit (not shown) at a behind face opposing to the face K1 of the base plate 202. The terminals P1–P8 are provided for electrical connections between the electrodes formed on the faces of the vibrator 201 and the drive/sensing circuit.

As shown in FIG. 12, a cover plate (i.e., shell) 207 is attached to an outer periphery of the face K1, so as to cover all of the vibrator 201, supporter 203, base plate 202 and terminals P1–P8. An inside space defined by the cover plate 207 and the base plate 202 is maintained hermetically by a hermetic seal applied between the cover plate 207 and the base plate 202.

Various electrodes formed on the faces of the vibrator 201 will be explained hereinafter with reference to FIGS. 11A–11D.

As shown in FIG. 11A, the vibrator 201 has parallel drive electrodes 301 and 302 formed on the U-shaped flush front face X1 of the piezoelectric body. The drive electrodes 301 and 302 are symmetrically with respect to a vertical or longitudinal center axis (i.e., Z-axis) of the vibrator 201. The parallel drive electrodes 301 and 302 extend along the longitudinal (i.e., lateral) direction of the connecting bar 206 and then turn perpendicularly (i.e., upward in FIG. 10) to extend further in parallel with each other along the front face X1 of the arm bars 204 and 205. Thus, the parallel drive electrodes 301 and 302, each being formed into a U-shaped configuration, bridge the connecting bar 206 and respective arm bars 204 and 205. The upper ends of the drive electrodes 301 and 302 are positioned at the same height of respective arm bars 204 and 205.

The drive electrode 301, referred to as outside drive electrode 301, extends along an outside periphery of the U-shaped front face X1. The other drive electrode 302, referred to as inside drive electrode 302, extends along an inside periphery of the U-shaped front face X1.

Monitor electrodes 303, 304 and outlet electrodes 305, 306 are provided next to the drive electrodes 302 and 301 at portions far from the connecting bar 206 (i.e., closer to the remote ends of respective arm bars 204 and 205 than the drive electrodes 302 and 301). One monitor electrode 303, provided on the left arm bar 204, is continuous from a left upper end of the inside drive electrode 302 but spaced with a predetermined clearance. The other monitor electrode 304, provided on the right arm bar 205, is continuous from a right upper end of the inside drive electrode 302 but spaced with a predetermined clearance. One outlet electrode 305, provided on the left arm bar 204, is continuous from a left upper end of the outside drive electrode 301 but spaced with a predetermined clearance. The other outlet electrode 306, provided on the right arm bar 205, is continuous from a right upper end of the outside drive electrode 301 but spaced with a predetermined clearance. The lower ends of the monitor electrodes 303, 304 are positioned at the same height as those of the outlet electrodes 305, 306. The monitor electrodes 303 and 304 have the same vertical (longitudinal) length.

Polarizing electrodes 307 and 308 are provided next to the monitor electrodes 303 and 304 with predetermined clearances, i.e., at portions more far from the connecting bar 206. The polarizing electrodes 307 and 308 are more closer to the remote ends of respective arm bars 204 and 205 than the monitor electrodes 303 and 304. The outlet electrodes 305 and 306 are integrally connected to the polarizing electrodes 307 and 308 via short-circuit electrodes 314 and 315, respectively. The outlet electrodes 305 and 306 are same in size and altitudinal position with the monitor electrodes 303 and 304. The short-circuit electrodes 314 and 315 are same in lateral width with the corresponding outlet electrodes 305 and 306, and are same in height with the corresponding clearances between the monitor electrodes 303, 304 and the polarizing electrodes 307, 308.

The polarizing electrodes 307 and 308 are located at the same height with a same vertical (longitudinal) length. The polarizing electrodes 307 and 308 extend laterally across the front face X1 of the arm bars 204 and 205. Thus, the lateral width of each polarizing electrode 307, 308 is identical with the lateral width of the corresponding arm bar portion of the front face X1.

Pad sensing electrodes 309 and 310 are provided at the remotest ends on the front face X1 of the arm bars 204 and 205, respectively. Detection signals are taken out from the pad sensing electrodes 309 and 310 thus provided.

The U-shaped flush rear face X2 of the vibrator 201 is completely the same in configuration as the front face X1.

The front and rear faces X1 and X2 are parallel. On the rear face X2, a U-shaped common electrode 311 is provided at a region corresponding or facing to the above-described drive electrodes 301, 302, monitor electrodes 303, 304, outlet electrodes 305, 306 and polarizing electrodes 307, 308, as shown in FIG. 11D.

The left arm bar 204 has an outer side face Y1 provided with a short-circuit electrode 312 at an altitudinal position corresponding to the outlet electrode 305 and an angular velocity sensing electrode 316 at an altitudinal position corresponding to the polarizing electrode 307, as shown in FIG. 11B. The right arm bar 205 has an outer side face Y2 provided with another short-circuit electrode 313 at an altitudinal position corresponding to the other outlet electrode 306 and another angular velocity sensing electrode 317 at an altitudinal position corresponding to the other polarizing electrode 308, as shown in FIG. 11C. The short-circuit electrodes 312 and 313 electrically connect the common electrode 311 to the outlet electrodes 305 and 306, respectively.

The angular velocity sensing electrodes 316 and 317, formed on the side faces Y1 and Y2, are laterally offset adjacent to the rear face X2 but completely isolated from all of polazizing electrodes 307 and 308, outlet electrodes 305 and 306, short-circuit electrodes 314 and 315, and common electrode 311.

The angular velocity sensing electrodes 316 and 317 are integral with the pad sensing electrodes 309 and 310 via lead electrodes 318 and 319, respectively. The lead electrodes 318 and 319 extend upward from the angular velocity sensing electrodes 316 and 317, and turn perpendicular toward the pad sensing electrodes 309 and 310, and then continuously connected to the pad sensing electrodes 309 and 310 along corner ridgelines E, respectively.

All of the electrodes formed on respective faces of the vibrator 201 are symmetrically arranged with respect to the vertical or longitudinal center axis (i.e., Z-axis) of the vibrator 201.

Each of the pad sensing electrodes 309 and 310 has a widened area so that the ultrasonic wire bonding can be easily performed for later-described lead wires S1–S8.

In the electrode arrangement shown in FIGS. 10 and 11A–11D, the common electrode 111 serves as a reference electrode having a predetermined reference potential against the drive electrodes 301, 302, monitor electrodes 303, 304, pad sensing electrodes 309, 310, and the angular velocity sensing electrodes 316, 317.

Each of the arm bars 204 and 205 and the connecting bar 206 is polarized in a X-axis direction (i.e., from the front face X1 to the rear face X2) as shown by a white bold arrow in FIG. 10. The polarization processing is performed by applying a predetermined DC voltage between the electrodes formed on the front face X1 and the common electrode 311 formed on the rear face X2. The short-circuit electrodes 312, 313, angular velocity sensing electrodes 316, 317, and lead electrodes 318, 319 are formed on the side faces Y1 and Y2 after finishing the polarization processing.

The remotest end of each arm bar 204, 205 is subjected to a maximum amplitude of the vibration caused by the vibrator 201. The reason why the pad sensing electrodes 309 and 310 are formed at the remotest ends of respective arm bars 204 and 205 will be explained hereinafter.

The vibrator 201 is a dielectric body made of a PZT cerarnics, and is therefore electrostatically coupled with each electrode formed on the faces of the vibrator 201. In other words, it is assumed that a capacitor is interposed between the vibrator 201 and each electrode. Providing the drive electrodes 301 and 302 adjacent to the pad sensing electrodes 309 and 310 is not preferable, because the pad sensing electrodes 309 and 310 may erroneously detect noises derived from the AC voltage applied to these drive electrodes. This will deteriorate the sensor performance. Enlarging the distance between the drive electrodes 301 and 302 and the pad sensing electrodes 309 and 310 is effective to reduce such undesirable noises.

In determining an optimum position for the drive electrodes 301 and 302, the inventors of the present invention considered the fact that a large amplitude is obtained at a low voltage when the drive electrodes 301 and 302 are formed at the connecting bar 206. Thus, the position for the pad sensing electrodes 309 and 310 is limited to the distal end sides of respective arm bars 204 and 205.

The electrodes formed on the surfaces of the vibrator 201 are connected to the terminals P1–P8 via lead wires S1–S8 by an ultrasonic wire bonding method. Each of lead wires SI -S8 is an alminum wire having a diameter (=φ) of 30 μm. The terminals P1–P8 are fixed on the base plate 202, but are electrically insulated from the base plate 202.

The base plate 202 is directly secured to a casing of an angular velocity sensor or a vehicle body, or indirectly via a vibrationproof rubber. The eight terminals P1–P8 are provided on the base plate 220 for the drive electrodes 301, 302, monitor electrodes 303, 304, outlet electrodes 305, 306, and pad sensing electrodes 309, 310. These terminals P1–P8 are separated into two, right and left, vertical rows arranged symmetrically about the vertical center axis (i.e., Z-axis) of the vibrator 201.

These terminals P1–P8, serving as relays, are interposed between the above-described electrodes and a drive/sensing circuit (not shown). The drive/sensing circuit comprises a first input circuit for receiving monitor signals from the monitor electrodes 303 and 304, and a second input circuit for receiving sensing signals from the angular velocity sensing electrodes 316 and 317 via the pad sensing electrodes 309 and 310. Furthermore, the drive/sensing circuit comprises a self-excited oscillation circuit serving as a drive means for applying a drive signal (i.e., AC voltage) between the drive electrodes 301, 302 and the common electrode 311 based on the monitor signal (as a reference signal). Furthermore, the drive/sensing circuit comprises a detecting circuit serving as a detecting means for detecting an angular velocity Ωz appearing with respect to the Z axis based on the monitor signals and the sensing signals.

The above-described angular velocity sensor of the third embodiment operates to detect an angular velocity. For this operation, the common electrode 311, outlet electrodes 305, 306, polarizing electrodes 307, 308, short-circuit electrodes 314, 315, and short-circuit electrodes 312, 313 have the reference potential via the terminals P2 and P6. The drive electrodes 301 and 302 receive AC drive signals from the terminals P4 and P8, respectively. The entered drive signals are mutually phase shifted by 180°, and each causes a cyclic change centered at the reference potential and varying in both positive and negative directions. The frequency of each drive signal is equal to a resonant frequency of the vibrator 201 in a drive axis direction (i.e., Y-axis shown in FIG. 10). The drive axis coincides with a direction along which the left arm bar 204 and the right arm bar 205 are arrayed.

As a result, AC voltages having mutually reversed phases are applied between the drive electrodes 301, 302 on the front face X1 and the common electrode 311 on the rear face X2. The arm bars 204 and 205 resonate in the Y-axis direction. During the drive operation, current flows between the monitor electrode 303 and the common electrode 311. This current is monitored as an output obtained through the terminal P3. In the same manner, current flows between the other monitor electrode 304 and the common electrode 311. This current is monitored as an output obtained through the terminal P7. Each drive signal is feedback controlled based on the monitored value so as to stabilize the amplitude of each arm bar 204, 205 in the Y-axis direction irrespective of any temperature change. This is referred to as a controlled self-excited oscillation.

Next, under such a controlled self-excited oscillating condition, the vibrator 201 may be subjected to an angular velocity Ωz entered about the vertical center axis (i.e., Z axis) of each arm bar 204, 205. This angular velocity Ωz induces a Coriolis force which vibrates the arm bars 204 and 205 in the X-axis direction (i.e., sensing axis direction) which is normal to the front face X1 and the rear face X2.

An X-axis component of the caused vibration in each arm bar 204, 205 is proportional to current flowing across the angular velocity sensing electrode 316 or 317 and the common electrode 311. The current value is detectable as an output signal via the terminal P1 or P5 connected to the pad sensing electrode 309 or 310.

Each output current value is converted into a voltage signal by an appropriate current-voltage conversion circuit. Each converted voltage signal is amplified through a differential amplifier, and produced as a voltage signal corresponding to an amplitude component of the sensed resonance mode of each arm bar 204, 205. The produced signal is taken out as a sensing signal representing the angular velocity Ωz with respect to the Z axis.

As described above, the third embodiment provides an arrangement for detecting an angular velocity signal. Causing a large amplitude in the driving operation of the vibrator 201 is desirable to obtain a large angular velocity output signal. However, an excessively large drive amplitude may cause a breakdown (deterioration) of the vibrator 201. In general, an increase of the drive voltage will require a complicated circuit. Thus, the drive amplitude of the vibrator 201 is set in a practically acceptable range.

Figure 13:
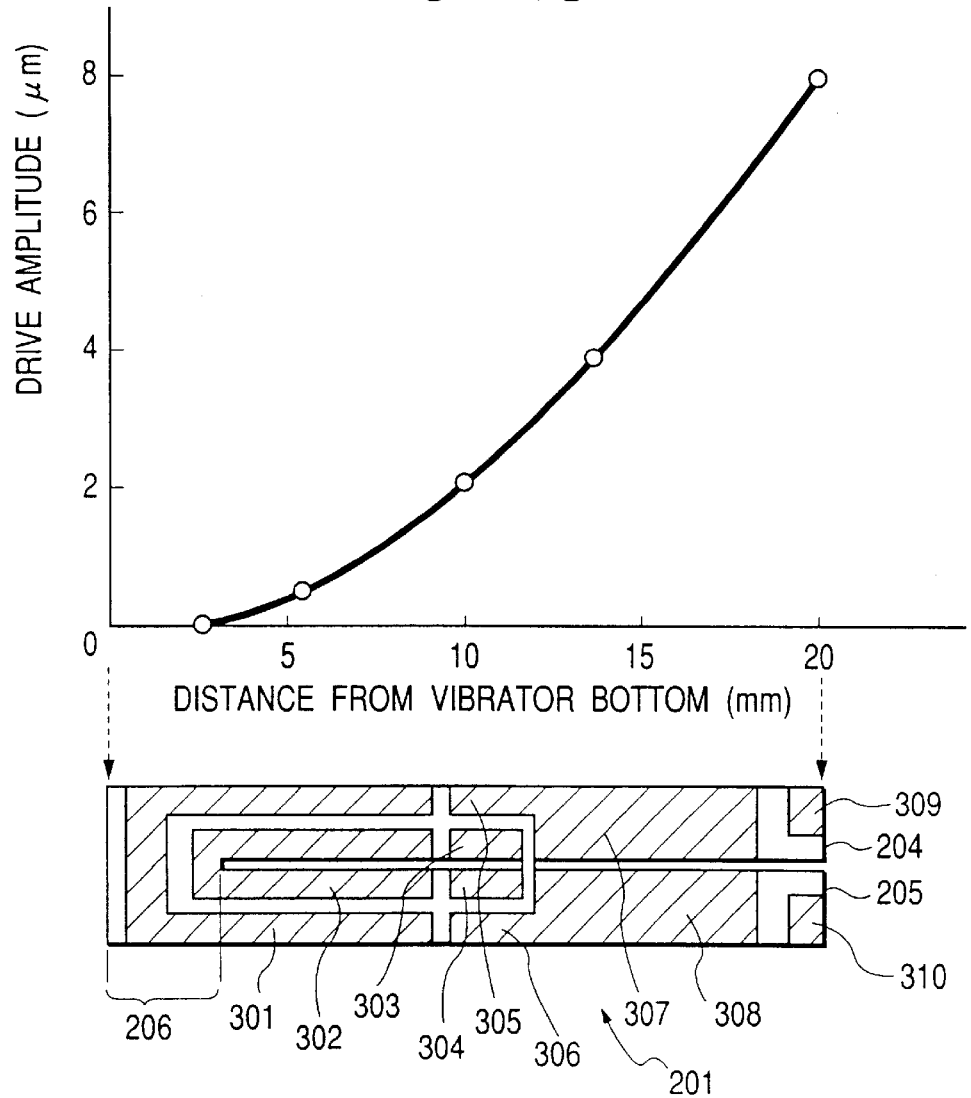
FIG. 13 is a graph and an associated view illustrating a vibrating condition of the angular velocity sensor in accordance with the third embodiment of the present invention.

The drive amplitude of the vibrator 201 is larger at each arm bar 204, 205 than at the connecting bar 206 and increases with increasing distance from the bottom face of the connecting bar 206. FIG. 13 shows drive amplitude data actually measured. The drive amplitude is small at the region of the drive electrodes 301 and 302 where the lead wires S4 and S8 are connected. The drive amplitude steeply increases with increasing distance from the bottom face of the vibrator 201. And, the drive amplitude is maximized at the region of the pad sensing electrodes 309 and 310 where the lead wires S1 and S5 are connected. According to this embodiment, it reaches approximately 8 μm.

Next, the reason why the lead wires S1–S8 are made of aluminum wires will be explained.

When a wire bonding is performed using a gold wire, a wire bonded body needs to be heated to a high temperature (e.g., 200 to 300° C.). The wire bonding operation is usually performed after finishing the polarization. Increasing the temperature to such a high temperature possibly deteriorates the polarization of the PZT ceramics. In other words, this will deteriorate the piezoelectric characteristics. This leads to a production of an angular velocity sensor unsatisfactory in its performances. In view of the foregoing, the inventors of the present invention decided to adopt the ultrasonic wire bonding method using an aluminum wire. Thus, it is preferable that each of lead wires S1–S8 contains aluminum as a chief component equal to or larger than 90%.

Figure 14A:
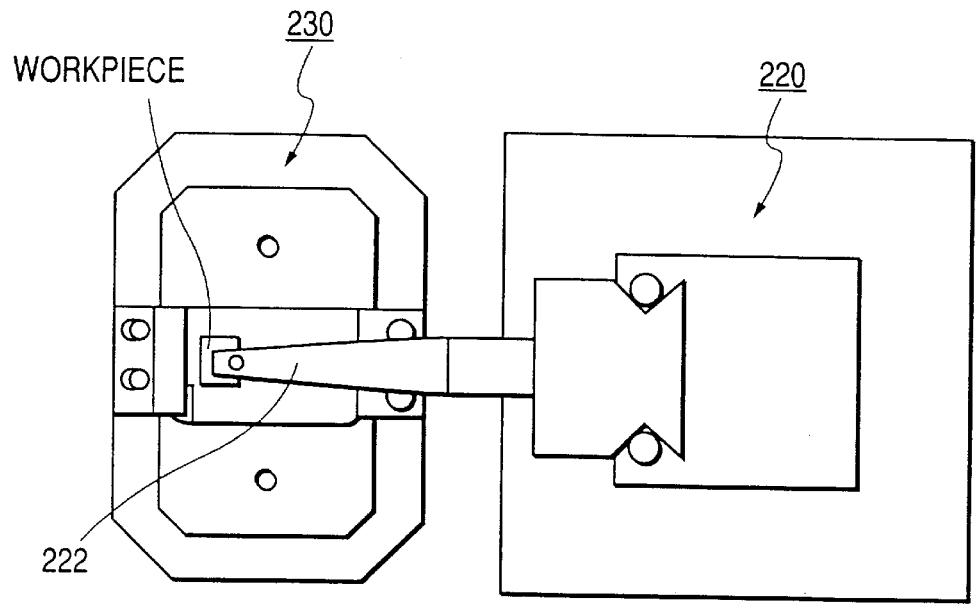
FIGS. 14A and 14B are plan and side views cooperatively showing an ultrasonic wire bonding apparatus used in the third embodiment.
Figure 14B:
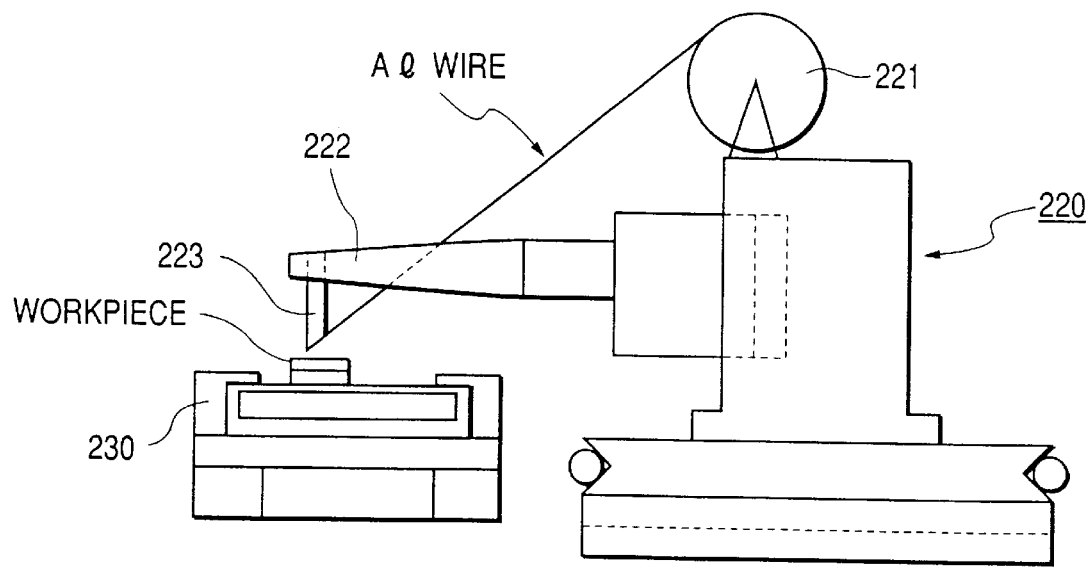

The ultrasonic wire bonding method using an aluminum wire will be explained hereinafter with reference to FIGS. 13, 14A and 14B. FIG. 14A is a plan view and FIG. 14B is a side view cooperatively showing an arrangement of the ultrasonic wire bonding apparatus used in this embodiment. This apparatus includes a bonding section 220 and a table 230. The bonding section 220 supplies an aluminum wire and performs a wire bonding. The vibrator 201 and the base plate 202, collectively referred to as a workpiece, are mounted on the table 230.

The bonding section 220 comprises a drum 221 winding an aluminum wire, a horn 222 shiftable in an up-and-down direction, and a tool 223 depressing the supplied wire onto the workpiece to perform a wire bonding operation. On the other hand, the table 230 is a rotary table which is not only rotatable about its axis but also linearly shiftable along a plane. An appropriate control unit (not shown), such as a microcomputer, is provided for controlling these bonding section 220 and table 230.

Figure 15:
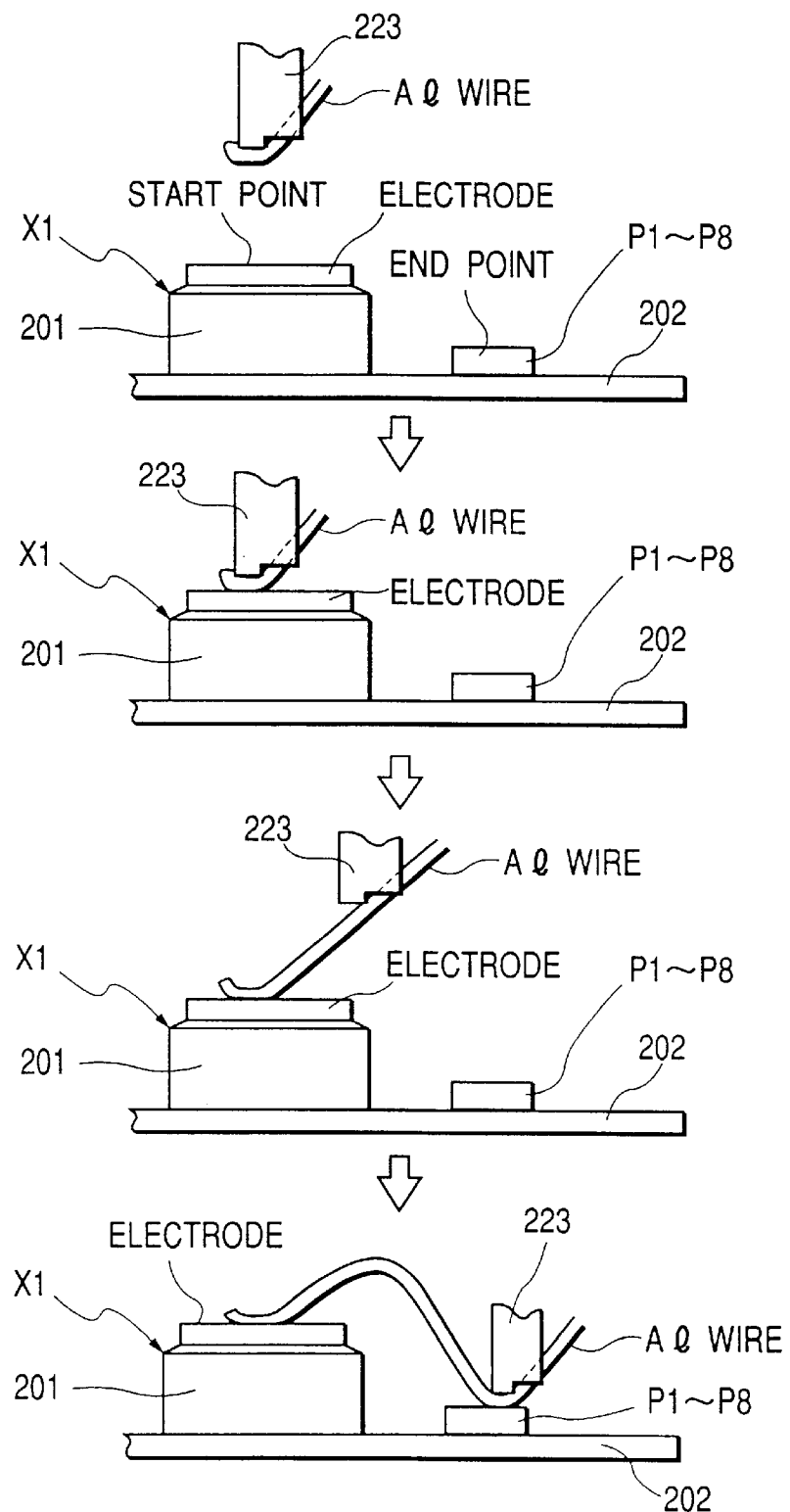
FIG. 15 is a view illustrating sequential steps of the ultrasonic wire bonding.

FIG. 15 is an illustration showing a series of ultrasonic wire bonding steps, sequentially advancing from top to bottom along each arrow. First, the table 230 shifts to a predetermined position where the tool 223 just positions above a starting point (i.e., a first bonding point) on the workpiece as shown in the uppermost view. In this case, the tool 223 is accompanied with an aluminum wire. According to this embodiment, the starting point is a predesignated bonding point of each lead wire on a corresponding electrode formed on the vibrator 201. Each electrode is made of an electrically conductive plate member, such as silver, having a thickness of approximately 10 $\mu$m.

Next, the aluminum wire is placed on the starting point of a selected electrode. A predetermined load is applied on the aluminum wire, while the workpiece is subjected to the ultrasonic vibration to connect the aluminum wire to the electrode. The application of the load is an essential requirement in the ultrasonic wire bonding. After finishing the connection of the aluminum wire onto the corresponding electrode, the tool 223 is raised upward to pull an appropriate length of aluminum wire out of the drum 221. Then, the table 230 shifts to a next position where the tool 223 just positions above an ending point (i.e., a second bonding point) on the workpiece. According to this embodiment, the ending point is a predesignated bonding point of this wire on a corresponding terminal P1–P8. The ultrasonic wire bonding is performed at the ending point in the same manner as at the starting point. After finishing the connection of the lead wire onto the terminal, an excessive aluminum wire-is cut off. In this manner, a sequential bonding operation for respective lead wires S1–S8 is accomplished to leave connected lead wires S1–S8 each straddling on the corresponding electrode and the associated terminal.

Next, the reason why the wire diameter of lead wires S1–S8 is set to $\phi$=30 $\mu$m will be explained. As described above, the wire bonding is performed under the application of an appropriate load (approximately 30 gf for a $\phi$=30 $\mu$m wire). The PZT ceramics vibrator 201 is bonded to the 42 alloy supporter 203 by epoxy adhesive. Through this connection, the vibrator 201 floats on the base plate 202. Thus, the supporter 203 supporting a center of the connecting bar 206 is securely welded to the base plate 202.

The supporter 203 is configured into a laid H-shaped body with an upper platform horizontally extending for supporting the bottom face of the connecting bar 206 of the vibrator 201. The supporter 203 has a lower elongated foot whose rear face is bonded to the reference face K1 of the base plate 202 by bonding or welding. Thus, the vibrator 201 stands on the supporter 203 and is held in a cantilever fashion. The rear face X2 of the vibrator 201 confronts in parallel with the reference face K1 of the base plate 202. The supporter 203 further comprises a neck, serving as a vibration absorber like a torsion beam, which extends vertically (i.e., in parallel to a longitudinal direction of each arm bar) for integrally connecting the platform and the foot. The supporter 203 is made of an appropriate metal material, such as 42N, which is processible into the H-shaped configuration.

Both the PZT ceramics and the epoxy adhesive are weak in strength. The PZT ceramics is supported to the base plate 202 in a cantilever fashion via the epoxy adhesive. When a wire bonding is performed on such weak members, the vibrator 201 or the adhesive portion may be damaged by a large load applied during the wire boding operation. The load required in the wire bonding is proportional to the diameter of the aluminum wire.

Figure 16:
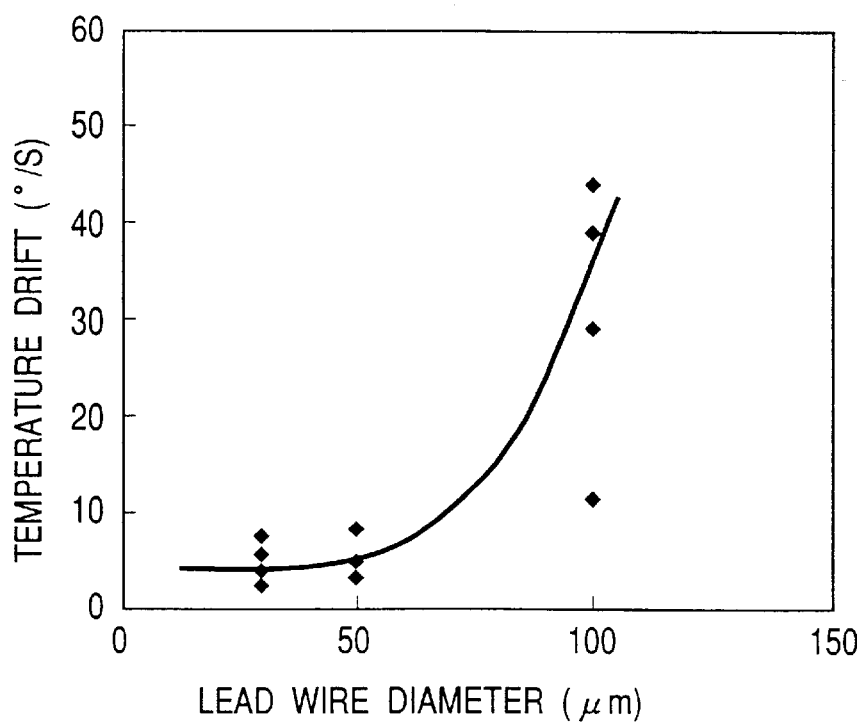
FIG. 16 is a graph showing a relationship between a wire diameter of a lead wire and a temperature drift in accordance with the third embodiment of the present invention.

When the diameter of the aluminum wire is large, the vibrator 201 cannot vibrate sufficiently. This results in serious deterioration in the performance of the angular velocity sensor. FIG. 16 is a graph showing a relationship between a lead wire diameter and a resulting temperature drift The temperature drift reflects an evaluation of the performance against a temperature change. More specifically, the evaluation is performed to check how a signal output (i.e., an offset voltage) changes in response to a variation of an ambient temperature under a condition where no angular velocity is added. When the output voltage causes a change in response to a temperature variation, this change is erroneously measured as if any angular velocity were entered.

Accordingly, the temperature drift reflects the performance of each sensor. An excellent sensor has a smaller temperature drift. In FIG. 16, the temperature drift is represented by a value converted into an angular velocity. Namely, a measured change in the output voltage is divided by a sensor sensitivity to an angular velocity. A resultant temperature drift value is expressed by the units of °/sec. According to the inventors of the present invention, an angular velocity sensor having a temperature drift equal to or smaller than 10°/sec is preferably employed in a vehicle body movement or behavior control system which normally requires high performance sensors.

To satisfy this requirement, it is preferable that the lead wire diameter is smaller than $\phi$=50 $\mu$m as apparent from the test data shown in FIG. 16. On the other hand, a minimum size of the lead wire must be determined considering the difficulty in processing or machining a thin lead wire. In view of the foregoing, it can be concluded that a practical size of the lead wire is in a range of $\phi$30 to 50 $\mu$m.

As explained above, according to this embodiment, the wire bonding operation of the lead wires S1–S8 is performed by using an aluminum wire having a diameter of $\phi$30 to 50 $\mu$m. Thus, it becomes possible to prevent the deterioration in the piezoelectric performance by the heat generated during the wire boding. There is no necessity of increasing the load applied to the lead wire during the wire bonding operation. No adverse influence is given to the temperature drift performance.

Figure 17A:
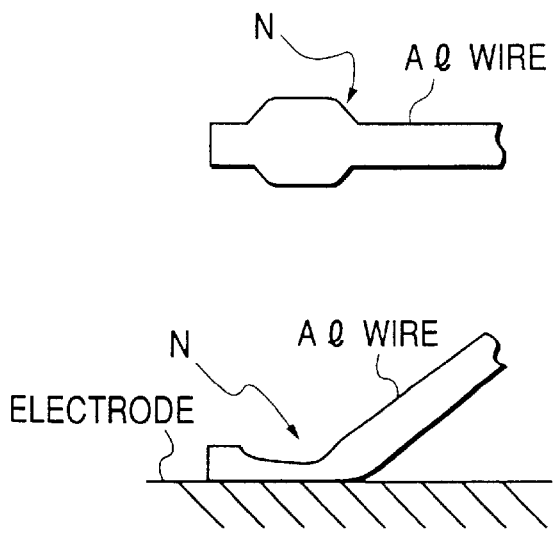
FIGS. 17A and 17B are enlarged views illustrating detailed connections of an aluminum wire (by ultrasonic wire bonding) and a gold wire (by thermal wire bonding)

Next, a connection of respective lead wires S1–S8 will be explained in more detail. FIG. 17A shows an aluminum wire connected to a starting point on each electrode. FIG. 17A comprises a plan view (upside) and a side view (downside).

A flattened portion of the aluminun wire is formed when a load is applied on the aluminum wire during an application of ultrasonic vibration. In general, forming such a flattened portion is not desirable because a weak portion, referred to as a neck portion N, is formed between the flattened portion and an original aluminum wire portion.

When the vibrator 201 vibrates, the neck portion N is subjected to a repetitive stress (i.e., distortion $\in$). Receiving such a stress repetitively for a long time will induce a serious metallic fatigue.

Figure 17B:
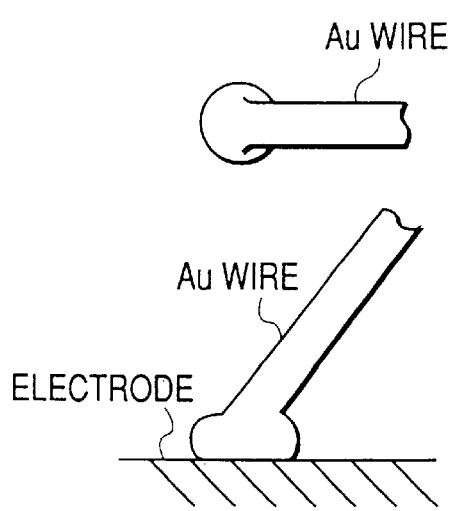

FIG. 17B shows a comparative connection of a gold wire. A ball, formed at the front end of the gold wire by discharge, is connected to an electrode under an application of ultrasonic vibration. In this case, no neck portion is formed. But, the bonding portion must be heated to a high temperature. This is therefore not applicable to the PZT ceramics.

In view of the foregoing, this embodiment provides an excellent wire bonding arrangement for the lead wires S1–S8 having the neck portion N, so that a sufficient durability can be maintained against the distortion $\in$.

Figure 18:
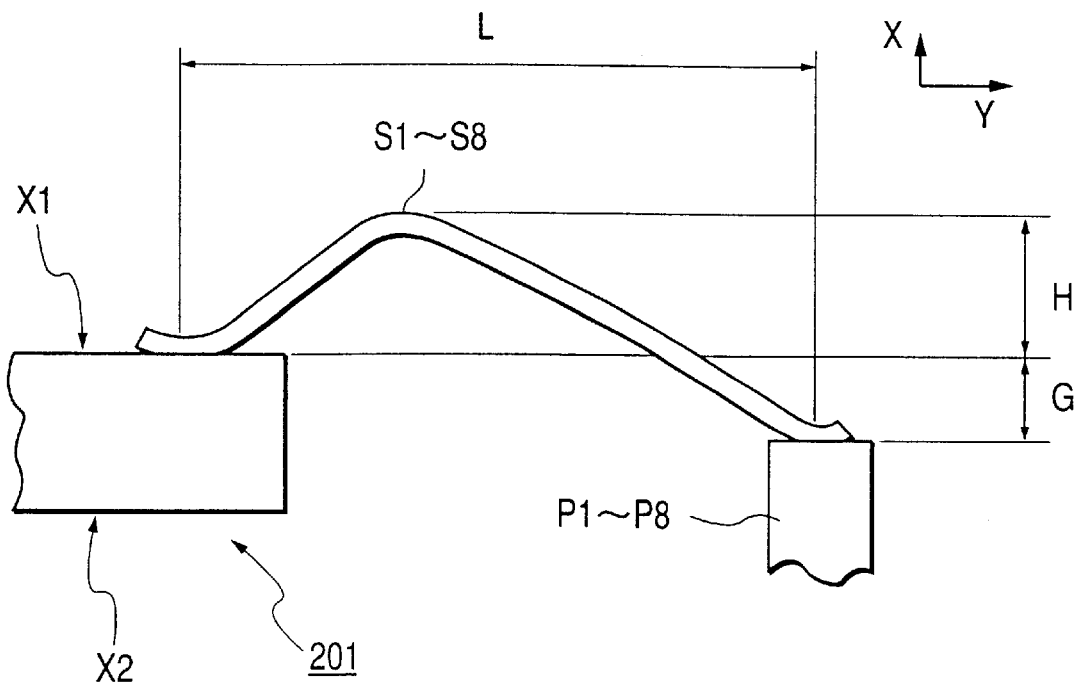
FIG. 18 is an enlarged view showing a detailed lead wire arrangement in accordance with the third embodiment of the present invention.

FIG. 18 shows an enlarged view of the lead wires S1–S8 formed by the above-described ultrasonic wire bonding. Each of the lead wires S1–S8 is configured into a loop (more specifically, reversed U or V) shape straddling between a starting electrode on the front face X1 of the vibrator 201 and a corresponding terminal P1–P8. In other words, the lead wires S1–S8 protrude or extend in the X-axis direction normal of the front face X1 of the vibrator 201 and the reference face K1 of the base plate 202. In FIG. 18, "L" is a bonding distance representing a Y-axis distance between the starting point and the ending point of the wire bonding. "H" represents a height of the lead wire relative to the front face X1 in the X-axis direction. And, "G" is a bonding clearance represents an X-axis distance between the starting point and the ending point of the wire bonding (i.e., an X-axis clearance between the face X1 and the terminals P1–P8).

The inventors of the present invention have researched the relationship between the lead wire shape and the above-described distortion $\in$ to derive optimum dimensions of a practically acceptable and sufficiently durable lead wire. The inventors have conducted a computer analysis (FEM analysis) for obtaining the distortion $\in$ according to a finite element method based on the above-described configuration factors G, H and L.

Figure 19:
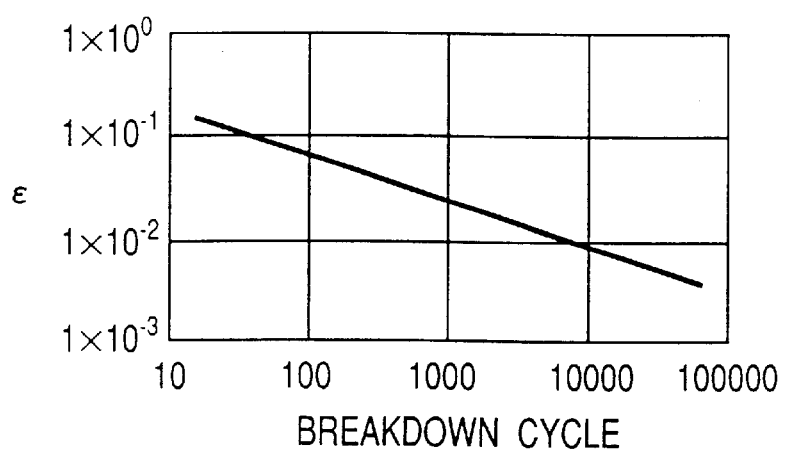
FIG. 19 is a graph showing a relationship between a distortion $\in$ and a breakdown cycle.

The inventors prepared many samples (wire diameter $\phi$=30 $\mu$m) having different values in the configuration factors G, H and L. A simulation test using a cycle counter was performed to cause vibrations repetitively for obtaining a relationship between the distortion $\in$ and a breakdown cycle (i.e., a total number of repeated cycles required for breaking the neck portion N). FIG. 19 is a graph showing a relationship based on the resultant test data. It is apparent that the breakdown cycle reduces with increasing distortion $\in$. In other words, the demonstrated fact through this simulation test is a tendency that the lead is broken easily in accordance with the magnitude of the distortion $\in$.

Furthermore, influences of configuration factors G, H and L given to the distortion E were examined in this FEM analysis. As a result, it is confirmed that both the bonding clearance G and the lead height H give a large influence to the distortion $\in$ while the bonding distance L gives no substantial influence.

Figure 20:
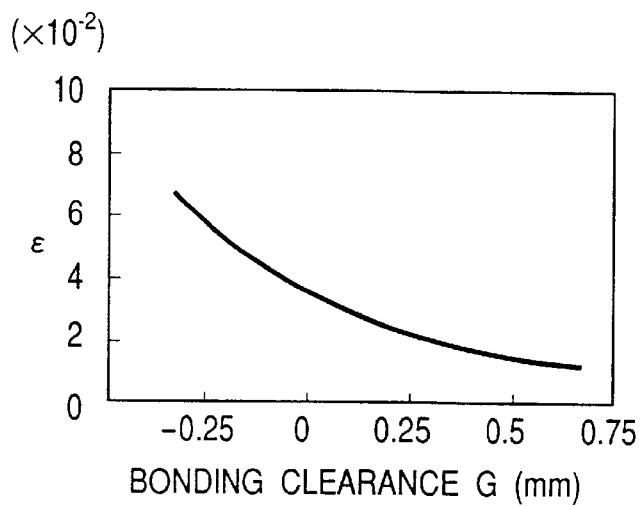
FIG. 20 is a graph showing a relationship between the distortion $\in$ and a bonding clearance G.

FIG. 20 shows an influence of the bonding clearance G given to the distortion $\in$. From the result of FIG. 20, it is understood that the distortion e decreases with increasing bonding clearance G. In other words, the distortion $\in$ can be suppressed by positioning the starting point higher than the ending point in the wire bonding.

The bonding clearance G cannot be set to an excessively large value because the overall size of the sensor is enlarged. According to this embodiment, the bonding clearance G is set to a value equal to approximately 1 mm or a smaller value (e.g., 0.6 mm). Namely, the front face X1 is higher than the terminals P1–P8 on the reference face K1 by a given clearance of, for example, 0.6 mm in the X-axis direction.

Although this embodiment assigns each electrode on the front face X1 to the starting point, it is possible to assign oppositely to start the winding bonding from each terminal P1–P8 to each electrode on the front face X1. Needless to say, each electrode on the front face X1 serves as an ending point in this case and is positioned lower than the corresponding terminal.

After the bonding clearance G is determined to a predetermined value (e.g., 0.6 mm) through the FEM analysis, the other factor (i.e., lead height H) giving a significant influence to the distortion e was examined through an operational durability test. One example is explained hereinafter.

The inventors prepared aluminum wires having a diameter $\phi$=30 $\mu$m as samples for the durability test. The lead height H was classified into three groups; 0.3–0.4 mm, 0.5–0.7 mm and 0.8–1.2 mm. The bonding distance L was classified into three groups; 3 mm, 4.5 mm and 6 mm. Each lead wire was fabricated by an ultrasonic wire bonding. The bonding clearance G is fixed to 0.66 mm.

Figure 21:
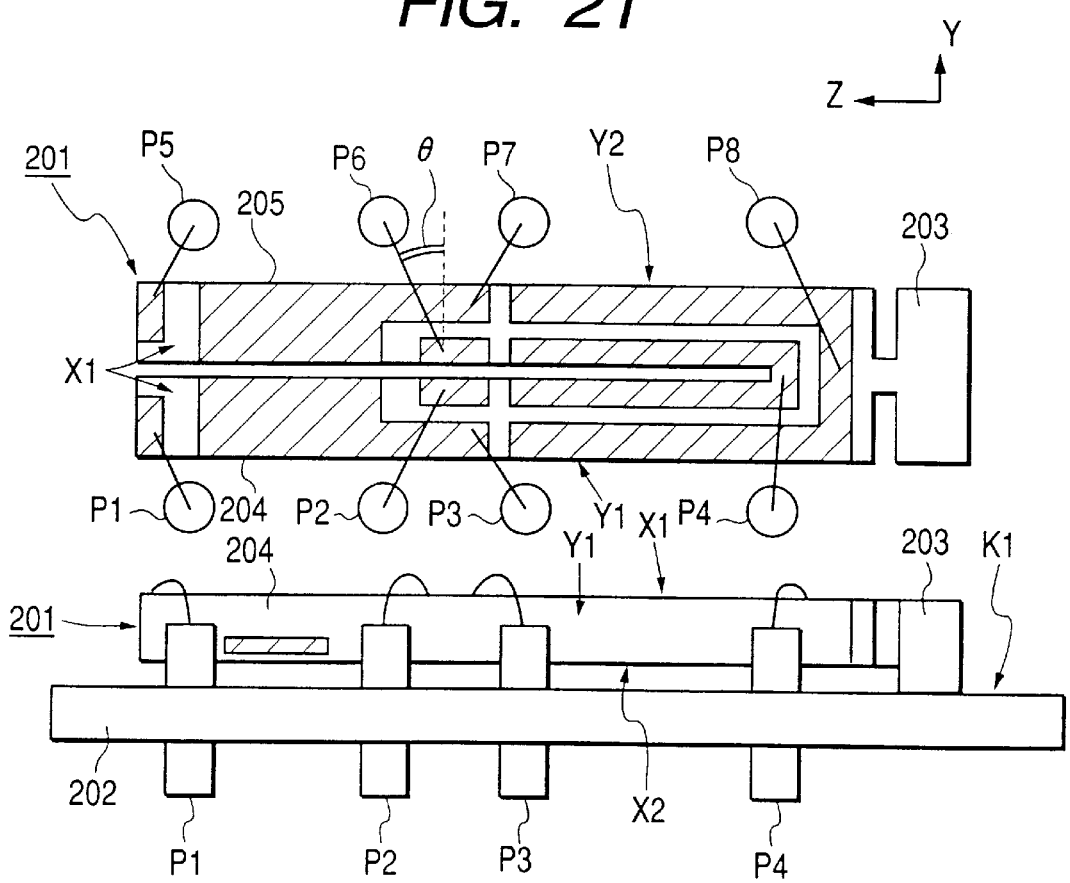
FIG. 21 is a view illustrating a bonding angle θ of a lead wire in accordance with the third embodiment of the present invention.

As shown in FIG. 21 (reference numerals for the electrodes and leads are omitted), a bonding angle $\theta$ is defined as an angle of a lead wire with respect to the Y axis when seen from the X-axis direction. Regarding this the bonding angle $\theta$, an influence given to the breakdown of the lead wire was checked during the durability test. The bonding angle $\theta$ is set to 0° and 30°.

Using the samples thus prepared, the durability of each sample was evaluated through an acceleration test conducted in the following manner.

A voltage applied on the drive electrodes was set higher than a practical level, so that the vibrator could cause a vibration with a distal-end amplitude (i.e., Y-axis directional amplitude) of 16 $\mu$m which is twice as large as the practical value. A time required for breaking the neck portion of the lead wire is referred to as a breakdown life. By performing a continuous operation test, the breakdown life was evaluated at various portions.

To obtain data at various drive amplitudes, bonding portions between each lead sample and the vibrator were provided at a total of five portions in a range from a distal end of the arm bar (amplitude=16 $\mu$m) and a point corresponding to approximately ⅓ on the way from this distal end to the connecting bar (amplitude=8 $\mu$m). In other words, referring to FIG. 13, these bonding points are spaced 14 mm to 20 mm from the bottom of the vibrator.

Two pieces (n=2) are prepared for each sample having same factors H, L and $\theta$. FIGS. 22 and 23 are tables showing the test data. In these tables, encircled numerals ① and ② denote the sample numbers. FIG. 22 shows the breakdown life (hour) of each sample. For example, when the configuration factors are $\theta$=0°, H=0.3–0.4 mm and L=3 mm, the sample ① having a drive amplitude 16$\mu$m has a breakdown life of 0.5 (hour). Each mark "X" attached to a breakdown value indicates that the tested sample was actually broken, while each mark ">" indicates that the tested sample was not broken. For example, a tested sample indicated by ">3000" has a durability equivalent to an operation exceeding 3,000 hours.

Figure 24:
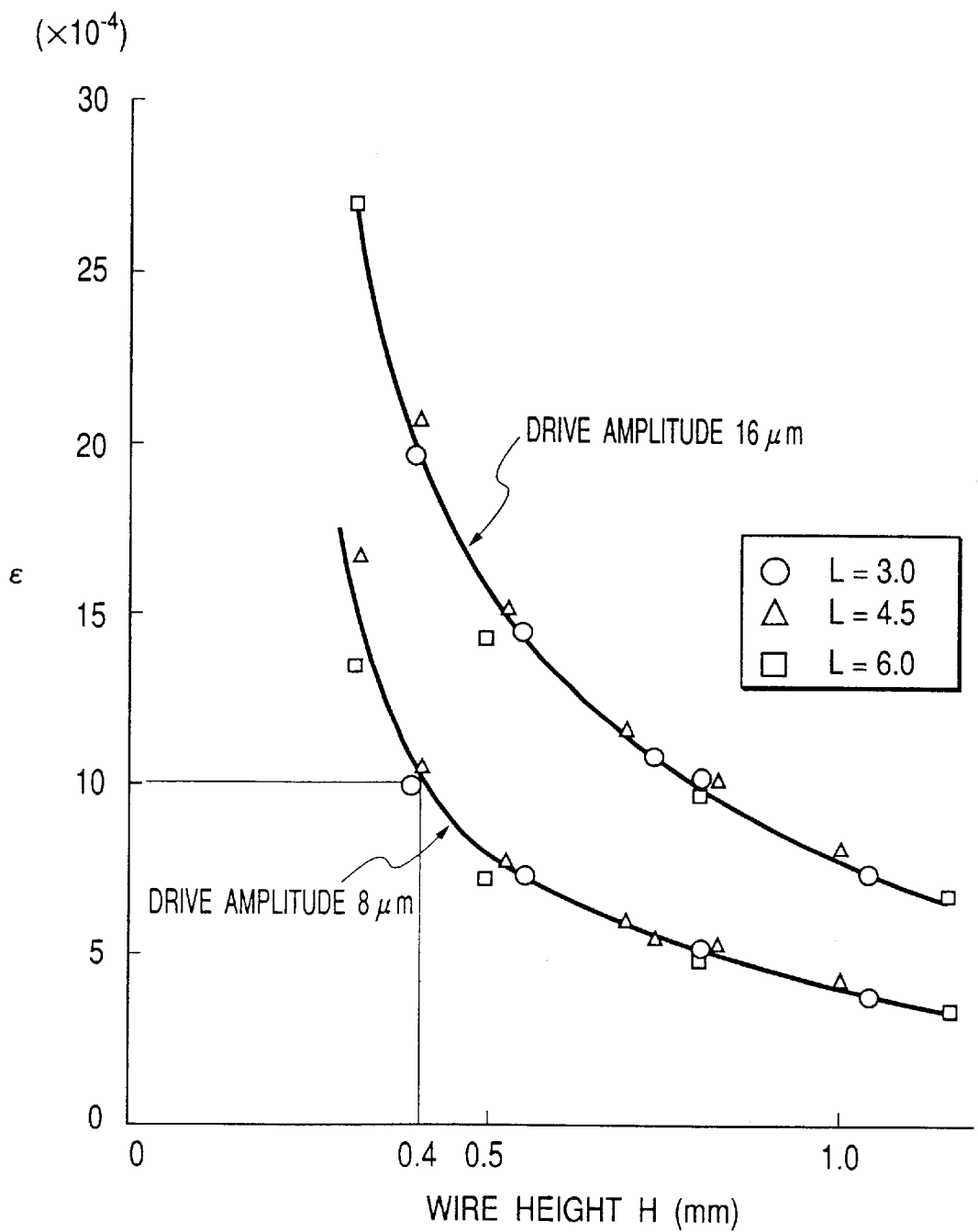
FIG. 24 is a graph showing a relationship between a wire height H of the lead wire and the distortion $\in$ in accordance with the third embodiment of the present invention.

At the same time, an FEM analysis was conducted for each of the above-described samples used in the durability test. More specifically, the distortion ∈ appearing at the neck portion was calculated using parameters of bonding distance L and wire height H (with a constant bonding clearance G=0.6 mm). FIG. 24 shows the data obtained from the FEM analysis.

As apparent from FIG. 24, all data of the appearing distortions ∈ exist in an elastic region the distortion ∈ is proportional to the drive amplitude of the vibration. The data of FIG. 24 well demonstrates that the bonding distance L gives no substantial influence to the distortion ∈ while the wire height H give a significant influence to the distortion ∈, as described previously.

Figure 25:
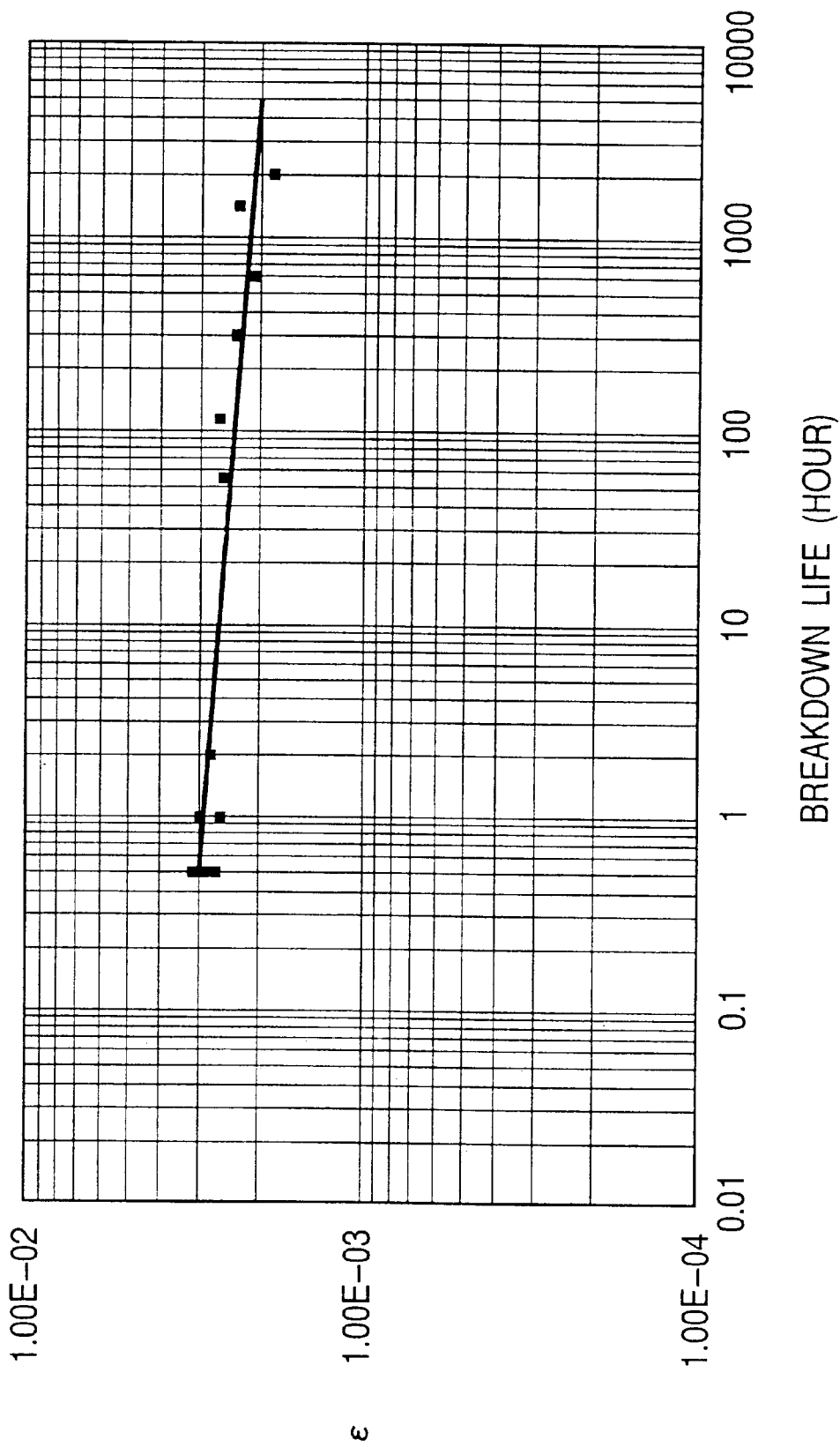
FIG. 25 is a graph showing a relationship between the distortion $\in$ and a breakdown life of the lead wire in accordance with the third embodiment of the present invention.

FIG. 25 is a graph showing a fatigue life line obtained by plotting the breakdown life data marked by "X" in FIGS. 22 and 23. In FIG. 25, an abscissa represents the breakdown life (hour) and an ordinate represents the distortion ∈. FIG. 25 shows that the breakdown life and the distortion ∈ are in an exponentially linear relationship.

The lead wire configuration is determined based on the data thus obtained so as to satisfy every requirements relating to the product reliability. For example, to satisfy severe requirements in an advanced automotive control system, it may be necessary to assure a durability equivalent to a breakdown life exceeding 10,000 hours. Referring to the fatigue life line shown in FIG. 25, there will be a necessity of providing a lead wire configuration capable of suppressing the distortion ∈ to $2 \times 10^{-3}$.

When a safety factor is 2, the distortion e must be further reduced to a level of $1 \times 10^{-3}$ or below. Referring to FIG. 24, to attain this requirement for a practical value 8 μm of the drive amplitude, the wire height H needs to be equal to or larger than 0.4 mm.

Although a longer life may be obtained by increasing the wire height H, an excessively higher H will increase an overall side of the sensor. Furthermore, an excessively tall lead wire is weak against a vibration or shock applied during a practical operation and may cause a deformation. As a result, this may deteriorate the symmetry of the tuning fork and give an adverse influence to the sensor characteristics. Accordingly, to avoid this kind of drawback, it is preferable to set the wire height H in a range of 0.4–1.2 mm.

Furthermore, as apparent from FIGS. 22 and 23, the bonding angle θ=30° brings a longer life compared with θ=0°. In other words, the breakdown life is shortened with reducing bonding angle θ.

In general, the following relationship be established.

$$\Delta L1 = \Delta L0 \times \cos \theta$$

where ΔL0 represents an amplitude of the vibrator and ΔL1 represents an amplitude of the lead wire.

Accordingly, the amplitude of the lead wire decreases with increasing bonding angle θ. A smaller distortion ∈ appears at the neck portion. As a result, the breakdown life of the lead wire can be extended.

Due to design restrictions in the layout of the bonding points, a larger bonding angle θ may increase a lead wire length. This is disadvantageous in that the lead wire tends to cause a deformation by a vibration or shock applied during a practical operation. Namely, there is a problem that an excessively large bonding angle θ will deteriorate the sensor performance. To avoid this problem, a preferable bonding angle θ is in a range of 0° to 60°.

According to this embodiment, the lead wires S1–S8 are fabricated considering the durability of neck portion N based on the research thus conducted. As optimized values, the bonding clearance G is set to a positive value (e.g., 0.6 mm), the diameter of each lead wire is equal to or smaller than φ=50 μm (e.g., 30 μm), the wire height H is set to somewhere in a range of 0.4–1.2 mm, and the bonding angle θ is set to somewhere in a range of 0–60°.

As described in the foregoing description, according to this embodiment, each lead wire is connected by the ultra sonic wire bonding which does not require an application of heat. This is effective to prevent a deteriorated polarization of the piezoelectric body. The piezoelectric characteristics of the vibrator is not deteriorated. The sensor performance can be improved.

Furthermore, according to this embodiment, the wire diameter of lead wires S1–S8 is set in a predetermined range. This makes it possible to prevent the vibrator from being damaged by the load of wire bonding. A realized temperature drift is equal to or smaller than 10°/sec.

By considering the bonding clearance G etc, the durable wire configuration is provided for the lead wires S1–S8. Furthermore, by considering the bonding angle θ, the lead wires S1–S8 can be prevented from being deformed undesirably. Thus, it becomes possible to provide an excellent angular velocity sensor reliable and capable of maintaining adequate sensor performances.

The distortion ∈ is proportional to the wire diameter. For example, a lead wire of 50 μm has a distortion ∈ 1.67 times as large as that of a lead wire of 30 μm. Accordingly, referring to the relationship between the distortion ∈ and the wire height H shown in FIG. 24, it is necessary to set the wire height H to 0.7 mm or more to obtain a life equivalent to the above-described 30 μm when the distortion ∈ is $6 \times 10^{-4}$.

Fourth Embodiment

Figure 26:
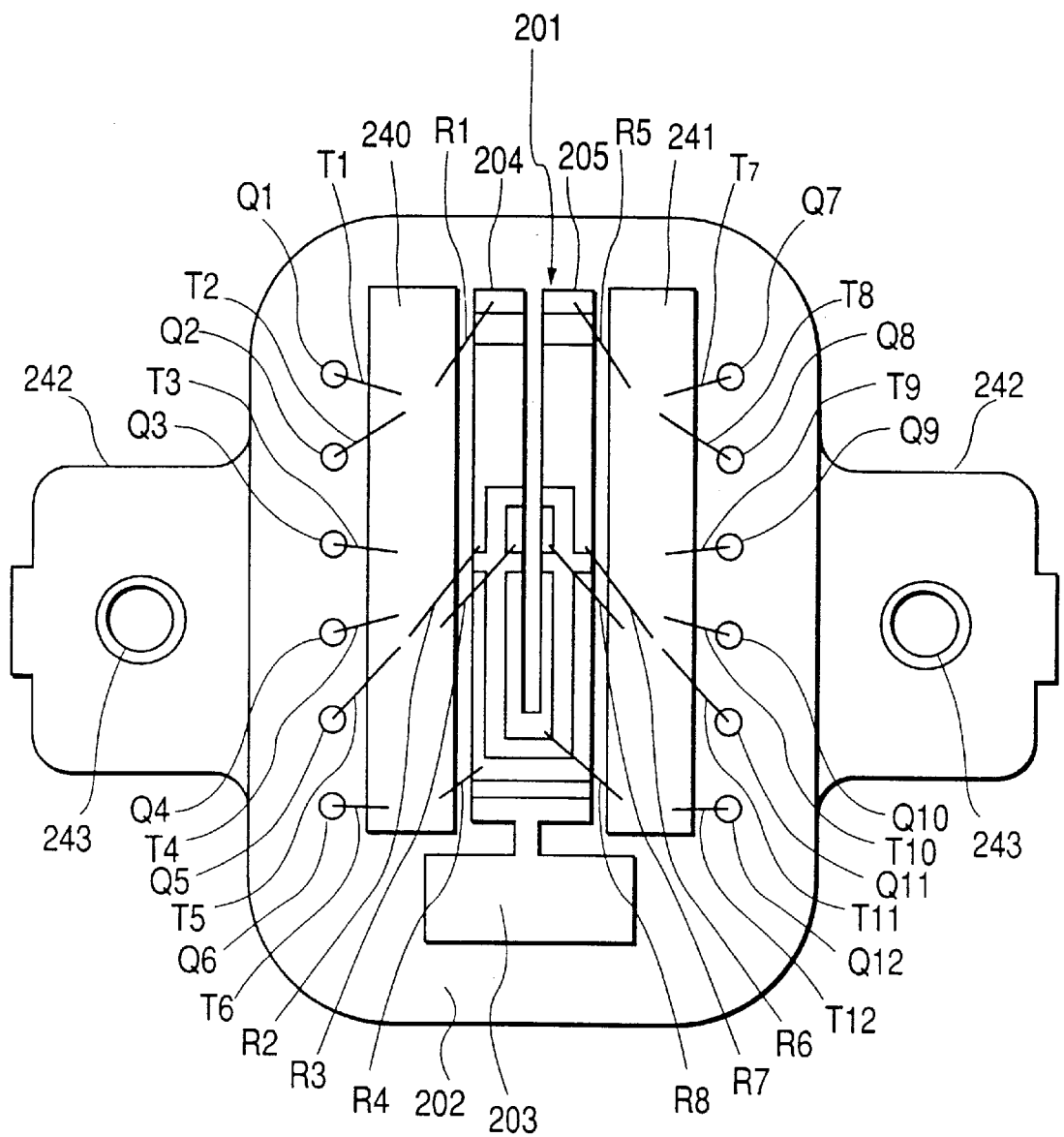
FIG. 26 is a front view showing an overall arrangement of an angular velocity sensor in accordance with a fourth embodiment of the present invention.
Figure 27:
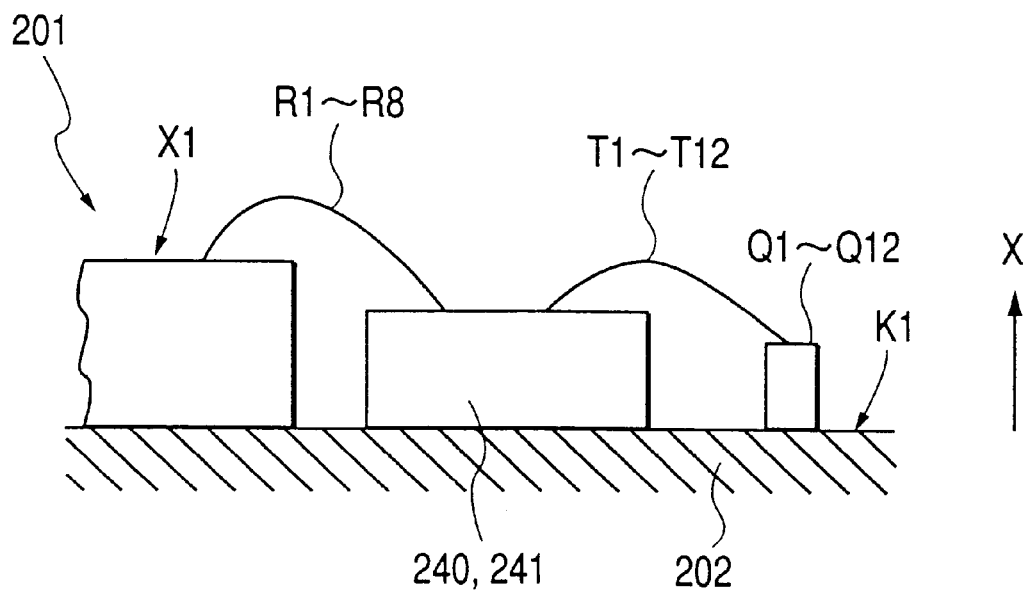
FIG. 27 is an enlarged view showing a detailed connection of a lead wire in accordance with the fourth embodiment of the present invention.

A fourth embodiment differs from the above-described third embodiment in that a HIC substrate (i.e., hybrid IC substrate) is disposed between the vibrator and the terminals. FIGS. 26 and 27 show the detailed arrangement of the fourth embodiment.

Hereinafter, characteristic portions not disclosed in the third embodiment will be chiefly explained. The same parts as those of the third embodiment are denoted by the same reference numerals. In FIG. 26, reference numerals for the electrodes formed on the vibrator 201 are omitted.

Figure 28:
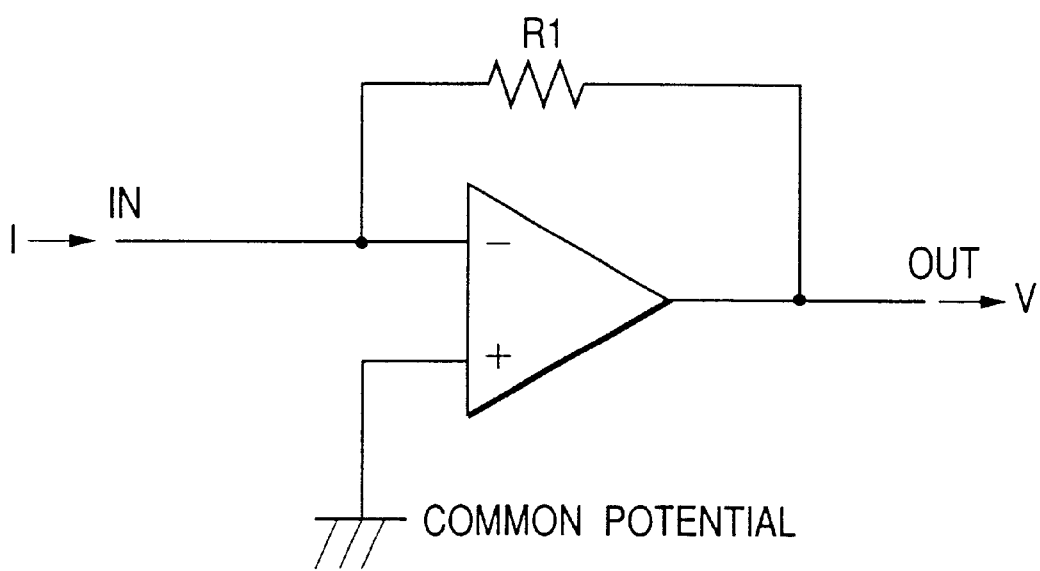
FIG. 28 is a circuit diagram showing a current-voltage conversion circuit in accordance with the fourth embodiment of the present invention.

Two HIC substrates 240 and 241 are provided between the vibrator 201 and the terminals Q1–Q12 and fixed by a silicone adhesive etc. Each of HIC substrates 240 and 241 is made of a ceramic multi-layer substrate which has a current-voltage conversion circuit using a high impedance element as shown in FIG. 28.

The current-voltage conversion circuit has both inversion (−) and noninversion (+) input terminals. The electrodes connected to the inversion input terminal are the monitor electrodes 303, 304 are the pad sensing electrodes 309, 310. A common electrical potential, identical with that of the common electrode 311, is applied to the non-inversion input terminal. A resistor R1, serving as the high impedance element, is interposed between the inversion input terminal (−) and the non-inversion input terminal (+).

For connection of the monitor electrodes, it will be preferable to provide a charge-up circuit including a capacitor in addition to the above-described current-voltage conversion circuit. This is effective to change the phase of current produced from the monitor electrode. This is advantageous for detection of unnecessary signals.

As shown in FIG. 26, respective electrodes formed on the vibrator 201 are connected to the HIC substrates 240 and 241 via lead wires R1–R8. The HIC substrates 240 and 241 are connected to terminals Q1–Q12 via lead wires T1–T12, respectively.

The terminals Q1–Q12 are structurally identical with the terminals of the third embodiment. However, the total number is increased in accordance with the bonding portions to the HIC substrates 240 and 241. The lead wires R1–R8 and T1–T12 are aluminum wires connected by ultrasonic wire bonding in the same manner (configuration) as in the third embodiment.

In each of the lead wire R1–R8, a starting point of the wire bonding is set on each electrode of the vibrator 201 and a corresponding ending point is set on the HMC substrate 240 or 241. In each of the lead wire T1–T12, a starting point of the wire bonding is set on the HIC substrate 240 or 241 and a corresponding ending point is set on each terminal Q1–Q12.

According to this embodiment, as shown in FIG. 27, the starting point of the wire bonding is set higher than the ending point in the X-axis direction from the reference face K1. For example, as practical heights, the front face X1 is set to 2.17 mm, the HIC substrates 240 and 241 are set to 1.7 mm, and the top of terminals Q1–Q12 are set to 1.5 mm. In short, in the wire bonding, it is essential to position the starting point than the corresponding ending point.

Although not shown, a hermetic seal is applied to the base plate 202 so that an inside space defined by a cover plate (not shown) and the base 202 is maintained hermetically. The base plate 202 has right and left flanges 242, 242 to which vibrationproof rubbers (not shown) are attached. Each flange 242 has a fastening hole 243 for inserting a fastening member. Thus, the base plate 202 is securely fixed to a vehicle body via vibrationproof rubbers attached to the flanges 242.

The current produced from the vibrator 201 is very small (several nA). A very large resistance (several hundreds kΩ to several MΩ) is used to convert such tiny current into voltage.

According to this embodiment, each of HIC substrates 240 and 241 comprises a current-voltage conversion circuit having a high impedance element. This is effective to shorten the distance required for converting each current produced from the vibrator 201 into a voltage signal. Furthermore, the adopted hermetic structure is effective to eliminate influences of external electric noises. Hence, the SIN ratio can be improved. It becomes possible to provide an accurate angular velocity sensor.

Furthermore, according to this embodiment, both the vibrator 201 made of a piezoelectric member and the HI-C substrate including the current-voltage conversion circuit are accommodated in a sealed space between the cover and the hermetically sealed base plate base plate 202. This arrangement provides an angular velocity sensor robust against the moisture. This is especially effective when a current-voltage conversion circuit includes a high impedance element because the high impedance element is weak against moisture.

Moreover, the ceramic multilayer substrate constituting each FUC substrate 240, 241 has an excellent durability compared with an ordinary print substrate used for a circuit substrate. Furthermore, the multi-layer substrate is advantageous for downsizing the sensor.

Fifth Embodiment

A fifth embodiment differs from the above-described embodiments in that the vibrator has only one right rectangular prism as shown in FIGS. 29A, 29B, 30A and 30B.

More specifically, the angular velocity sensor comprises a vibrator 251 made of a piezoelectric body of a right rectangular prism. Electrodes are formed on the faces of this piezoelectric body. The vibrator 251 is securely fixed to a base plate 252 via a supporter 253. The supporter 232 is made of an appropriate metal material, such as 42N, which is processible into the U(more specifically ⌴)-shaped configuration.

The vibrator 251 is substantially the same in structural arrangement as the right arm bar 205 shown in the above-described embodiment. On the front face of the piezoelectric body, numerous electrodes are formed successively from the base end fixed to the supporter 253 in an order of a pair of drive electrodes 260a, 260b, a monitor electrode 261, an outlet electrode 262, a polarizing electrode 263, and a pad sensing electrode 264.

The vibrator 251 has a side face Y2 formed with a angular velocity sensing electrode 265 at a portion corresponding to the polarizing electrode 263. The angular velocity sensing electrode 265 is integrally formed with the pad sensing electrode 264 via an lead electrode 266. The vibrator 251 has a rear face X2 opposed to the front face X1. A common electrode 267 is entirely formed on the rear face X2. The common electrode 267 is integrally formed with the outlet electrode 262 via an short-circuit electrode 268a. The outlet electrode 262 is integral with the polarizing electrode 263 via a short-circuit electrode 268b. The common electrode 267 serves as a reference electrode for the drive electrodes 260a, 260b, the monitor electrode 261, the pad sensing electrode 264 and the angular velocity sensing electrode 265.

The piezoelectric body constituting the vibrator 251 is polarized in an X-axis direction from the front face X1 to the rear face X2.

The base plate 252 confronts in parallel with the rear face X2 of the vibrator 251. The base plate 252 is provided with terminals M1–M5 which are hermetically sealed in the same manner as the above-described embodiments. The drive electrodes 260a, 260b, the monitor electrode 261, the outlet electrode 262 and the pad sensing electrode 264 are connected to the terminals M1–M5 via lead wires W1–W5.

Figure 30A:
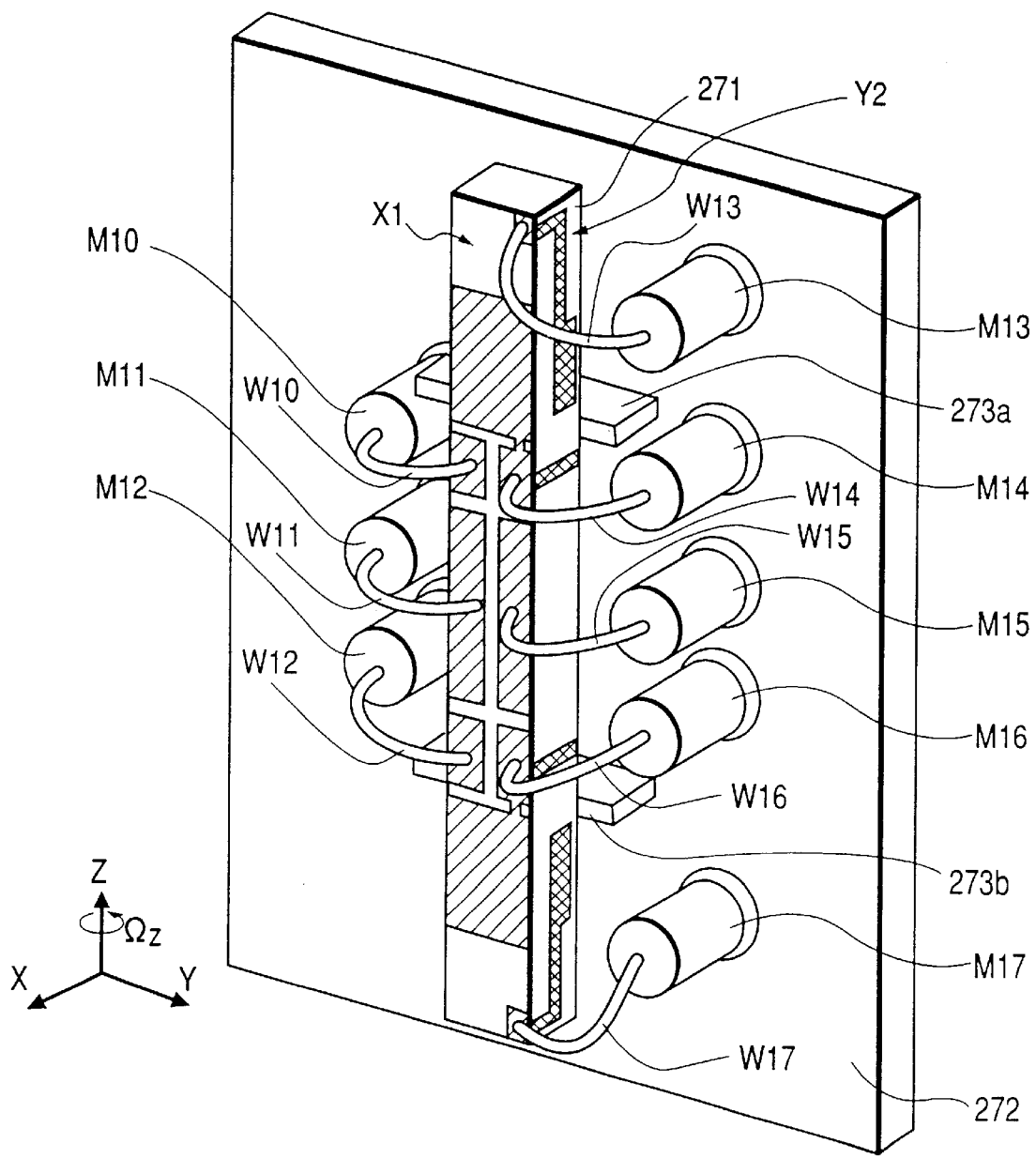
FIGS. 30A and 30B are views cooperatively showing a modified angular velocity sensor in accordance with the fifth embodiment of the present invention.
Figure 30B:
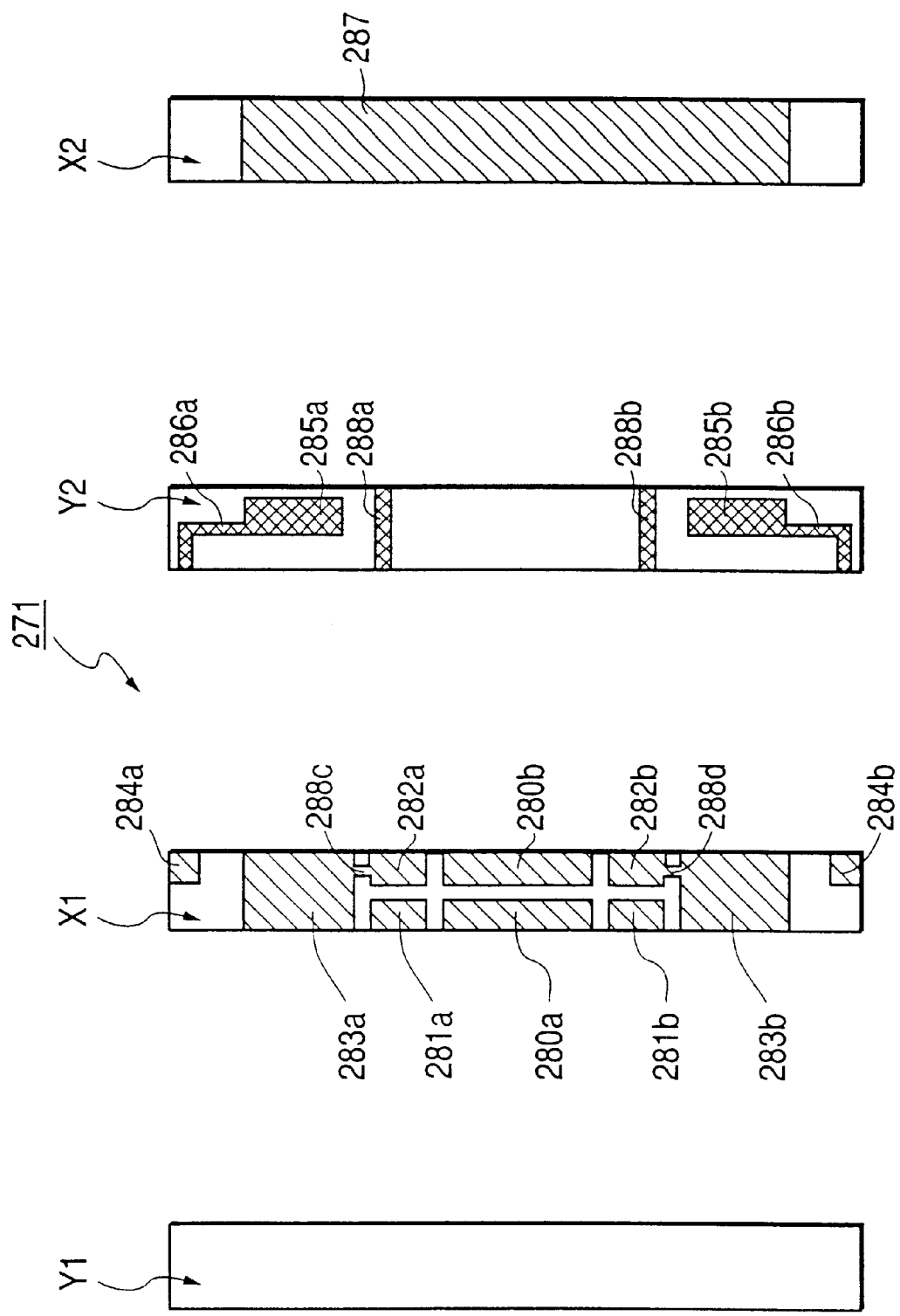

An angular velocity sensor shown in FIG. 30A is characterized in that the piezoelectric body of a right rectangular prism is connected to the base plate 272 via a pair of supporters 273a and 273b made of a resin or the like. These supporters 273a and 273b coincide the nodes of the vibration of a vibrator 271.

The vibrator 271 has electrodes formed symmetrically in an up-and-down direction. More specifically, a pair of left and right drive electrodes 280a and 280b are formed at the vertical (i.e., longitudinal) center on the front face X1. Two monitor electrodes 281a and 281b are formed at upper and lower sides of the drive electrode 280a on the front face X1. Two outlet electrodes 282a and 282b are formed at upper and lower sides of the other drive electrode 280b on the front face X1. An upper polarizing electrode 283a is formed at an upper side of the monitor electrode 281a and the outlet electrode 282a on the front face X1. A lower polarizing electrode 283b is formed at a lower side of the monitor electrode 281b and the outlet electrode 282b on the front face X1. An upper pad sensing electrode 284a is formed at an uppermost end of the front face X1, while a lower pad sensing electrode 284b is formed at a lowermost end of the front face X1.

The vibrator 271 has a right side face Y2 on which two angular velocity sensing electrodes 285a and 285b are symmetrically formed in the vertical direction at portions corresponding to the polarizing electrodes 283a and 283b, respectively. These angular velocity sensing electrodes 285a and 285b are integral with the pad sensing electrodes 284a and 284b on the front face X1 via lead electrodes 286a and 286b, respectively.

The vibrator 271 has a rear X2 opposed to the front face X1. A common electrode 287 is entirely formed on the rear face X2. The common electrode 287 is integrally formed with the outlet electrodes 282a and 282b via short-circuit electrode 288a and 288b, respectively. The outlet electrodes 282a and 282b are integral with the polarizing electrodes 283a and 283b via short-circuit electrode 288c and 288d, respectively. The common electrode 287 serves as a reference electrode for the drive electrodes 280a, 280b, the monitor electrodes 281a, 281b, the pad sensing electrodes 284a, 284b and the angular velocity sensing electrode 285a, 285b.

The piezoelectric body constituting the vibrator 271 is polarized in an X-axis direction from the front face X1 to the rear face X2.

The base plate 272 confronts in parallel with the rear face X2 of the vibrator 271. The base plate 272 is provided with terminals M10–M17 which are hermetically sealed in the same manner as the above-described embodiments. The drive electrodes 280a, 280b, the monitor electrodes 281a, 281b, the outlet electrodes 282a, 282b and the pad sensing electrodes 284a, 284b are connected to the terminals M10–M17 via lead wires W10–W17.

Figure 29A:
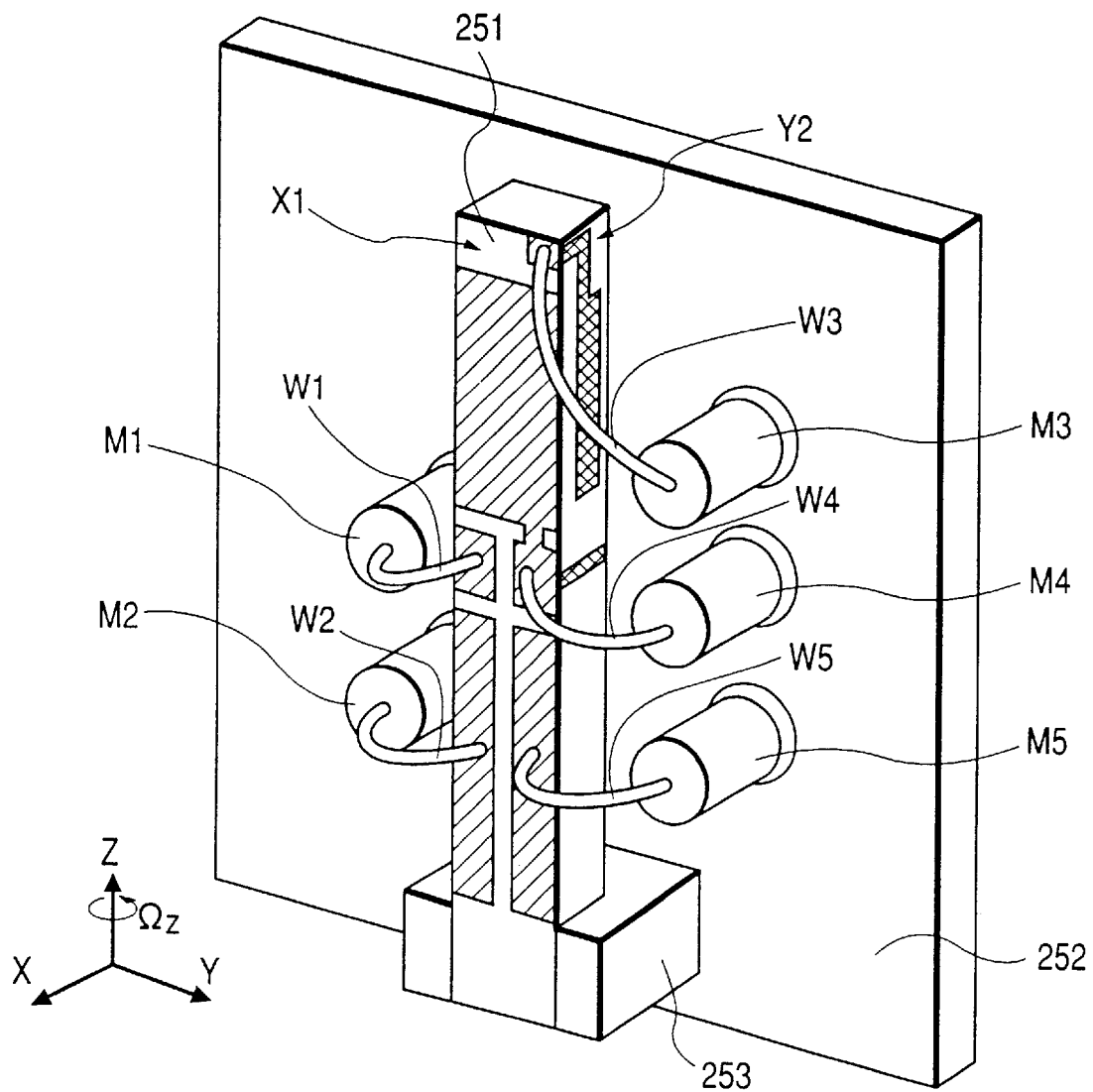
FIGS. 29A and 29B are views cooperatively showing an angular velocity sensor in accordance with a fifth embodiment of the present invention.
Figure 29B:
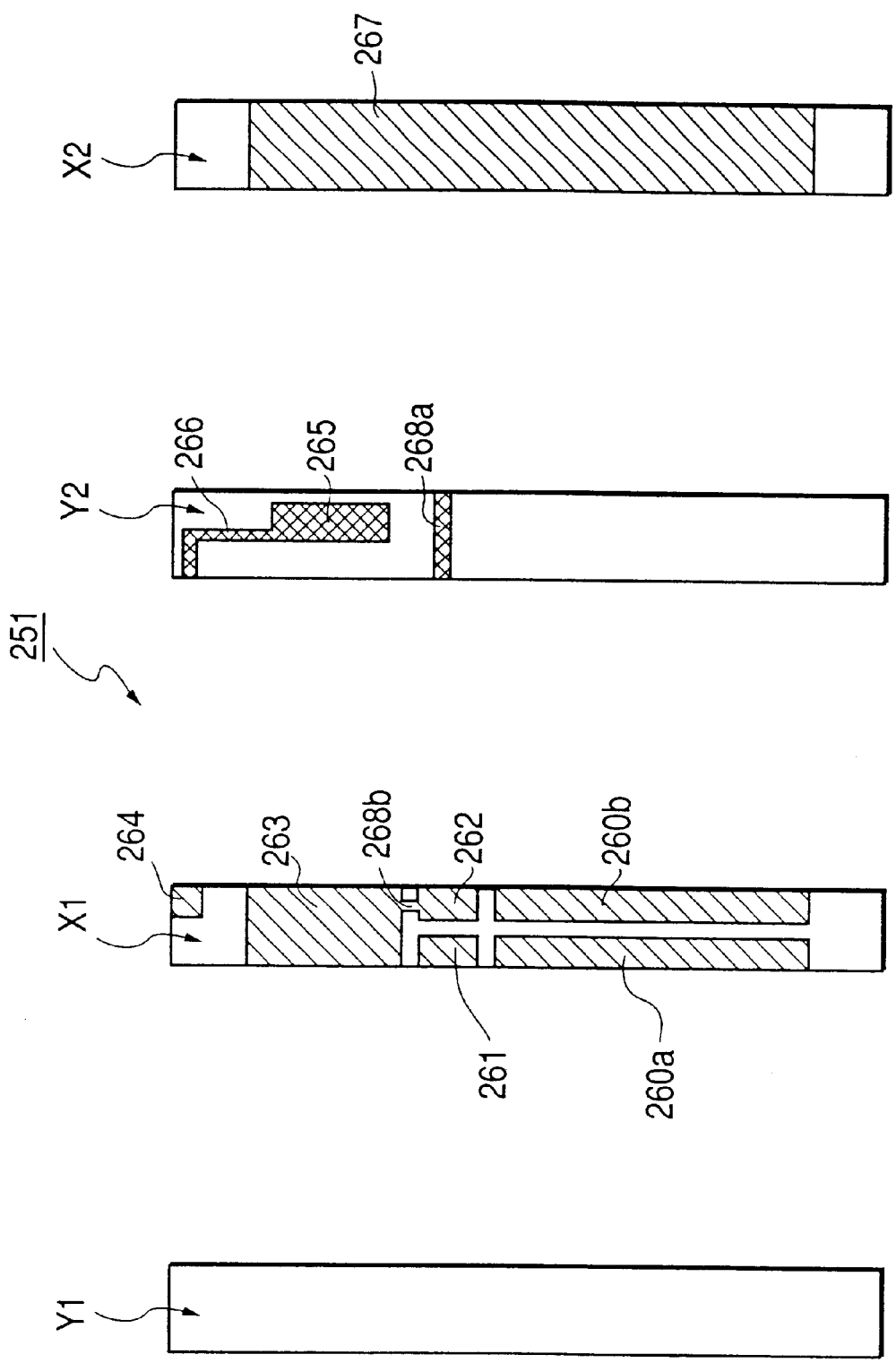

In the arrangements of angular velocity sensors shown in FIGS. 29A and 30A, the relationship between the starting point and the ending point of the wire bonding and the lead configuration (including the bonding clearance) of lead wires W1–W5 and W10–W17 are determined in the same manner as the above-described third embodiment.

Furthermore, it is possible to interpose HIC substrates between the vibrator and the terminals in the same manner as the above-described fourth embodiment.

Various Modifications

Figure 31A:
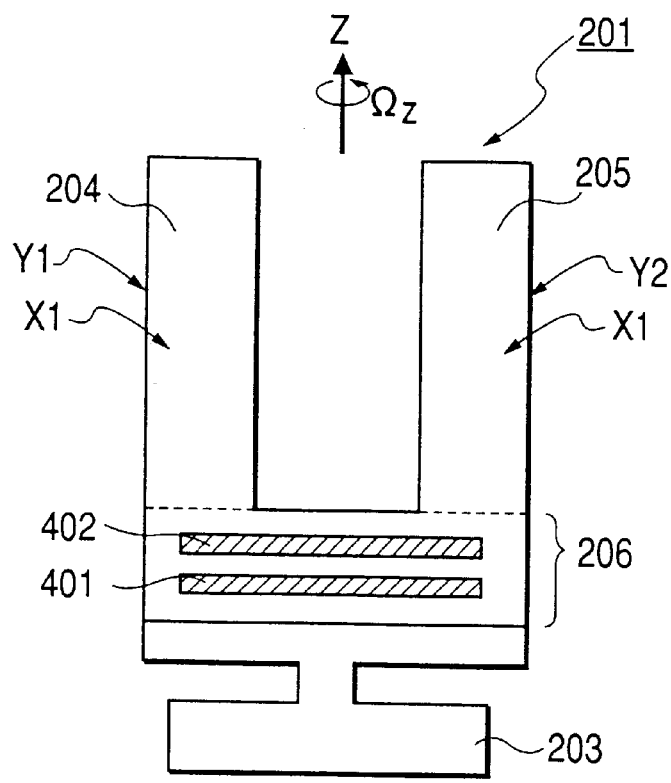
FIGS. 31A and 31B are views showing modifications of the electrode arrangement in accordance with the fifth embodiment of the present invention.
Figure 31B:
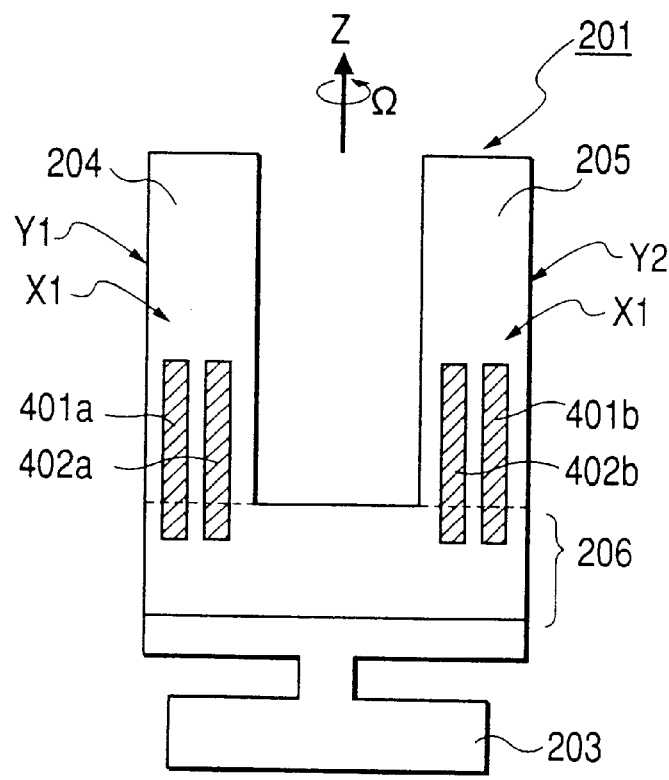

FIGS. 31A and 31B show modified drive electrodes formed on the front face X1 of the tuning fork vibrator, although other electrodes are omitted.

According to a modification shown in FIG. 31A, two parallel drive electrodes 401 and 402 extend in lateral direction from one end to the other end of the connecting bar 206.

According to a modification shown in FIG. 31B, drive electrodes are separated into right and left groups. Two drive electrodes 401a and 402a extend vertically along the left arm face and constitute the left group. Two drive electrodes 401b and 402b extend vertically along the left arm face and constitute the right group.

In the above-described modifications, a common electrode is formed on the rear face X2. The common electrode is connected to a corresponding terminal via a short-circuit electrode and an outlet electrode (on the front face X1). Angular velocity sensing electrodes are formed on the side face Y1 and Y2, and are connected to corresponding terminals via short-circuit electrodes and pad sensing electrodes (on the front face X1). It is however possible to directly connect the common electrode and the angular velocity sensing electrodes to their corresponding terminals. In this case, the terminals and lead wires are arranged in the same manner as the above-described embodiments.

Furthermore, it is possible to modify the common electrode into separate common electrodes formed on the rear face X2 so as to correspond to the electrodes formed on the front fac X1.

Moreover, it is possible to modify the vibrator into a triangular or pentagonal prism. In such a case, there is no necessity of forming the common electrode on the rear face X2 facing to the base plate.

Sixth Embodiment

A sixth embodiment of the present invention provides a novel manufacturing method for an angular velocity sensor. The manufacturing method of the sixth embodiment will be explained based on the angular velocity sensor shown in FIG. 10. Regarding the detailed structural arrangement and operations of the FIG. 10 angular velocity sensor, the above-described third embodiment should be referred to and the sixth embodiment will not explain it.

FIGS. 32A–32D cooperatively show the electrode arrangements in accordance with the sixth embodiment. These electrodes are electrically conductive films made of an Ag—Pd conductor (e.g., CLP56486 commercially available from Sumitomo Metal Mining). Each electrode has a thickness of 10 $\mu$m.

Figure 32B:
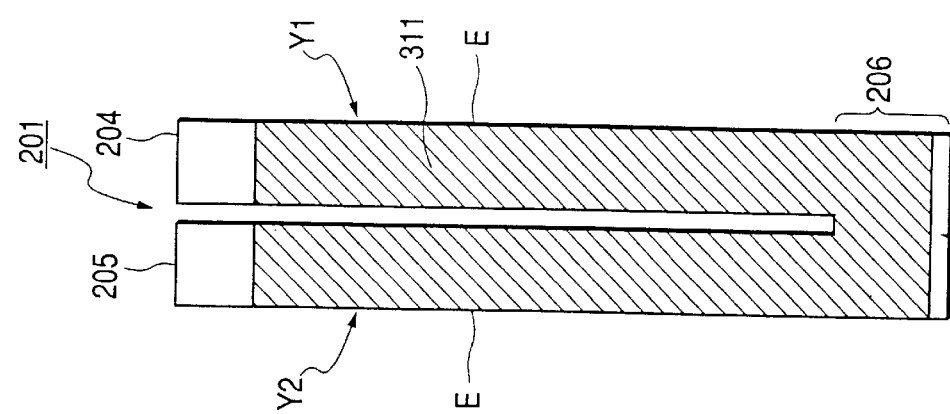
FIGS. 32A through 32D are views cooperatively showing an electrode arrangement in accordance with a sixth embodiment of the present invention.
Figure 32D:
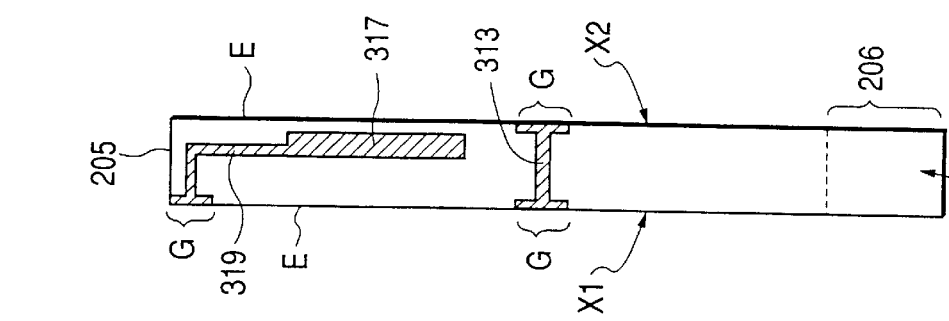
Figure 32A:
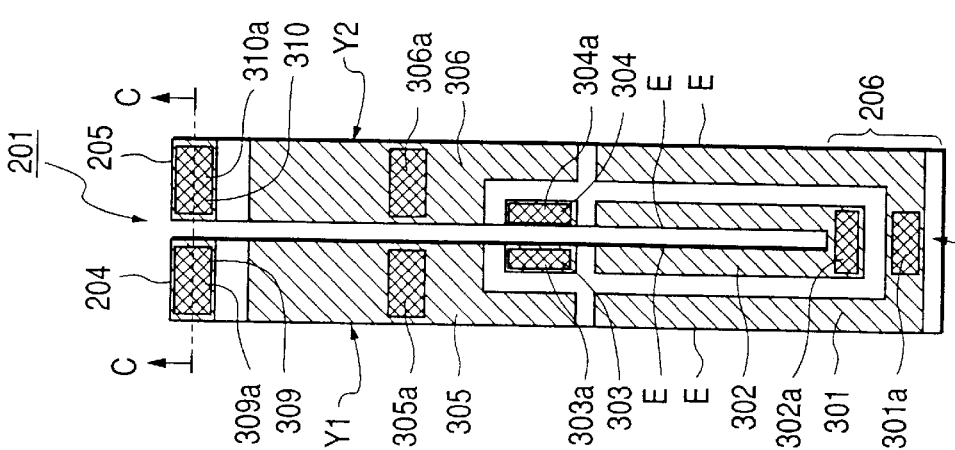

A plurality of second layer conductive film sections 301a, 302a, 303a, 304a, 305a, 306a, 309a and 310a, i.e., cross-hatched regions in FIG. 32A, are formed at least partly on the electrodes 301, 302, 303, 304, 305, 306, 309 and 310 formed on the front face X1. Each second layer conductor film section is located inside an outer peripheral line of a corresponding electrode as a wire bonding electrode for a wire bonding operation. These wire bonding electrodes 301a, 302a, 303a, 304a, 305a, 306a, 309a and 310a are made of an Ag—Pd conductor (e.g., CLP38287 commercially available from Sumitomo Metal Mining) which includes no glass fritts. These wire bonding electrodes are not shown in FIG. 10.

The angular velocity sensing electrodes 316 and 317 are made of an electrically conductive film and formed on the side faces Y1 and Y2 after finishing the polarizing operation of the piezoelectric body. These angular velocity sensing electrodes 316 and 317 are made of a resinated silver conductor (e.g., LS-504J commercially available from Asahi Chemical) which contains ball or flake silver particles mixed in a resin and is hardened (sintered) under a Curie temperature (e.g., 360° C.) of the piezoelectric body.

The common electrode 311, formed on the rear face X2, is made of an electrically conductive film having the same material components and thickness as the electrodes formed on the front face X1.

The short-circuit electrodes 312, 313 and the lead electrodes 318, 319, formed on the side faces Y1 and Y2, are made of electrically conductive film having the same material components and thickness as the angular velocity sensing electrodes.

The lead electrodes 318 and 319 are integral with the angular velocity sensing electrodes 316 and 317 and continuously connected to the pad sensing electrodes 309 and 310 along corner ridgelines E between the front face X1 and the side faces Y1, Y2, respectively. The short-circuit electrodes 312 and 313 are continuously connected, at one end, to the outlet electrodes 305 and 306 along corner ridgelines E between the front face X1 and the side faces Y1, Y2 and continuously connected, at the other end, to the common electrode 311 along other corner ridgelines E between the rear face X2 and the side faces Y1, Y2.

These electrodes 312, 313, 318 and 319 have widened portions, designated by G, at the corner ridgelines E.

A detailed electrode connecting arrangement at each corner ridgeline E will be explained based on a representative connection between the pad sensing electrode 310 and the lead electrode 319.

Figure 33:
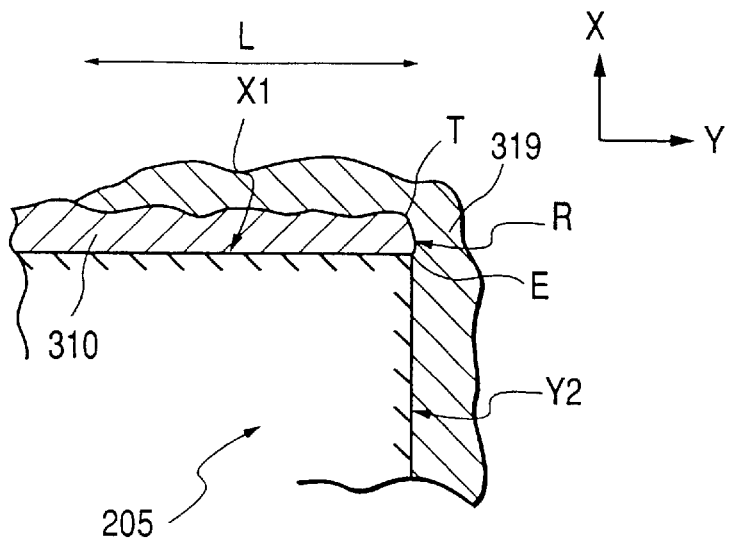
FIG. 33 is an enlarged cross-sectional view taken along a line C—C of FIG. 32A.

FIG. 33 is an enlarged cross-sectional view taken along a line C—C of FIG. 32A, as a result of a scanning electronic microscopic (SEM) analysis.

As shown in FIG. 33, the pad sensing electrode 310 is cut along the corner ridgeline E. A remaining cut surface R of the pad sensing electrode 310 is substantially flush with the side face Y2. The film thickness at the cut surface R is substantially the same as an average thickness of the pad sensing electrode 310. Then, the lead electrode 319 provided on the side face Y2 extends via the cut surface R to a predetermined point on the pad sensing electrode 310. The extended end part of the lead electrode 318 overlaps with the pad sensing electrode 310 at a region defined by a distance L (e.g., 40 μm) from the corner ridgeline E.

Figure 34:
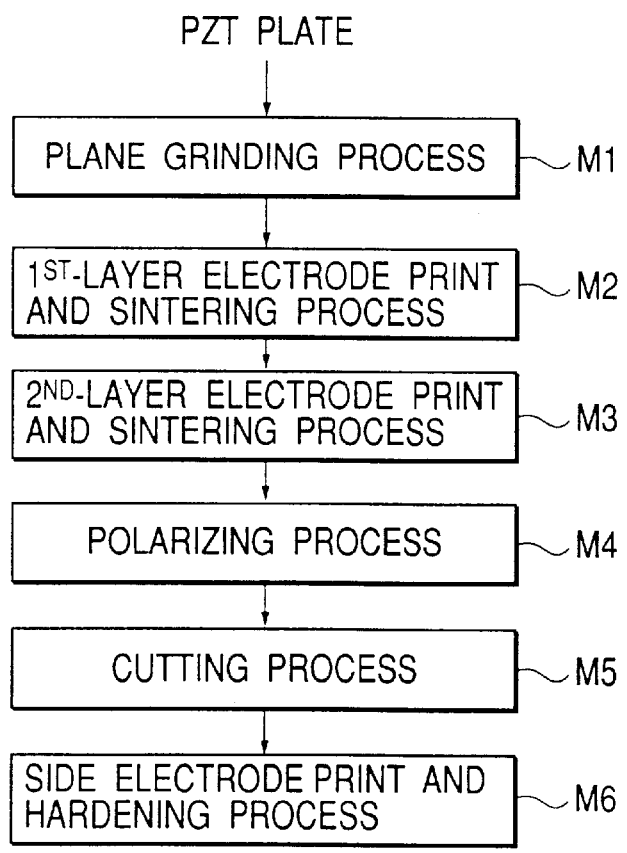
FIG. 34 is a flowchart showing a manufacturing method of a vibrator in accordance with the sixth embodiment of the present invention.

Next, a manufacturing method for fabricating the vibrator 201 and the electrodes formed on the faces thereof will be explained with reference to a manufacturing procedure shown in FIG. 34.

Figure 35A:
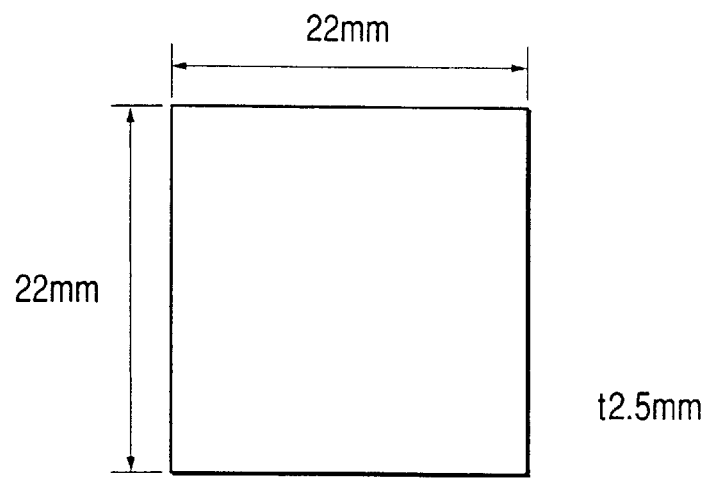
FIGS. 35A–35C and 36A–36C are views explaining details of the manufacturing method of a vibrator in accordance with the sixth embodiment of the present invention.
Figure 35B:
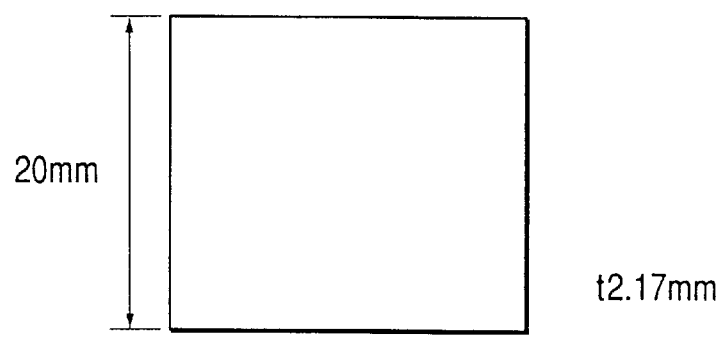

First, sintered PZT ceramics is prepared as a rectangular plate of 22 mm×22 mm×2.5 mm as shown in FIG. 35A. In a plane grinding process M1, the PZT ceramic plate is grinded by a plane lapping machine to form a thiner plate having a thickness of 2.17 mm. Next, the resultant PZT plate is cut at opposing edges to form parallel edges spaced by a clearance of 20 mm. Thus, a PZT body (i.e., piezoelectric body) is formed as shown in FIG. 35B.

Figure 35C:
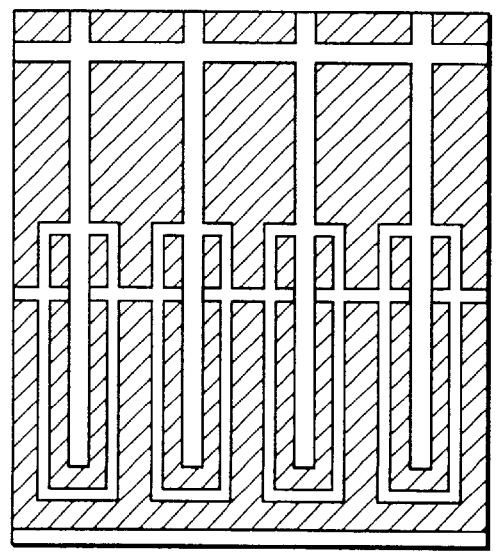

Next, in a first-layer electrode print and sintering process M2, a first Ag—Pd conductor film (CLP56486 commercially available from Sumitomo Metal Mining) is printed at predetermined portions corresponding to respective electrodes (hatched portions in FIG. 35C) on the front and rear faces of the PZT body. The printed Ag—Pd conductor film is sintered at a temperature of 850° C. to form an electrode film of 10 μm.

Next, in a second-layer electrode print and sintering process M3, a second Ag—Pd conductor film (CLP38287 commercially available from Sumitomo Metal Mining) is printed at redetermined portions corresponding to the wire bonding electrodes (cross-hatched portions in FIG. 36A) on the first electrode layer. The printed Ag—Pd conductor film is sintered at a temperature of 850° C. to form an electrode having a thickness of 10 μm. As a result, an overall electrode thickness is increased to 20 μm at the portion corresponding to the wire bonding electrode.

In the printing operation for these first and second Ag—Pd conductor films, the viscosity of the conductor paste was 200 Ps·s and a viscosity ratio (i.e., a ratio of 1 rpm to 100 rpm at a viscometer) was 1.5. A mesh size of a used screen was #250. And, an emulsion thickness was 10 μm.

The formation of the second-layer Ag—Pd conductor film is related to a wire bonding for aluminum wires to be connected between the vibrator 201 and the drive/sensing circuit. The bonding strength and durability of the aluminum wires can be improved by providing the second-layer Ag—Pd conductor film. More specifically, to secure a satisfactory connection to the PZT, the first layer is made of a conductor including a relatively large amount of glass fritts. On the other hand, to secure a satisfactory connection to the wire, the second layer is made of a conductor including no glass fritts. However, it may be possible to provide a single Ag—Pd conductor layer including a smaller amount of glass fritts according to a required quality. Furthermore, it may be possible to use other conductors, such as Ag or Ag—Pt.

Subsequently, in a polarizing process M4, a polarizing conductor (N4761 commercially available from Shoei Chemical) is applied on the entire surfaces of the front and rear faces X1 and X2 of the PZT plate and is dried at 100° C. for 10 minutes. Subsequently, the dried PZT plate with the polarizing conductor is soaked in silicone oil at 120° C., applying 5 kV DC voltage between the front and rear faces X1 and X2 of the PZT plate. As a result, the PZT plate is polarized in an X-axis direction normal to the front and rear faces thereof. After finishing the polarizing process, the used polarizing conductor is removed off the faces of the PZT plane by using appropriate organic solvent such as acetone.

Figure 36A:
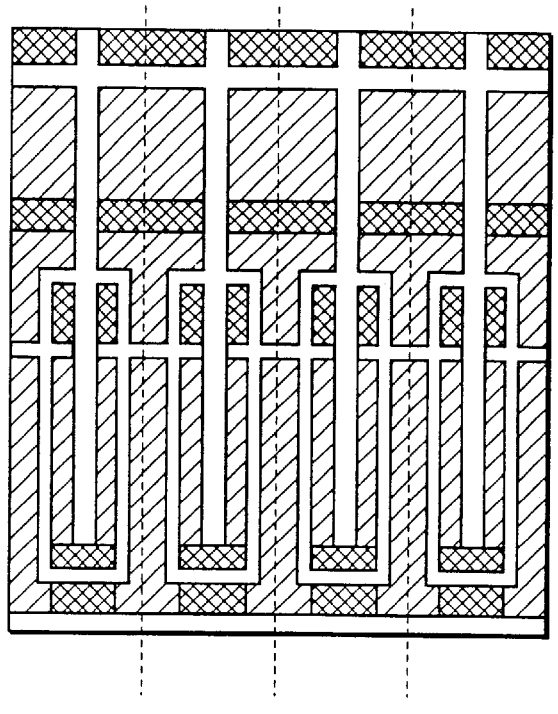

Next, in a cutting process M5, the PZT plate is cut by a slicer along dotted lines shown in FIG. 36A, so as to leave cut surfaces serving as side faces Y1 and Y2 of the vibrator 201. According to this embodiment, each cut piece of the PZT plate has a size of 20 mm×4.6 mm. In the arrangement of FIG. 36A, it is possible to provide marginal regions at both right and left sides so as to increase the total number of cutting lines and form the rightmost and leftmost pieces having cut side faces.

Figure 36B:
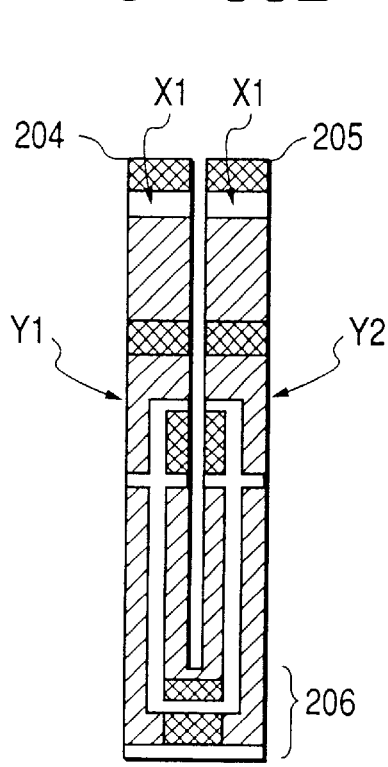

Next, a predetermined centrally and longitudinally extending portion is cut out by the slicer to form the slit having a width of 0.6 mm. This slit provides a Y-axis clearance between the left arm bar 204 and the right arm bar 205. Accordingly, the front face X1, rear face X2, side faces Y1 and Y2 are formed together with the electrodes formed on their faces, as shown in FIG. 36B. It is possible to perform the above-described cutting process M5 prior to the polarizing process M4.

Figure 36C:
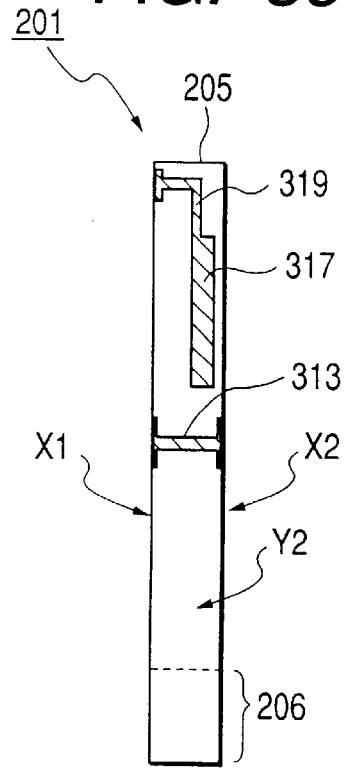

Finally, in a side electrode print and hardening process M6, the resinated silver conductor (e.g., LS-504J commercially available from Asahi Chemical) is printed on the side faces Y1 and Y2 at portions (hatched portions in FIG. 36C) corresponding to the electrodes 312, 313, 318 and 319 formed on these side faces Y1 and Y2. In the formation of these electrodes 312, 313, 318 and 319, a sufficient amount of resinated silver conductor is applied to the corner ridgeline E so that part of silver conductor sags along the neighboring front face X1 or rear face X2. Thus, the overlapped connection of the electrodes can be formed as explained with reference to FIG. 33.

After finishing the above-described printing operation, the electrodes are dried at 150° C. for forming the angular velocity sensing electrodes 316, 317, the short-circuit electrodes 312, 313 and the lead electrodes 318, 319, each having a thickness of 14 μm. Thus, the vibrator 201 is accomplished. The fabricated vibrator 201 is securely fixed to the base plate 202 via the supporter 203. Then, the electrodes formed on the vibrator 201 are connected to the terminals on the base plate 202 via lead wires, thereby accomplishing an angular velocity sensor.

As described previously, the resinated silver conductor used in the side electrode print and hardening process M6 comprises the ball and flake silver particles mixed in a phenol resin. This is advantageous in that an adequate electric conductivity is obtained through a connection between ball and flake silver particles. In other words, both the bonding strength and the electric conductivity can be satisfied simultaneously. The PZT ceramics has a smaller thermal expansion coefficient. A deterioration of the electrodes due to a thermal expansion difference will be suppressed even when the resinated silver conductor is connected to the PZT ceramics. In general, a larger contact resistance of the conductor will vary the phase of current due to the electrostatic capacity of the vibrator 201. This gives an adverse effect to the sensor characteristics. In this respect, it is preferable to use a conductor having an excellent electric connection.

Furthermore, the resinated silver conductor has a lower hardening temperature equivalent to 150° C. This is advantageous in that the polarization of the PZT ceramics is not adversely influenced by the heat applied when the resinated silver conductor is hardened.

The viscosity of the resinated silver conductor is 35 Ps·s and a viscosity ratio (i.e., a ratio of 1 rpm to 100 rpm at a viscometer) is 3.0. Regarding a screen, a mesh size is #250 and an emulsion thickness is 10 $\mu$m.

A print sagging amount increases with decreasing paste viscosity. If necessary, a paste injection amount can be adjusted by controlling the screen and print conditions, such as squeegee attach angle (i.e., an angle between the squeegee and the screen). However, it is difficult to control a sagged portion having a predetermined film thickness.

According to this embodiment, the above-described conditions are decided so as to satisfy boh the film thickness and the sagging amount considering every properties of the paste.

The formation of the electrode at the corner ridgeline E realized according to the above-described manufacturing method will be further explained with reference to FIG. 33. After the Ag—Pd conductor is printed and sintered on the X1 and X2 faces of the PZT plane, the PZT plane is cut into a tuning fork shape. This cutting operation removes any print sagging which may extend from the front X1 or rear face X2 to the side face Y1 or Y2 via the corner ridgeline E.

Next, the resinated silver conductor is printed on the side face Y2 as the lead electrode 319. Due to controlled viscosity of the resinated silver conductor, a print sagging is caused along the pad sensing electrode 310 formed on the front face X1 with an overlap length L. A cut surface R, formed at an edge of the pad sensing electrode 310, assures a thickness of the resinated silver conductor in the overlapped region. Then, through a hardening operation, the lead electrode 319 is integrated with the pad sensing electrode 310 along the cut surface R and the overlap region.

With this arrangement, the electrode connecting portion having a sufficient thickness is formed at and near the corner ridgeline E. This assures an adequate conductivity at the corner ridgeline E, preventing the electrical connection from being deteriorated (e.g., wire breaking or crack generation) due to vibrations of the tuning fork. Thus, it becomes possible to provide an angular velocity sensor which is excellent in quality.

In general, the lead electrode 319 is thinned at a region corresponding to an edge T of the cut surface R. However, according to the electrode connecting arrangement of this embodiment, an electrical connection is sufficiently maintained along the cut surface R. Thus, it becomes possible to reliable angular velocity sensor.

This embodiment adopts the electrode connecting arrangement shown in FIG. 33 at every corner ridgeline E, realizing a durable and reliable electric connection for the electrodes.

Furthermore, according to this embodiment, the piezoelectric body is cut into separate pieces after the predetermined electrode pattern is formed on the front and rear faces thereof as shown in FIG. 36A. This makes it possible to realize a simultaneous electrode formation on the front and rear faces X1 and X2 of numerous vibrators. This is effective for realizing a mass production.

Figure 32C:
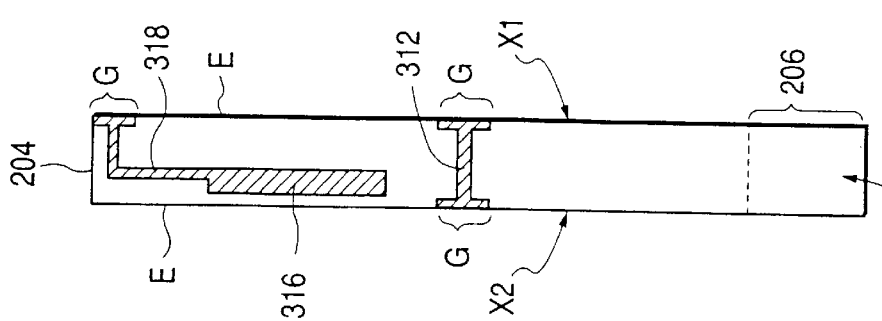

Moreover, according to this embodiment, the short-circuit electrodes 312, 313 and the lead electrodes 318, 319 are widened at the corner ridgelines E as shown in FIGS. 32C and 32D. This increases an area of the electric connecting portion at each corner ridgeline E. The reliability of the angular velocity sensor is further increased.

Especially, the lead electrodes 318 and 319 cannot be widened so freely because electric charges of lead electrodes 318 and 319 possibly deteriorate the sensitivity of the angular velocity sensor. In addition, a wider lead electrode will receive electric noises from the drive electrodes 301 and 302. Providing the widened portion only at the corner ridgeline E is effective to prevent the area of each lead wire from increasing undesirably.

Seventh Embodiment

Figure 37:
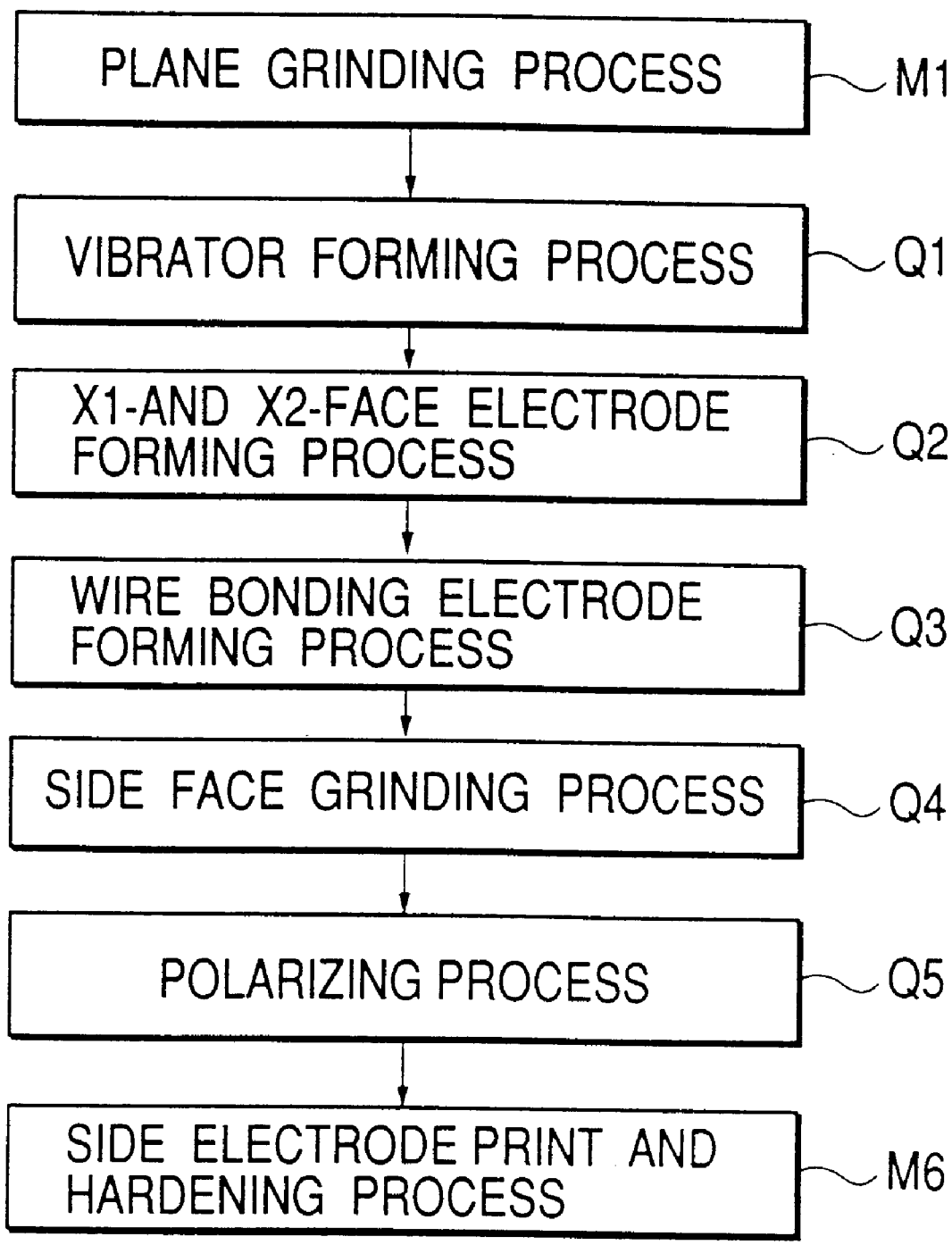
FIG. 37 is a flowchart showing another manufacturing method of a vibrator in accordance with a seventh embodiment of the present invention.

Next, another manufacturing method for fabricating the vibrator 201 and the electrodes formed on the faces thereof will be explained with reference to a manufacturing procedure shown in FIG. 37.

First, sintered PZT ceramics is prepared as a rectangular plate of 22 mm×22 mm×2.5 mm in the same manner as the above-described sixth embodiment. In a plane grinding process M1, the PZT ceramic plate is grinded by a plane lapping machine to form a thinner plate having a thickness of 2.17 mm. The resultant PZT plate is cut at opposing sides to form parallel edges spaced by a clearance of 20 mm.

Next, a vibrator forming process Q1 is performed in the same manner as the cutting process M5 of the sixth embodiment. More specifically, the PZT plate is cut by a slicer along a predetermined contour of the vibrator 201, forming cut surfaces serving as the side faces Y1 and Y2 perpendicular to the front face X1 and the rear face X2. Next, a predetermined centrally and longitudinally extending portion is cut out by the slicer to form the slit having a width of 0.6 mm. This slit provides a Y-axis clearance between the left arm bar 204 and the right arm bar 205. Thus, a piezoelectric body (i.e., PZT ceramics) having the faces X1, X2 and Y1, Y2 is accomplished.

Next, an X1- and X2-face electrode forming process Q2 is performed. More specifically, a first Ag—Pd conductor film (CLP56486 commercially available from Sumitomo Metal Mining) is printed at predetermined portions corresponding to respective electrodes on the front and rear faces of the PZT body. The printed Ag—Pd conductor film is sintered at a temperature of 850° C. to form an electrode film of 10 $\mu$m. Thus, the electrodes 301–306, 309, 310 are formed on the front face X1, while the common electrode 311 is formed on the rear face X2 in the same manner as the above-described sixth embodiment.

Next, a wire bonding electrode forming process Q3 is performed. A second Ag—Pd conductor film (CLP38287 commercially available from Sumitomo Metal Mining) is printed at redetermined portions corresponding to the wire bonding electrodes on the first electrode layer. The printed Ag—Pd conductor film is sintered at a temperature of 850° C. to form an electrode having a thickness of 10 $\mu$m, thereby forming the wire bonding electrodes 301$a$, 302$a$, 303$a$, 304$a$, 305$a$, 306$a$, 309$a$ and 310$a$. The printing conditions in the electrode forming processes Q2 and Q3 are identical with those of the abovedescribed sixth embodiment.

In the above-described X1- and X2-face electrode forming process Q2, a print sagging of the first Ag—Pd conductor film is caused at a corner ridgeline E' (refer to an upper part of FIG. 38) formed by the front face X1 (or rear face X2) and the cut surface. The thickness of this first Ag—Pd conductor film is reduced in the vicinity of the corner ridgeline E' due to print sagging. As shown in FIG. 38, when the pad sensing electrode 310 is printed, a leading end of the print sagging extends along the cut surface.

Next, a side face grinding process Q4 is performed. The piezoelectric body is polished by a grindstone or a file for forming the side faces Y1 and Y2. A predetermined edge portion, corresponding to a Y-axis thickness U (e.g., 40 $\mu$m) from the corner ridgeline E', is removed through this polishing operation. At the same time, the thin portion of the pad sensing electrode 310 is removed. Thus, it becomes possible to provide an electrode having a satisfactory thickness at the corner ridgeline E as shown in a lower part of FIG. 38.

Subsequently, a polarizing process Q5 is performed. A polarizing conductor (N4761 commercially available from Shoei Chemical) is applied on the entire surfaces of the front and rear faces X1 and X2 of the PZT body and is dried at 100° C. for 10 minutes. Subsequently, the dried PZT body with the polarizing conductor is soaked in silicone oil at 120° C., applying 5 kV DC voltage between the front and rear faces X1 and X2 of the PZT body. As a result, the PZT body is polarized in an X-axis direction normal to the front and rear faces thereof. After finishing the polarizing process, the used polarizing conductor is removed off the faces of the PZT body by using appropriate organic solvent such as acetone.

Finally, the side electrode print and hardening process M6 is performed in the same manner as the above-described sixth embodiment. Namely, the resinated silver conductor (e.g., LS-504J commercially available from Asahi Chemical) is printed on the side faces Y1 and Y2 at portions corresponding to the electrodes 312, 313, 318 and 319 formed on these side faces Y1 and Y2. In the formation of these electrodes 312, 313, 318 and 319, a sufficient amount of resinated silver conductor is applied to the corner ridgeline E so that part of silver conductor sags along the neighboring front face X1 or rear face X2. Thus, the overlapped connection of the electrodes can be formed as explained with reference to FIG. 33. Thus, the vibrator 201 is accomplished.

According to this embodiment, after the electrodes are formed on the front face X1 and the rear face X2 on the piezoelectric body, the both sides of the piezoelectric body are polished to form the side faces Y1 and Y2. This is effective to remove a thinned electrode edge portion as explained with reference to FIG. 38. Accordingly, it becomes possible to provide an electrode having a satisfactory thickness at the corner ridgeline E. The electrode connecting portion having a sufficient thickness is formed at and near the corner ridgelne E. This assures an adequate conductivity at the corner ridgeline E, preventing the electrical connection from being deteriorated (e.g., wire breaking or crack generation) due to vibrations of the tuning fork. Thus, it becomes possible to provide an angular velocity sensor which is excellent in quality.

It is needless to say, the above-described manufacturing methods of the sixth and seventh embodiments can be applied to a vibrator having only one arm bar. In short, these manufacturing methods can be employed for providing an electric connection between electrodes formed on neighboring faces of the polygonal piezoelectric body.

Eighth Embodiment

An eighth embodiment of the present invention provides another manufacturing for an angular velocity sensor. A detailed electrode connecting arrangement at each corner ridgeline E will be explained based on a representative connection between the pad sensing electrode 310 and the lead electrode 319 with reference to an enlarged view shown in FIG. 39 similar to FIG. 33.

Figure 39:
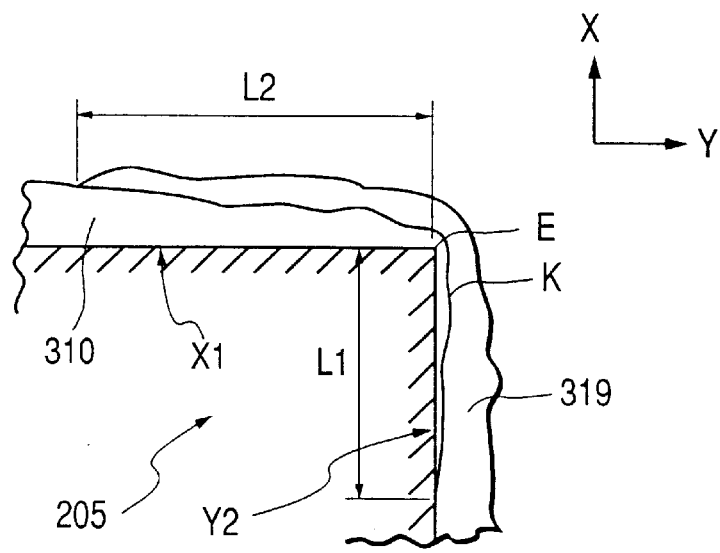
FIG. 39 is an enlarged cross-sectional view illustrating an electrode connection is accordance with an eighth embodiment of the present invention.

As shown in FIG. 39, the pad sensing electrode 310 provided directly on the front face X1 over the corner ridgeline E extends along the side face Y2. On the other hand, the lead electrode 319 provided on the side face Y2 extends over the corner ridgeline E onto an upper surface of the pad sensing electrode 310 formed on the front face X1. In this manner, the pad sensing electrode 310 and the lead electrode 319 are overlapped in the vicinity of the corner ridgeline E so as to form an overlapped connecting portion K defined by a X-axis overlap length L1 and a Y-axis overlap length L2. The X-axis overlap length L1 represents an overlap length in the X-axis direction from the corner ridgeline E, while the Y-axis overlap length L2 is an overlap length in the Y-axis direction from the corner ridgeline E. For example, the X-axis overlap length L1 is 30 $\mu$m and the Y-axis overlap length L2 is 40 $\mu$m. According to the inventors, it is preferable that both of the X-axis overlap length L1 and the Y-axis overlap length L2 are equal to or larger than 20 $\mu$m.

In the same manner as the above-described sixth embodiment, the electrodes 312, 313, 318 and 319 formed on the side faces Y1 and Y2 have widened portions G at the corner ridgelines E (refer to FIGS. 32C and 32D). The outer periphery, other than the region connected to the widened portion G, of each electrode formed on the front face X1 and the rear face X2 is spaced inward from the corner ridgeline E with a predetermined offset clearance. This offset clearance is equal to or larger than 0.05 mm which is required for preventing a creeping discharge along the side faces Y1 and Y2 during a later-described polarizing process.

Figure 40:
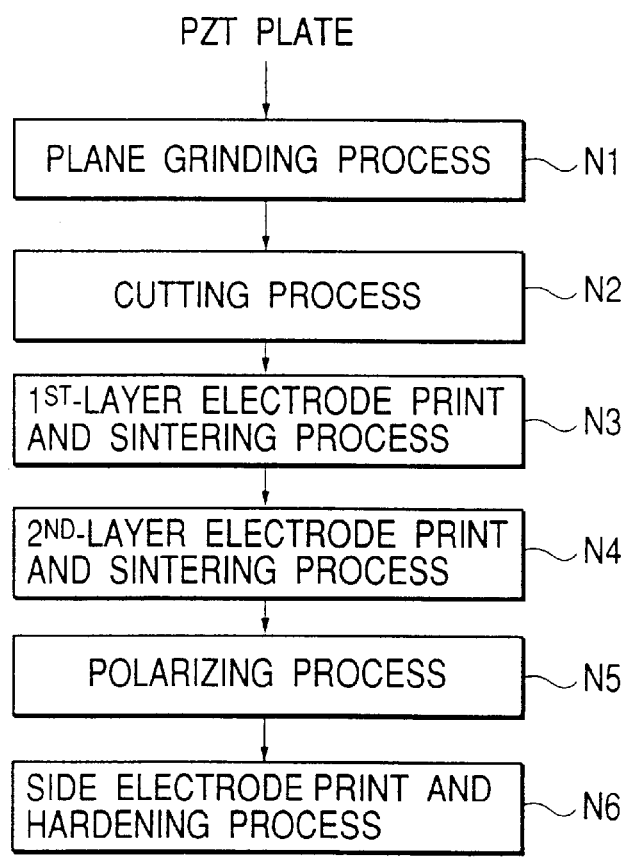
FIG. 40 is a flowchart showing a manufacturing method of a vibrator in accordance with the eight embodiment of the present invention.

Next, a manufacturing method of the eighth embodiment will be explained with reference to a flowchart shown in FIG. 40.

Figure 41A:
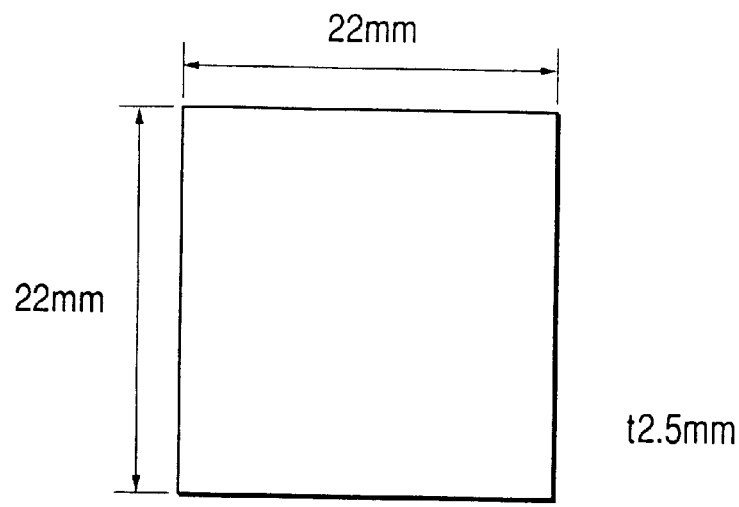
FIGS. 41A through 41C are views illustrating a cutting operation of a piezoelectric plate in accordance with the eight embodiment of the present invention.
Figure 41B:
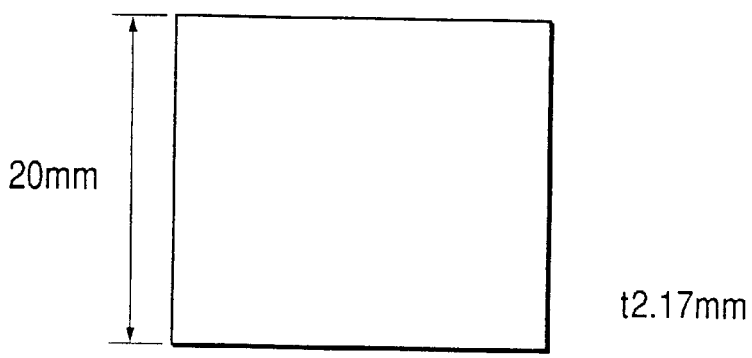

First, sintered PZT ceramics is prepared as a rectangular plate of 22 mm×22 mm×2.5 mm as shown in FIG. 41A. In a plane grinding process N1, the PZT ceramic plate is grinded by a plane lapping machine to form a thinner plate having a thickness of 2.17 mm. Next, the resultant PZT plate is cut at opposing edges to form parallel edges spaced by a clearance of 20 mm. Thus, a PZT plate (i.e., piezoelectric body) is formed as shown in FIG. 41B.

Figure 41C:
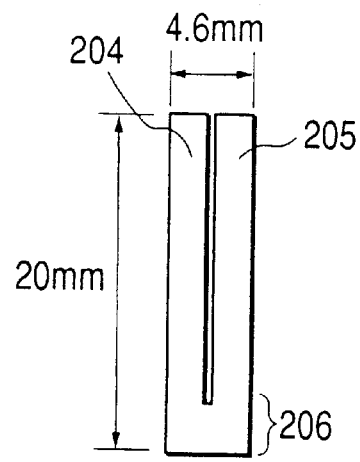
Figure 43:
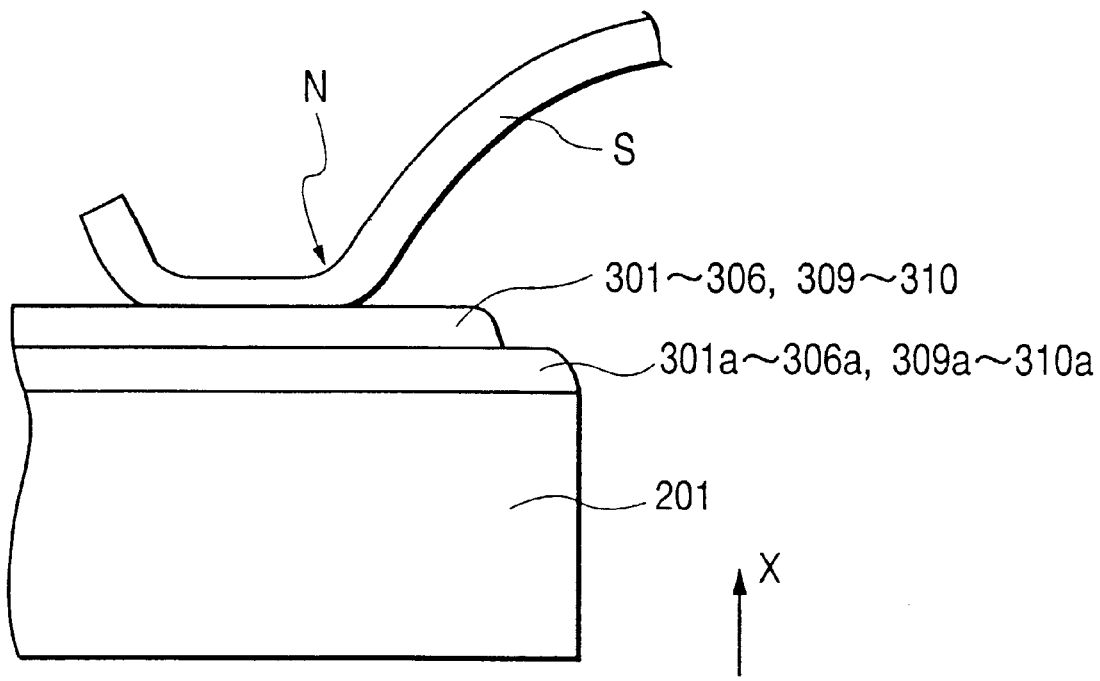
FIG. 43 is a detailed wire bonding arrangement in accordance with a ninth embodiment of the present invention.

Next, in a cutting process N2, the PZT plate is cut by a slicer along so as to leave cut surfaces serving as side faces Y1 and Y2 of the vibrator 201. According to this embodiment, each cut piece of the PZT plate has a size of 20 mm×4.6 mm. Next, a predetermined centrally and longitudinally extending portion is cut out by the slicer to form the slit having a width of 0.6 mm. This slit provides a Y-axis clearance between the left arm bar 204 and the right arm bar 205, as shown in FIG. 41C.

Next, in a first-layer electrode print and sintering process N3, a first Ag—Pd conductor film (CLP56486 commercially available from Suriitomo Metal Mining) is printed at predetermined portions corresponding to respective electrodes (hatched portions in FIG. 42A) on the front and rear faces X1 and X2 of the PZT body.

In this case, the first Ag—Pd conductor film is printed entirely along the corner ridgeline E only at the region connected to the widened portions G of the short-circuit electrodes 312, 313 and the lead electrodes 318, 319. Thus, a print sagging of the first Ag—Pd conductor film is formed over the corner ridgeline E so as to extend along the side face Y1 or Y2 at the widened portion G. Meanwhile, to prevent the creeping discharge along the side faces Y1, Y2 during the later-described polarizing process, the edge line of the first Ag—Pd conductor film printed on the front face X1 or rear face X2 is positioned inward than the corner ridgeline E with the offset clearance equal to or larger than 0.05 mm. 10 Then, the printed Ag—Pd conductor film is sintered at a temperature of 850° C. to form an electrode film of 10 μm. Accordingly, the electrodes 301–306, 309, 310 are formed on the front face X1 and the common electrode 311 is formed on the rear face X2, with the above-described sagging portions extending over the corner ridgelines E to the side faces Y1, Y2.

Next, in a second-layer electrode print and sintering process N4, a second Ag—Pd conductor film (CLP38287 commercially available from Sumitomo Metal Mining) is printed at redetermined portions corresponding to the wire bonding electrodes (cross-hatched portions in FIG. 42B) on the first electrode layer. The printed Ag—Pd conductor film is sintered at a temperature of 850° C. to form an electrode having a thickness of 10 μm. As a result, an overall electrode thickness is increased to 20 μm at the portion corresponding to the wire bonding electrode.

In the printing operation for these first and second Ag—Pd conductor films, the viscosity of the conductor paste was 200 Ps·s and a viscosity ratio (i.e., a ratio of 1 rpm to 100 rpm at a viscometer) was 1.5. A mesh size of a used screen was #250. And, an emulsion thickness was 10 μm.

The formation of the second-layer Ag—Pd conductor film is related to a wire bonding for aluminum wires to be connected between the vibrator 201 and the drive/sensing circuit. The bonding strength and durability of the aluminum wires can be improved by providing the second-layer Ag—Pd conductor film. More specifically, to secure a satisfactory connection to the PZT, the first layer is made of a conductor including a relatively large amount of glass fritts. On the other hand, to secure a satisfactory connection to the wire, the second layer is made of a conductor including no glass fritts. However, it may be possible to provide a single Ag—Pd conductor layer including a smaller amount of glass fritts according to a required quality. Furthermore, it may be possible to use other conductors, such as Ag or Ag—Pt.

Subsequently, in a polarizing process N5, a polarizing conductor (N4761 commercially available from Shoei Chemical) is applied on the entire surfaces of the front and rear faces X1 and X2 of the PZT plate and is dried at 100° C. for 10 minutes. Subsequently, the dried PZT plate with the polarizing conductor is soaked in silicone oil at 120° C., applying 5 kV DC voltage between the front and rear faces X1 and X2 of the PZT plate. As a result, the PZT plate is polarized in an X-axis direction normal to the front and rear faces thereof. After finishing the polarizing process, the used polarizing conductor is removed off the faces of the PZT plane by using appropriate organic solvent such as acetone.

Finally, in a side electrode print and hardening process N6, the resinated silver conductor (e.g., LS-504J commercially available from Asahi Chemical) is printed on the side faces Y1 and Y2 at portions (hatched portions in FIG. 42C) corresponding to the electrodes 312, 313, 318 and 319 formed on these side faces Y1 and Y2. In the formation of these electrodes 312, 313, 318 and 319, a sufficient amount of resinated silver conductor is applied to the corner ridgeline E so that part of silver conductor sags along the neighboring front face X1 or rear face X2. Thus, the overlapped connection of the electrodes can be formed as explained with reference to FIG. 39.

After finishing the above-described printing operation, the electrodes are dried at 150° C. for forming the angular velocity sensing electrodes 316, 317, the short-circuit electrodes 312, 313 and the lead electrodes 318, 319, each having a thickness of 14 μm. Thus, the vibrator 201 is accomplished. The fabricated vibrator 201 is securely fixed to the base plate 202 via the supporter 203. Then, the electrodes formed on the vibrator 201 are connected to the terminals on the base plate 202 via lead wires, thereby accomplishing an angular velocity sensor.

As described previously, the resinated silver conductor used in the side electrode print and hardening process N6 comprises the ball and flake silver particles mixed in a phenol resin. This is advantageous in that an adequate electric conductivity is obtained through a connection between ball and flake silver particles. In other words, both the bonding strength and the electric conductivity can be satisfied simultaneously. The PZT ceramics has a smaller thermal expansion coefficient. A deterioration of the electrodes due to a thermal expansion difference will be suppressed even when the resinated silver conductor is connected to the PZT ceramics. In general, a larger contact resistance of the conductor will vary the phase of current due to the electrostatic capacity of the vibrator 201. This gives an adverse effect to the sensor characteristics. In this respect, it is preferable to use a conductor having an excellent electric connection.

Furthermore, the resinated silver conductor has a lower hardening temperature equivalent to 150° C. This is advantageous in that the polarization of the PZT ceramics is not adversely influenced by the heat applied when the resinated silver conductor is hardened.

The viscosity of the resinated silver conductor is 35 Ps·s and a viscosity ratio (i.e., a ratio of 1 rpm to 100 rpm at a viscometer) is 3.0. Regarding a screen, a mesh size is #250 and an emulsion thickness is 10 μm.

A print sagging amount increases with decreasing paste viscosity. If necessary, a paste injection amount can be adjusted by controlling the screen and print conditions, such as squeegee attach angle (i.e., an angle between the squeegee and the screen). However, it is difficult to control a sagged portion having a predetermined film thickness.

According to this embodiment, the above-described conditions are decided so as to satisfy boh the film thickness and the sagging amount considering every properties of the paste, thereby forming the above-described overlapped connecting portion K.

According to this embodiment, a first sagging portion is formed so as to extend from the front or rear face X1, X2 to the side face Y1, Y2 over the corner ridgeline E in the above-described first-layer electrode print and sintering process N3. Subsequently, a second sagging portion is formed so as to extend oppositely from the side face Y1, Y2 to the front or rear face X1, X2 over the corner ridgeline E in the above-described second-layer electrode print and sintering process N4. As a result, the overlapped connecting portion K having an overall length=L1+L2 is formed in the vicinity of the corner ridgeline E, as shown in FIG. 39. The overlapped connecting portion K bridges or straddles two neighboring faces. This is effective to provide an enforced and durable electrode connection at the corner of each arm bar 204, 205 of the vibrator 201. Furthermore, it is preferable that each arm bar 204, 205 is chamferred along the corner ridgeline E.

Ninth Embodiment

A ninth embodiment of the present invention will be explained with reference to FIGS. 43 through 49B.

The ninth embodiment discloses a detailed arrangement of the double-layer construction (enlarged in FIG. 43) of the above-described electrodes 301–306 and 309-310 formed on the front face X1 of the vibrator 201. The detained arrangement described hereinafter is based on the research conducted on an aluminum lead wire S of φ=30, although a preferable range of the lead wire S is equal to or smaller than 50 μm as described in the above-described embodiment.

According to the electrode connecting arrangement of this embodiment, a Pd containing silver thick film (an Ag—Pd thick film) is used for obtaining a sufficient connecting connection. Advantages using the Ag—Pd thick film are as follows.

①The Ag—Pd thick film has smaller surface roughness. ②The Ag—Pd thick film contains a very few amount (less than 1 weight %) of inorganic oxide, such as glass, which is not preferable for the connection to the second-layer electrode connected to the lead wire S. ③An addition of Pd is effective to suppress a diffusion between Ag and Al which advances in a high-temperature environment, preventing the deterioration in the bonding strength.

To attain the first factor ①, silver powder has an average particle diameter of 0.1–2 μm. And, Pd is coated on the surface of silver powder. This coating suppresses the particle growth of Ag during a sintering operation. According to this embodiment, an average surface roughness (Rz) is set to 3 μm as a preferable surface roughness for a thin wire having a diameter equal to or smaller than φ=50 μm. Thus, a smoothed bonding surface is obtained.

Next, the second factor ② will be explained. When a Pd containing silver thick film is formed on a piezoelectric body, an Ag—Pd conductor paste is applied on a surface of the piezoelectric body by a screen printing. The printed Ag—Pd conductor paste is hardened by sintering. The Ag—Pd conductor paste contains glass powder or inorganic oxide powder (hereinafter, referred to as glass or the like) which are melted during the sintering operation. A meltable glass additive or the like is effective to improve the connection between the piezoelectric body and an electrode conductor. However, an excessive amount of glass additive or the line will cause an undesirable deformation of the piezoelectric body during the sintering operation. Furthermore, the presence of inorganic molecules of glass or the like is not preferable for the ultrasonic wire bonding connection between the lead wire S and an electrode, because the ultrasonic wire bonding depends on an interatomic connection between metals.

Accordingly, this embodiment uses a first-layer electrode made of an Ag—Pd thick film containing glass and a second-layer electrode made of an Ag—Pd thick film containing substantially no glass (less than 1 weight %). Needless to say, it is preferable that the second-layer electrode contains no glass (0 weight %).

The Ag—Pd thick film constituting the first-layer electrode contains a glass component by a weight ratio of 1–15%. When the glass amount is excessively large, there is a possibility that the vibrator 201 may deflect when the thick film is sintered. This is not desirable because the vibrator 201 cannot vibrate accurately in a predetermined drive direction (i.e., Y-axis direction in this embodiment). As a result, unnecessary noises will be detected. Thus, increasing the glass amount excessively is not desirable. However, when the glass amount is smaller than 1%, it becomes impossible to secure a sufficient bonding strength between the PZT ceramics and the Ag—Pd thick film. Accordingly, a preferable range of the glass content to the first-layer Ag—Pd thick film is in a range of 1–15% by the weight ratio. Needless to say, glass can be replaced by inorganic oxide.

An overall film thickness is equal to or larger than 10 μm at a wire bonding portion constituting the double-layer construction. If the film thickness is smaller than 10 μm, there is a possibility that the thick film may be broken when subjected to an ultrasonic power of the wire bonding operation. Furthermore, it is necessary to suppress the film thickness of each layer within 20 μm. In other words, the overall film thickness at the wire bonding portion needs to be equal to or smaller than 40 μm. If each film thickness is larger than 20 μm, there is a tendency that the internal stress may cause not uniformly in the film during the dry and sintering operation of a printed thick film. This unbalanced internal stress will result in a crack appearing on the electrode surface. Each electrode easily causes undulations on its surface. This possibly reduces the surface roughness.

In view of the foregoing, this embodiment uses the first-layer and second-layer electrodes each having a film thickness of 5 μm to 20 μm. The total film thickness, i.e., a summed-up thicknesses of the first-layer and second-layer electrodes, at the wire bonding portion is in a range of 10 μm to 40 μm. Thus, it becomes possible to prevent the thick film from being broken by the ultrasonic power of a wire bonding operation, prevent the electrode surface from causing a crack during the thick film print and sintering operation, and realize a preferable surface roughness (Rz is equal to or smaller than 3 μm).

To check the bonding reliability of the lead wire S formed according to this embodiment, a durability test was conducted.

More specifically, a plurality of test samples used in this durability test are Ag—Pd conductors having different weight ratios of Ag/Pd=98/2, 95/5, 92/8, 90/10, 80/20, 70/30. In addition to the above-described examples of this embodiment, a pure Ag conductor was prepared as a comparative test example. Thus, a total of seven (six examples of this embodiment and one comparative example) test samples were prepared. Every test example included no glass fritts. In each Ag/pd conductor, silver powder had a particle diameter in a range of 0.1 λm to 0.5 μm. The silver power was coated by Pd.

Each test sample, as the second-layer electrode, was printed and sintered on a first-layer electrode having a weight ratio of Ag/Pd=80/20 with 15% glass, to prepare seven different vibrator samples.

An aluminum lead wire of φ=30 μm (including 1% Si for maintaining the shape) was wire bonded by an automatic ultrasonic wire bonding device to form the lead wire S.

Each wire bonded test sample was contained in a hermetic sealed package, and subjected to a high-temperature operational durability test at 85° C. In each test operation, the vibrator sample vibrated at a characteristic frequency (=approximately 3.2 kHz) with an amplitude of 8 μm at the distal end (corresponding to the pad sensing electrodes 309, 310) of each arm bar 204, 205. The amplitude of the vibration is an absolute value from one side peak to the other side peak. The selected test temperature 85° C. corresponds to an upper limit in an operation of the sensor. As described above with respect to the factor ③, the diffusion between Ag and Al easily advances at a higher temperature.

Figure 44:
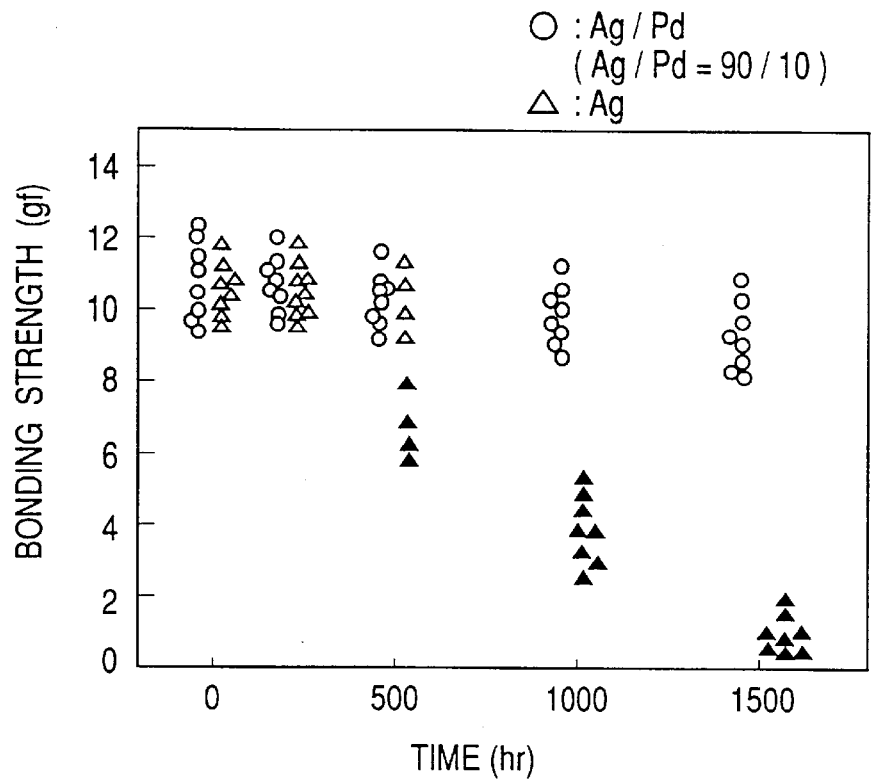
FIG. 44 is a graph showing bonding strength changes of various test samples in accordance with the ninth embodiment of the present invention.
Figure 45:
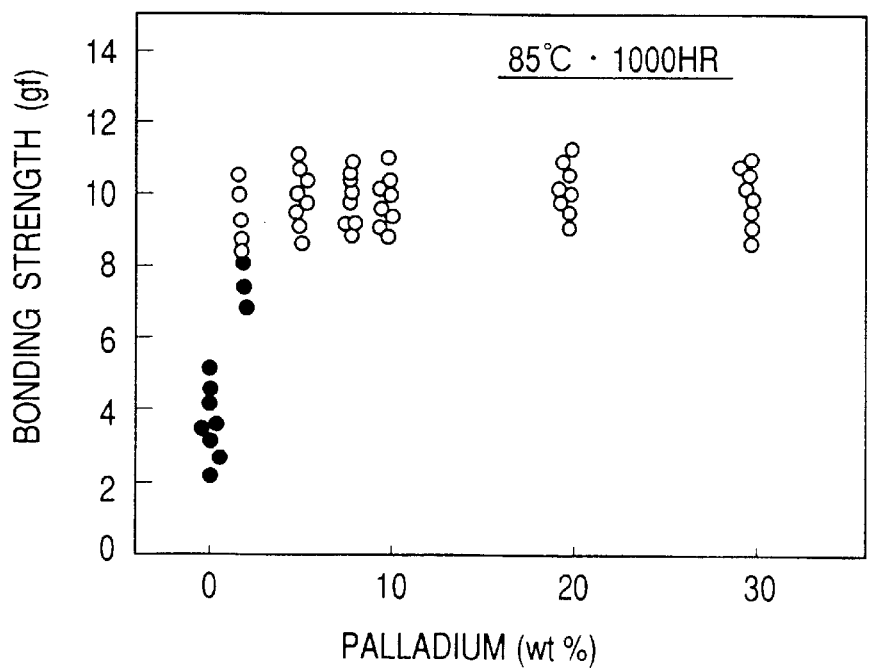
FIG. 45 is a graph showing a bonding strength in relation to a palladium content in each test sample in accordance with the ninth embodiment of the present invention.

FIGS. 44 and 45 are graphs showing test data obtained through the conducted durability test. FIG. 44 shows a change of the bonding strength (ordinate; gf) in relation to an elapse of time (abscissa; hour) in a comparison between the Ag—Pd conductor sample (Ag/Pd=90/10) and the pure Ag conductor sample (Ag=100). In FIG. 44, ○ marks represent the data of the Ag—Pd conductor sample, while ▼ and △ marks represent the data of the pure Ag conductor.

To measure the bonding strength, each lead wire S was pulled by a tensile testing machine. The lead wire S was cut at the neck portion N shown in FIG. 43 (referred to as a neck-cutting mode corresponding to ○ and marks shown in FIG. 44). Otherwise, the lead wire S was peeled off the second-layer electrode (referred to as a peeling-off mode corresponding to ▼ marks shown in FIG. 44). Each bonding data represents a tensile load measured at a moment the lead wire S was cut or peeled off.

FIG. 45 shows a dependency of Pd with respect to the bonding strength, with an ordinate representing the bonding strength (gf) and an abscissa representing a palladium weight amount (wt %) in the second-layer Ag—Pd electrode. The selected palladium weight amounts were 0, 2, 5, 8, 10, 20 and 30 wt %. The bonding strength (gf) was measured after a 1,000 hour operation at 85° C. In FIG. ● marks represent the peeling-off mode data while ○ marks represent the neck-cutting mode data.

In a test of the pure Ag conductor, the bonding strength of the lead wire was reduced at least partly after an elapse of 500 hours. The peeling-off mode (▼ marks) was recognized. After an elapse of 1,000 hours, the bonding strength was largely reduced. All of the tested lead wires were peeled off. On the other hand, the electrode samples including Pd additive of 5–30 weight % were durable even after an elapse of 1,000 hours, without causing any substantial reduction in the bonding strength. No lead wires were peeled off.

According to the data shown in FIG. 44, the bonding strength in the neck-cut mode is slightly reduced with increasing time. This is believed that the strength of the neck portion N itself was weakened under a high-temperature environment. In other words, the recognized decline of the bonding strength is not directly related to the actual bonding strength between the lead wire and the electrode.

According to an observation through a scanning electronic microscopic (SEM) analysis, the surface of the electrode was peeled off together with the lead wire in the above-described durable test. Furthermore, through an Auger element analysis, it was found that a substance adhering on the lead wire was a diffusion layer of Ag and Al.

In view of the foregoing, it is believed that the peeling-off phenomenon of the lead wire or the reduction of the bonding strength is chiefly related to a growth of the weak difflusion layer which is generally impelled by a mutual diffusion between Ag and Al under a high-temperature environment.

Figure 46:
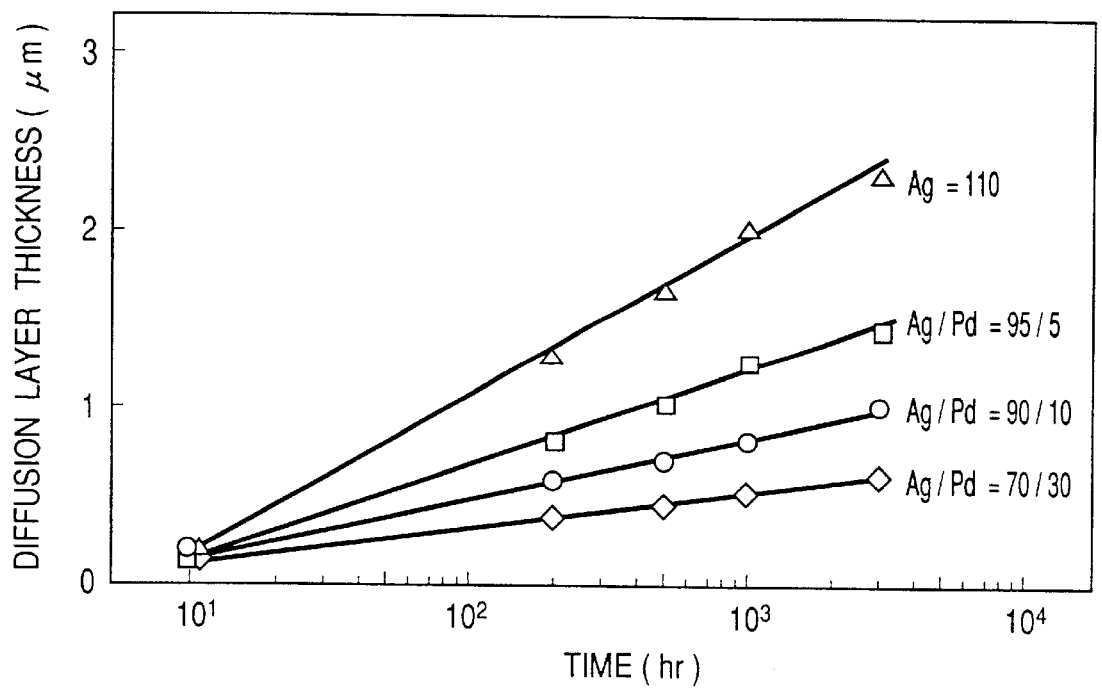
FIG. 46 is a graph showing a growth of a difflusion layer in each test sample in accordance with the ninth embodiment of the present invention.

An influence of Pd content given to the Ag—Al diffusion layer was checked in the above-described durability test. FIG. 46 shows the result. The tested Ag conductor samples contain the Pd additive by 0, 5, 10 and 30 weight %, respectively.

The growth of the diffusion layer advances with elapsing time. However, the growing speed of the diffusion layer was slow in each of the Ag—Pd conductor samples compared with the pure Ag conductor. The larger the Pd additive amount, the slower the diffusion layer grows.

Accordingly, as explained in the factor ③, an addition of Pd is effective to suppress the mutual diffusion between Ag and Al. As a result, the durability of the bonding portion is improved. In view of the foregoing, it is preferable that the second-layer electrode conductor contains the Pd additive by an amount equal to or larger than 5 wight %. Although FIGS. 44 and 45 show no data relating to conductor samples containing Pd exceeding 30 wight %, it is believed that resulting effects will be comparable with those of the conductor samples containing Pd of 5–30 eight %.

Regarding other properties, Pd has a melting point of approximately 1,555° C. while Ag has a melting point of approximately 960° C. An excessively large amount of Pd additive may give an adverse influence to the sintering of the electrode. Furthermore, Pd is expensive than Ag. Accordingly, a preferable range of the Pd additive is equal to or smaller than 50 weight %.

As described in this embodiment, the Ag—Pd conductor is used as the electrode material. This makes it possible to provide a piezoelectric vibrator and an angular velocity sensor having an electrode arrangement excellent in the bonding strength to the lead wire by the ultrasonic wire bonding.

Tenth Embodiment

Figure 47:
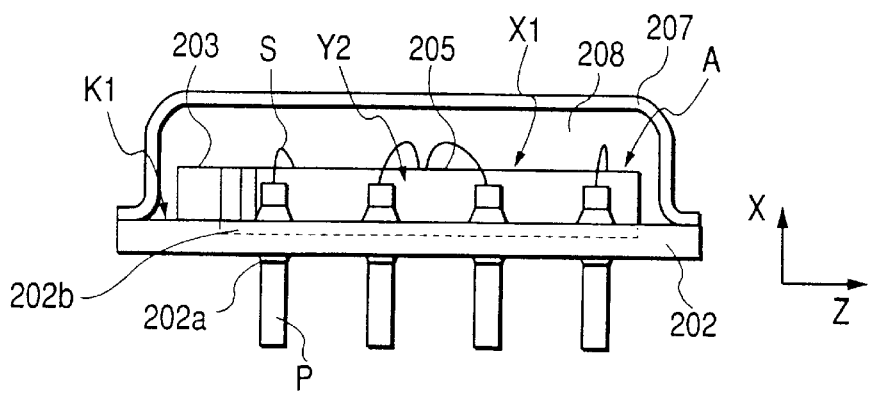
FIG. 47 is a side see-through view showing an angular velocity sensor in accordance with a tenth embodiment of the present invention.

FIG. 47 shows an arrangement of the tenth embodiment of the present invention. The tenth embodiment of the present invention is characterized in that the piezoelectric vibrator is exposed to a nitrogen atmosphere.

As shown in FIG. 47, a vibrator body A and the lead wire S are contained in a space 208 enclosed by the base plate 202 and the cover plate (i.e., shell) 207. Each terminal P is hermetically fixed to the base plate 202 by an insulating glass 202a. The lead wire S has one end bonded to the electrode formed on the vibrator body A and the other end bonded to the terminal P on the base plate 202, by ultrasonic wire bonding. The space 208, defined by the base plate 202 and the cover plate (i.e., shell) 207, is hermetically sealed and filled with nitrogen gas. The cover plate 207 is securely installed to the base plate 202 after finishing the connection of the lead wires S to the corresponding electrodes and terminals P.

The reason why nitrogen atmosphere is used for filling the space 208 is that an adequate bonding strength is obtained in the connection between the aluminum lead wire S and Ag—Pd electrode. Next, an influence brought by the nitrogen atmosphere in the connection between the aluminum lead wire S and Ag—Pd electrode will be explained in more detail.

First, the purpose of using the nitrogen atmosphere is to prevent the electrodes from being oxidized. However, through repetitive tests, the inventors found that the bonding strength vanres depending on the selection of the material used for the electrode which is connected to the lead wire S by the ultrasonic wire bonding.

The test samples used in the tests were two kinds of Ag—Pd conductors having different weight ratios. One Ag/Pd conductor was 80/20 and the other was 99/1. In the test, each conductor was connected with the lead wire S by the ultrasonic wire bonding. Then, each test sample was left in a high-temperature (380° C.) environment for a predetermined time (one hour, ten hours). Then, an ordinary tensile test was conducted to evaluate a bonding strength.

Figure 48A:
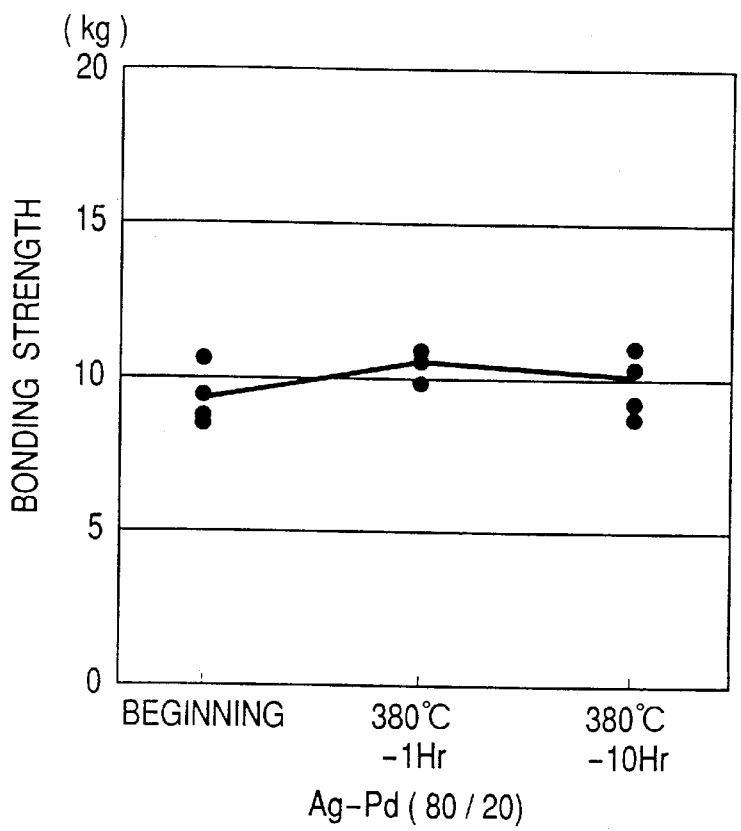
FIGS. 48A and 48B are graphs respectively showing a bonding strength change in a tested sample in accordance with the tenth embodiment of the present invention.
Figure 48B:
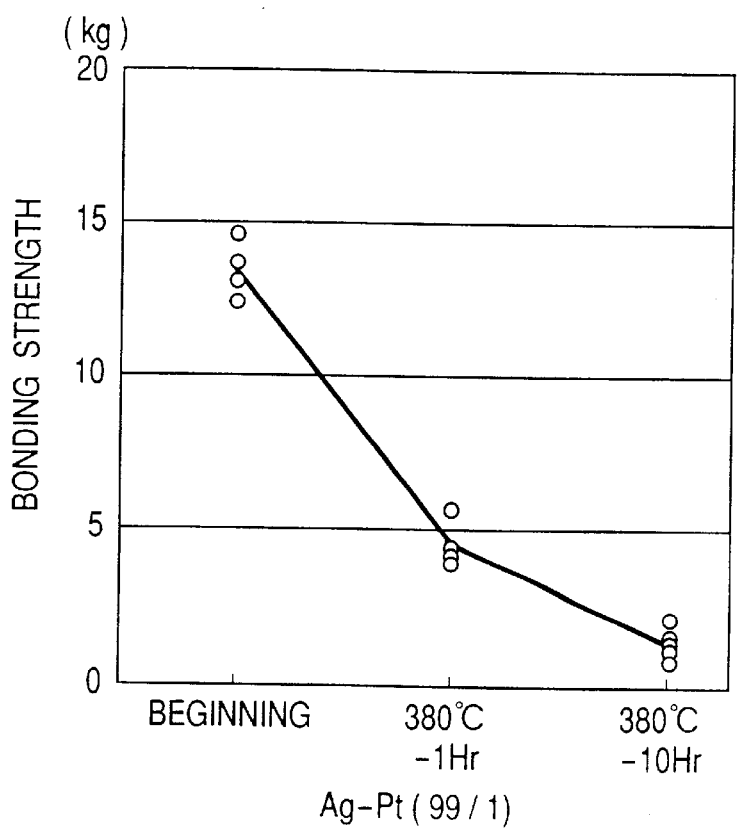

FIG. 48A shows a change of the bonding strength in an Ag—Pd conductor (80/20). FIG. 48B shows a change of the bonding strength in a Ag—Pt conductor (99/1). In each graph, an abscissa represents an elapse of time (hour) and an ordinate represents the bonding strength (kg) between the lead wire and the electrode. The Ag—Pt conductor contains a very few amount (1 weight %) of Pt. In this respect, the Ag—Pt conductor is substantially identical with the pure Ag.

As understood from FIG. 48A, in the case of the Ag conductor, the bonding strength was rapidly decreased in accordance with an elapse of time. On the other hand, as understood from FIG. 48B, the bonding strength was not changed in accordance with the elapse of time when the electrode material was the Ag—Pd conductor.

Figure 49A:
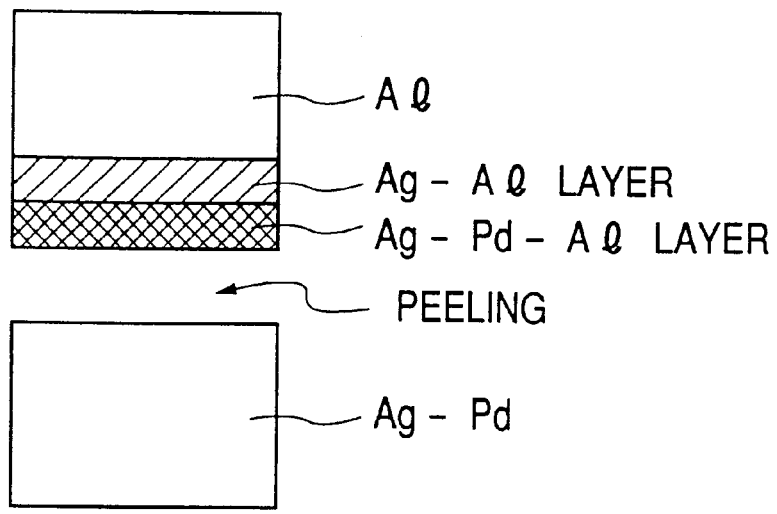
FIGS. 49A and 49B are views showing detailed peeled surfaces of the tested samples in accordance with the tenth embodiment of the present invention.

FIG. 49A shows detailed surfaces of the peeled Ag—Pd conductor. In this case, an Ag—Al diffusion layer (an alloy layer) and an Ag—Pd—Al diffusion layer (an alloy layer) were successively formed on the end of the Al lead wire. The peeling was recognized at the boundary between the Ag—Pd electrode and the Ag—Pd—Al diffusion layer.

Figure 49B:
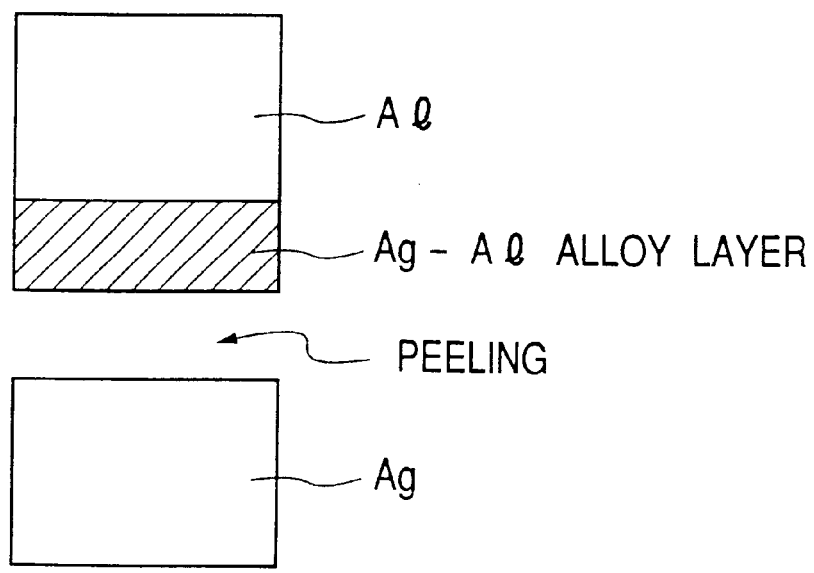

FIG. 49B shows detailed surfaces of the peeled Ag conductor. In this case, an Ag—Al diffusion layer (an alloy layer) was formed on the end of the Al lead wire. The peeling was recognized at the boundary between the Ag electrode and the Ag—Al diffusion layer.

From the observation result of the peeling phenomenon, the following conclusion will be derived.

In the case of the Ag conductor, the aluminum is directly connected with the Ag conductor in the beginning of the connection. This provides a relatively strong bonding force. However, in the nitrogen atmosphere, the Ag—Al diffusion layer gradually grows at the bonding surface. The bonding strength between this diffusion layer and the Ag conductor is weak. This is why the bonding force is weakened when subjected to the nitrogen atmosphere.

On the other hand, in the case of the Ag—Pd conductor, the Ag—Pd—Al diffusion layer is formed in addition to the Ag—Al diffusion layer at the bonding surface. The double diffusion layers thus formed can provide a strong bonding force in the connection to the aluminum wire and the Ag—Pd conductor. In other words, this is an advantage of using the Ag—Pd conductor as an electrode material because a strong bonding force is obtained by the Ag—Pd—Al difflusion layer formed by using the Ag—Pd conductor.

Accordingly, even when the vibrator body A is contained in the nitrogen atmosphere, the bonding strength of each Ag—Pd conductor electrode is not weakened.

Eleventh Embodiment

Figure 50:
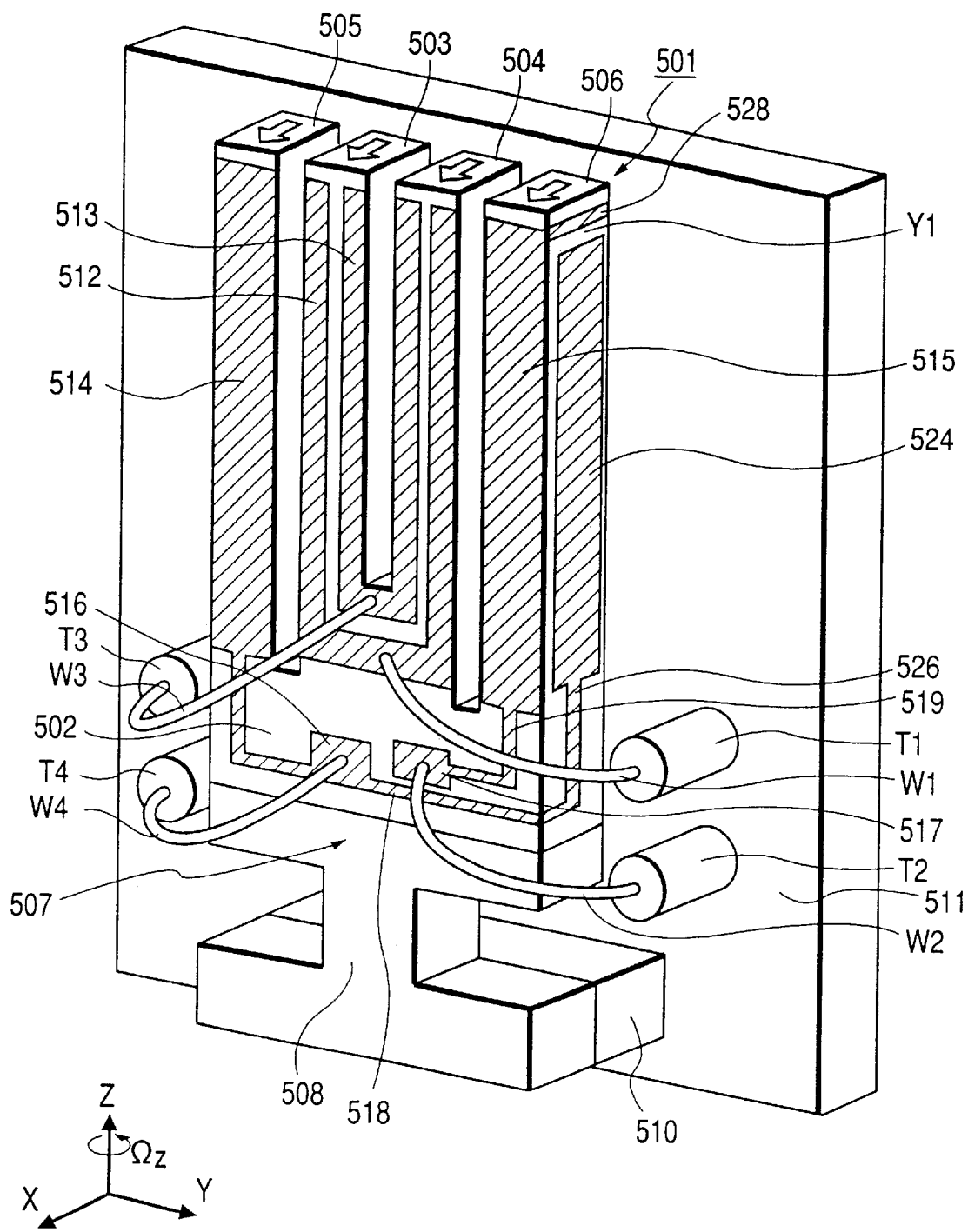
FIG. 50 is a perspective view showing an overall arrangement of an angular velocity sensor in accordance with an eleventh embodiment of the present invention.

FIG. 50 shows an overall arrangement of an angular velocity sensor in accordance with an eleventh embodiment of the present invention.

The eleventh embodiment is characterized in that a vibrator 501 comprises a total of four parallel arm bars 503, 504, 505 and 506 and a connecting bar 502 integrally connecting the base ends of these arm bars 503, 504, 505 and 506. The vibrator 501 is bonded on a metallic supporter 507 by an appropriate adhesive. The supporter 507 is configured into a laid H-shaped body having a torsion beam 508. A spacer 511 is provided to connect the supporter 507 to a base plate 511 by welding etc. Thus, the vibrator 510 is supported in a cantilever fashion.

The vibrator 501 is made of a piezoelectric body, such as PZT ceramics. The centrally provided two arm bars 503 and 504 serve as driving arm bars, while the remaining two arm bars 505 and 506 serve as sensing arm bars. The torsion beam 508 is positioned along a longitudinal (i.e., vertical) center line of the vibrator 501.

FIGS. 51A–51D show an electrode arrangement in accordance with the eleventh embodiment.

A U-shaped drive electrode 512 is formed on a front face X1 of the vibrator 501 so as to extend in a region corresponding to the arm bars 503, 504 and a central part of the connecting bar 502. A U-shaped monitor electrode 513 is formed on the front face X1 in parallel to the drive electrode 512. A common electrode 520 is formed on a rear face X2 of the vibrator 501 so as to extend in a region corresponding to the arm bars 503, 504 and the central part of the connecting bar 502. The rear face X2 is opposed to the front face X1.

A sensing electrode 514 is formed on the front face X1 so as to extend in a region corresponding to the arm bar 505. Another sensing electrode 522 is formed on the rear face X2 so as to extend in a region corresponding to the arm bar 505. The arm bar 505 has a side face Y2 on which a connecting electrode 529, a common electrode 525 and another connecting electrode 527 are formed. The connecting electrode 529 integrally connects the sensing electrodes 514 and 522. The connecting electrode 527 integrally connects the common electrodes 520 and 525.

A common electrode 515 is formed on the front face X1 so as to extend in a region corresponding to the arm bar 506. Another common electrode 521 is formed on the rear face X2 so as to extend in a region corresponding to the arm bar 506. The arm bar 506 has a side face Y1 on which a connecting electrode 528, a sensing electrode 524 and another connecting electrode 526 are formed. The connecting electrode 528 integrally connects the common electrodes 515 and 521. The connecting electrode 526 integrally connects the sensing electrode 524 to a pad electrode 516.

Two pad electrodes 516 and 517 are formed on the front face X1 at a portion corresponding to the central portion of the connecting bar 502. One pad electrode 516 is integrally connected to the sensing electrode 514 via a lead electrode 518. The other pad electrode 517 is integrally connected to the common electrode 515 via a lead electrode 519.

The common electrodes 520 and 521 are integrally connected by a lead electrode 523.

The drive electrode 512, the monitor electrode 513 and pad electrodes 516, 517 are connected to corresponding terminals T1–T4 via lead wires W1–W4 by wire bonding for inputting and outputting signals.

An operation of the vibrator will be explained.

An alternating voltage is applied between the electrodes formed on the front face X1 and the rear face X2. This alternating voltage causes the driving arm bars 503 and 504 to vibrate in a curvature vibration mode symmetrical with respect to the center line of the vibrator 501. The current obtained from the monitor electrode 513 is monitored. A drive signal given to the drive electrode 512 is feedback controlled based on the monitored value so as to stabilize the vibrations of the arm bars 503 and 504. This is referred to as a controlled self-excited oscillation.

Next, under such a controlled self-excited oscillating condition, the vibrator 501 may be subjected to an angular velocity Ωz entered about the Z axis of the vibrator 501. This angular velocity Ωz induces a Coriolis force which vibrates the arm bars 503 and 504 in the Y-axis direction which is normal and opposed to the vibrating direction of the arm bars 503 and 504. The sensing arm bars 505 and 506 cause vibrations in the Y-axis direction in response to the driving arm bars 503 and 504. Thus, the sensing electrodes 514, 522 and 524 generate an output signal proportional to an angular velocity in the Y-axis direction.

The manufacturing methods and structural features described in the above-described embodiments can be applied to this embodiment in the same manner.

Twelfth Embodiment

FIGS. 52A through 52D are views cooperatively showing an electrode arrangement in accordance with a twelfth embodiment of the present invention.

According to this embodiment, a vibrator 601 is configured into a H-shaped tuning fork piezoelectric body comprising a total of four parallel arm bars 603, 604, 605 and 606. These arm bars 603, 604, 605 and 606 are united by a connecting bar 602 provided at the center of the vibrator 601. To arm bars 603 and 604 serve as driving arm bars, while the remaining two arm bars 605 and 606 serve as sensing arm bars. Electrodes are formed on an piezoelectric body (e.g., PZT ceramics) of the vibrator 601.

A U-shaped drive electrode 607 is formed on a front face X1 of the vibrator 601 so as to extend in a region corresponding to the arm bars 603, 604 and part of the connecting bar 602. A U-shaped monitor electrode 608 is formed on the front face X1 in parallel to the drive electrode 607. A common electrode 609 is formed on an opposing rear face X2 of the vibrator 601 so as to extend in an entire surface of the rear face X2. Two common electrodes 610 are 611 are formed on the front face X1 so as to extend along the arm bars 605 and 606, respectively. One sensing electrode 612 is formed on a side face Y2, while another sensing electrode 613 is formed on an opposing side face Y1. The common electrodes 610 and 611 are integrally connected with the common electrode 609 via connecting electrodes 614 and 615, respectively. The sensing electrode 612 is integrally connected with a pad electrode 614 via a lead electrode 616. The other sensing electrode 613 is integrally connected with a pad electrode 615 via a lead electrode 617.

An alternating voltage is applied between the electrodes-formed on the front face X1 and the rear face X2. This alternating voltage causes the driving arm bars 603 and 604 to vibrate in a curvature vibration mode symmetrical with respect to the center line of the vibrator 601. The current obtained from the monitor electrode 608 is monitored. A drive signal given to the drive electrode 607 is feedback controlled based on the monitored value so as to stabilize the vibrations of the arm bars 603 and 604.

Next, under such a controlled self-excited oscillating condition, the angular velocity Ωz induces a Coriolis force which vibrates the arm bars 603 and 604 in the Y-axis direction which is normal and opposed to the vibrating direction of the arm bars 603 and 604. The sensing arm bars 605 and 606 cause vibrations in the Y-axis direction in response to the driving arm bars 603 and 604. Thus, the sensing electrodes 612 and 613 generate an output signal proportional to an angular velocity in the Y-axis direction.

The manufacturing methods and structural features described in the above-described embodiments can be applied to this embodiment in the same manner.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A piezoelectric vibrator element comprising:
   a piezoelectric vibrator member,
   at least one electrode formed on an outer surface of said vibrator member so as to have an outer surface to which ultrasonic wire bonding is applied, and
   at least one lead wire, extending in the air from said electrode, with one end bonded to said outer surface of said electrode by ultrasonic wire bonding,
   wherein said lead wire has a diameter less than or equal to 50 $\mu$m and contains aluminum as a chief component, and
   said electrode is a silver thick film containing palladium in an amount greater than or equal to 5% by weight.

2. The piezoelectric vibrator element in accordance with claim 1, wherein said electrode has a film thickness in a range of 10 $\mu$m to 40 $\mu$m.

3. An angular velocity sensor with a vibrator, a base plate, and a supporter interposed between said vibrator and said base plate,
   said vibrator comprising a piezoelectric body having at least one polygonal arm bar and electrodes formed on said piezoelectric body, said electrodes including at lease one drive electrode and at least one sensing electrode formed on a first face of said piezoelectric body and a common electrode formed on an opposing second face of said piezoelectric body, said first face and said second face extending in a Z-axis direction parallel to a longitudinal direction of said vibrator, said common electrode being integrally connected to at least one outlet electrode formed on said first face,
   said base plate opposed to said second face,
   said supporter supporting said vibrator on said base plate,
   said arm bar vibrating in a Y-axis direction parallel to said first and second faces and normal to said Z-axis direction when an alternating voltage is applied between said drive electrode and said common electrode, and
   said sensing electrode producing a signal representing a vibration of said arm bar caused in an X-axis direction due to an angular velocity of said vibrator appearing about the Z-axis,
   wherein at least one lead wire extends in the air from one of the electrodes formed on said first face, with one end bonded to one of the electrodes formed on said first face, and said lead wire contains aluminum as a chief component and is bonded to an outer surface of said one of the electrode formed on said first face by ultrasonic wire bonding, and
   said one of the electrodes formed on said first face and bonded to said lead wire has a double-layer construction comprising a first-layer electrode formed on said first surface and a second-layer electrode formed on the first-layer electrode, and said second-layer electrode is a silver thick film containing palladium in an amount greater than or equal to 5% of weight.

4. The angular velocity sensor in accordance with claim 3, wherein said second-layer electrode contains palladium by an amount equal to or smaller than 50% as a weight percentage relative to the total amount of said silver thick film contain palladium.

5. A piezoelectric vibrator comprising:
   a piezoelectric vibrator member,
   at least one electrode formed on an outer surface of said vibrator member,
   at least one terminal provided for signal transmission, and
   at least one lead wire, with a diameter less than or equal to 50 $\mu$m, straddling between said electrode and said terminal, wherein
   said lead wire contains aluminum as a chief component and is bonded to an outer surface of said electrode and said terminal by ultrasonic wire bonding, and said electrode is a silver thick film containing palladium in an amount greater than or equal to 5% by weight.

6. A piezoelectric vibrator element comprising:

a piezoelectric vibrator member, at least one electrode formed on an outer surface of said vibrator member, and at least one lead wire bonded to said electrode, wherein said lead wire contains aluminum as a chief component, and said electrode comprises at least one first-layer electrode formed on a surface of said vibrator member and a second-layer electrode formed directly on said first-layer electrode so as to constitute a double-layer construction; and wherein said first-layer electrode contains 1 to 15% by weight glass or inorganic oxide and said second-layer electrode contains 0 to 1% by weight glass or inorganic oxide.

7. The piezoelectric vibrator element in accordance with claim 6, wherein said second-layer electrode contains 5 to 50% by weight palladium.

8. The piezoelectric vibrator element in accordance with claim 6, wherein said lead wire is bonded to said electrode by ultrasonic wire bonding.

* * * * *